(12) United States Patent
Suhara

(10) Patent No.: US 6,941,646 B2
(45) Date of Patent: Sep. 13, 2005

(54) ELECTRIC-COMPONENT MOUNTING SYSTEM

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 229 days.

(21) Appl. No.: 10/159,008

(22) Filed: Jun. 3, 2002

(65) Prior Publication Data

US 2002/0184755 A1 Dec. 12, 2002

(30) Foreign Application Priority Data

Jun. 7, 2001 (JP) ........................................ 2001-172915

(51) Int. Cl.⁷ ............................................... B23P 19/00
(52) U.S. Cl. ............................. 29/740; 29/739; 29/759
(58) Field of Search .......................... 29/825, 832, 833, 29/840, 740, 841, 739, 759

(56) References Cited

U.S. PATENT DOCUMENTS

| | | | | |
|---|---|---|---|---|
| 4,116,376 A | * | 9/1978 | Delorme et al. | ............ 228/170 |
| 4,737,845 A | * | 4/1988 | Susuki et al. | .................. 348/87 |
| 5,084,962 A | * | 2/1992 | Takahashi et al. | ............. 29/833 |
| 5,235,407 A | * | 8/1993 | Spigarelli et al. | ............ 356/399 |
| 5,251,266 A | * | 10/1993 | Spigarelli et al. | ............ 382/151 |
| 5,323,528 A | * | 6/1994 | Baker | ........................... 29/721 |
| 5,471,310 A | * | 11/1995 | Spigarelli et al. | ............ 356/399 |
| 6,538,425 B1 | * | 3/2003 | Kawada | .................... 324/158.1 |
| 6,688,016 B2 | * | 2/2004 | Suhara et al. | .................. 33/613 |
| 2002/0184755 A1 | * | 12/2002 | Suhara | ........................ 29/833 |

FOREIGN PATENT DOCUMENTS

| | | |
|---|---|---|
| JP | A 7-162200 | 6/1995 |
| JP | A 10-163677 | 6/1998 |

OTHER PUBLICATIONS

U.S. Appl. No. 09/721,953, filed Nov. 27, 2000, Kawada.

* cited by examiner

*Primary Examiner*—Carl J. Arbes
(74) *Attorney, Agent, or Firm*—Oliff & Berridge, PLC

(57) ABSTRACT

A method of detecting a relative positioning error between a fiducial-mark imaging device and a substrate-holding device in an electric-component mounting system wherein the fiducial-mark imaging device is arranged to take an image of at least one substrate fiducial mark provided on a circuit substrate, and a positioning error of the circuit substrate as held by the substrate-holding device is detected on the basis of the image of the at least one substrate fiducial mark, so that an electric component is mounted by a mounting head onto the circuit substrate, so as to eliminate the positioning error of the circuit substrate, wherein the fiducial-mark imaging device is operated to take an image of at least one holding-device fiducial mark provided on the substrate-holding device, and the relative positioning error between the fiducial-mark imaging device and the substrate-holding device is detected on the basis of a positioning error of the image of the holding-device fiducial mark within an imaging area of the at least one fiducial-mark imaging device.

16 Claims, 23 Drawing Sheets

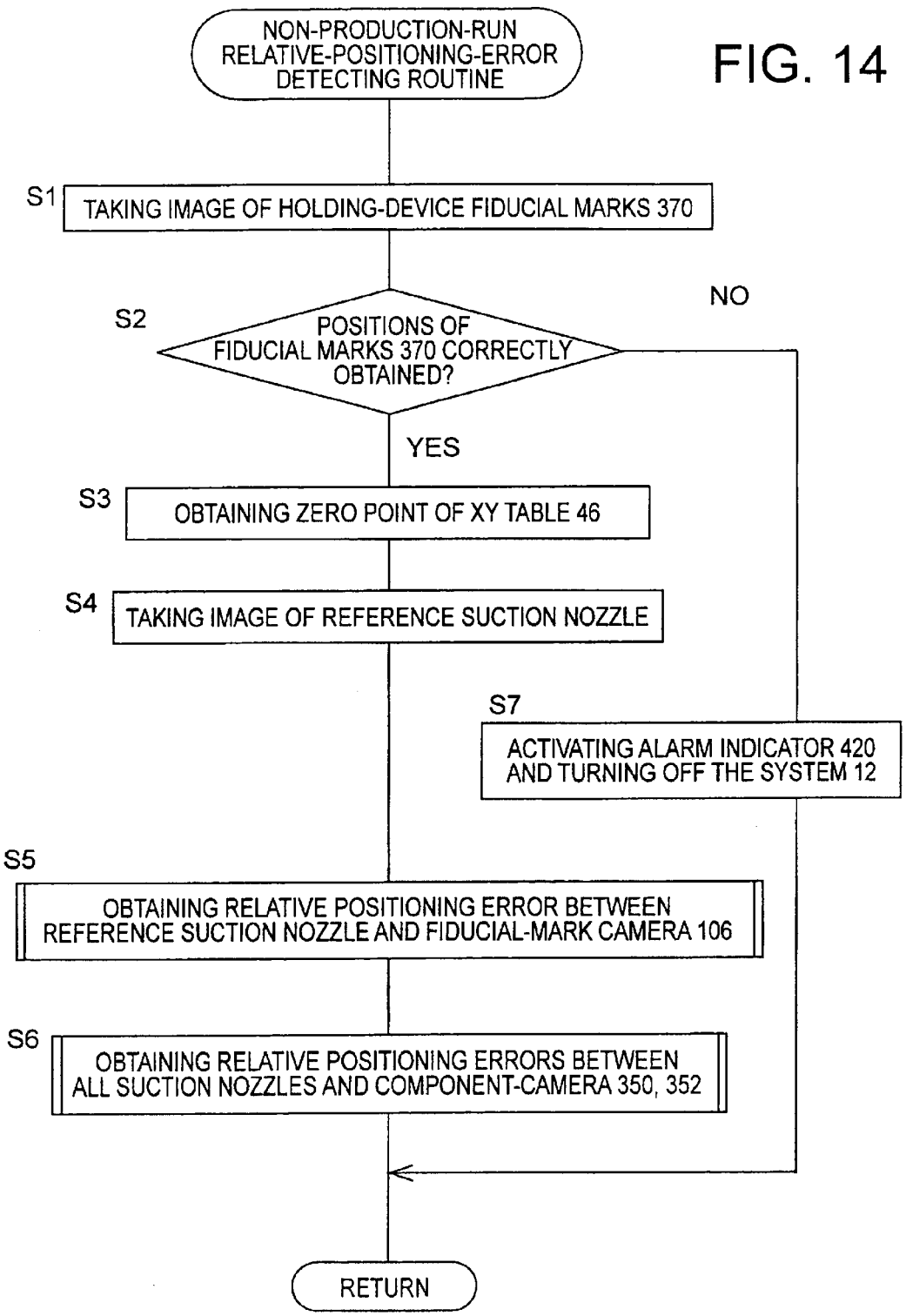

ELECTRIC-COMPONENT MOUNTING SYSTEM

BACKGROUND OF THE INVENTION

1. Field of the Invention

The present invention relates in general to an electric-component mounting system, and a method of detecting a positioning error in the system, more particularly to techniques that facilitate the detection of the positioning errors.

2. Discussion of Related Art

Representative examples of an electric-component mounting system arranged to mount electric components (typically, electronic components) on a circuit substrate such as a printed-wiring board include a system having a plurality of mounting heads, and a head-turning device which carries the mounting heads and which is rotated to turn the mounting heads about a common axis of turning, for mounting the electric components on the circuit substrate. In operation of this electric-component mounting system, each of the mounting heads that are turned about the common axis of turning is sequentially moved to and stopped at a plurality of working positions or stations, which include a component-receiving position at which each mounting head receives an electric component from a component-supplying device, and a component-mounting position at which the mounting head transfers the electric component onto a circuit substrate held by a substrate-holding device. The substrate-holding device is arranged to hold the circuit substrate, and is moved by a substrate-positioning device such that a component-mounting spot on the circuit substrate is located right below the mounting head located at the component-mounting position, so that the electric component is mounted at the component-mounting spot on the printed-wiring board or other circuit substrate.

In a known electric-component mounting system of the type described above, the circuit substrate is provided with fiducial marks whose images are taken by an image-taking device, so that a positioning error of the circuit substrate is detected on the basis of image data representative of the taken images of the fiducial marks. The positioning error of each component-mounting spot is obtained on the basis of the detected positioning error of the circuit substrate, and the position of the circuit substrate is adjusted to eliminate the positioning error, so that each electric component can be mounted at the component-mounting spot on the circuit substrate, with a high degree of positioning accuracy. Namely, movement data used by the substrate-positioning device to position the circuit substrate upon mounting of each electric component are adjusted or compensated to eliminate the positioning error.

The actual mounting position of the electric component as mounted on the circuit substrate may more or less deviate from the nominal mounting position, even where the positioning error of the component-mounting spot on the circuit substrate is eliminated upon mounting of the electric component on the circuit substrate. For example, this deviation may arise from a positioning error of the image-taking device, which is included in the positioning error of the component-mounting spot detected on the basis of the images of the fiducial marks taken by the image-taking device. Accordingly, there arises an error of relative positioning between the mounting head and the component-mounting spot on the circuit substrate so that there arises a positioning error of the electric component as mounted on the circuit substrate. Similarly, a positioning error of the electric component as mounted on the circuit substrate may arise from a positioning error of the mounting head, which causes an error of relative positioning between the mounting head and the component-mounting spot on the circuit substrate.

In view of the drawback described above, the image-taking device and the mounting head at the component-mounting position are conventionally pre-positioned relative to a zero point of the substrate-positioning device, by an operator of the system, using a suitable measuring instrument or jig. This manual pre-positioning procedure permits accurate relative positioning between the image-taking device and the substrate-holding device when the circuit substrate is moved to a position at which the images of the fiducial marks are taken by the image-taking device, so that the positioning error of the circuit substrate as held by the substrate-holding device can be detected with a higher degree of accuracy. Accordingly, the mounting head can be accurately aligned with the nominal component-mounting spot on the circuit substrate, by adjusting the movement data used for the substrate-positioning device to position the circuit substrate, so as to eliminate the detected positioning error of the component-mounting spot, when the electric component is mounted on the circuit substrate by the mounting head. Thus, the manual pre-positioning is effective to improve the positioning accuracy of each electric component as mounted on the circuit substrate.

However, the conventionally practiced manual pre-positioning using the measuring jig is cumbersome and time-consuming, inevitably delaying starting of a production run of the electric-component mounting system if the manual pre-positioning is effected immediately before the mounting of the electric components. Further, it is difficult to perform the manual pre-positioning during the production run of the system, so that the movement data for the substrate-positioning device cannot be compensated for the positioning error of the circuit substrate or the component-mountings spots which may arise from thermal expansion of various parts of the system in operation, and which may deteriorate the positioning accuracy of the electric components as mounted on the circuit substrate.

The problem described above is also encountered in an electric-component mounting system of a type in which a mounting head is moved by a head-positioning device in a plane parallel to the component-mounting surface of a circuit substrate as held by the substrate-holding device, so that each electric component is moved with the mounting head to a position right above the corresponding component-mounting spot on the circuit substrate, at which the electric component is mounted by the mounting head.

SUMMARY OF THE INVENTION

The present invention was made in view of the problems encountered in the prior art described above. It is therefore an object of the present invention to facilitate the detection of positioning errors in an electric-component mounting system, irrespective of whether the detection is effected before or during a production run of the system to mount electric components on a circuit substrate. The above object may be achieved according to any one of the following modes of the present invention in the form of an electric-component mounting system or a method of detecting a relative positioning error in an electric-component mounting system. Each of the following modes of the invention is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A method of detecting a relative positioning error between a fiducial-mark imaging device and a substrate-holding device in an electric-component mounting system wherein the fiducial-mark imaging device is arranged to take an image of at least one substrate fiducial mark provided on a circuit substrate, and a positioning error of the circuit substrate as held by the substrate-holding device is detected on the basis of the image of the at least one substrate fiducial mark, so that an electric component is mounted by a mounting head onto the circuit substrate, so as to eliminate the positioning error of the circuit substrate, the method comprising the steps of:

preparing the substrate-holding device having at least one holding-device fiducial mark;

operating the fiducial-mark imaging device to take an image of the at least one holding-device fiducial mark; and detecting the relative positioning error between the fiducial-mark imaging device and the substrate-holding device, on the basis of a positioning error of the image of the at least one holding-device fiducial mark within an imaging area of the fiducial-mark imaging device.

The relative positioning error between the fiducial-mark imaging device and the substrate-holding device includes at least one of an error of relative positioning between the fiducial-mark imaging device and the substrate-holding device when the imaging device and the substrate-holding device are moved relative to each other in an XY plane; and a positioning error of the fiducial-mark imaging device per se.

When the fiducial-mark imaging device and the substrate-holding device are moved relative to each other to take the image of the at least one substrate fiducial mark, predetermined movement data for effecting the relative movement of these two devices are adjusted so as to eliminate the relative positioning error between the fiducial-mark imaging device and the substrate-holding device, for example, so that the accuracy of detection of the positioning error of the circuit substrate as held by the substrate-holding device is improved, making it possible to accordingly improve the accuracy of mounting of the electric component on the circuit substrate. Alternatively, the fiducial-mark imaging device and the substrate-holding device are moved relative to each other to take the image of the at least one substrate fiducial mark, without adjusting the relative movement data so as to eliminate the relative positioning error therebetween. In this case, the relative positioning error between the fiducial-mark imaging device and the substrate-holding device is taken into account when the positioning error of the circuit substrate as held by the substrate-holding device, is calculated on the basis of the image of the at least one substrate fiducial mark taken by the fiducial-mark imaging device.

The image of the at least one holding-device fiducial mark can be taken by the fiducial-mark imaging device, by moving the fiducial-mark imaging device and the substrate-holding device, to a predetermined relative position, so that the relative positioning error between the fiducial-mark imaging device and the substrate-holding device can be easily detected, irrespective of whether the detection is made prior to or during a production run of the electric-component mounting system to mount the electric components on the circuit substrate. Accordingly, the positioning accuracy of the electric components as mounted on the circuit substrate can be improved. The at least one holding-device fiducial mark may be mounted on the substrate-holding device when the present method is practiced, or alternatively during manufacture of the electric-component mounting system or the substrate-holding device.

The accuracy of detection of the positioning error of the circuit substrate as compensated for the relative positioning error between the fiducial-mark imaging device and the substrate-holding device in the present system is significantly higher than in an electric-component mounting system in which the positioning error of the circuit substrate is detected on the basis of an image of the electric component as mounted on the circuit substrate.

(2) A method according to the above mode (1), wherein the relative positioning error between the fiducial-mark imaging device and the substrate-holding device is detected during an interruption of a continuous production run of the electric-component mounting system.

For example, the relative positioning error between the fiducial-mark imaging device and the substrate-holding device is detected when a predetermined condition for effecting the detection is satisfied during a continuous production run of the electric-component mounting system. For instance, the predetermined condition consists of at least one of the following conditions: a condition that a continuous operation of the system to mount the electric components on the circuit substrate has been performed for more than a predetermined time; a condition that a predetermined number of the electric components have been mounted on the circuit substrate; a condition that the number of the electric components mounted on the circuit substrate has reached a predetermined value; and a condition that the temperature at a selected portion of the electric-component mounting system has been raised by more than a predetermined amount. The detection of the relative positioning error need not be effected immediately after the predetermined condition is satisfied. For instance, the detection may be effected when another predetermined condition is satisfied. If the above-indicated predetermined condition is satisfied during an operation to mount the electric components on a given circuit substrate, for example, it is desirable to initiate the detection of the relative positioning error after all of the predetermined number of the electric components have been mounted on that circuit substrate. In this case, the continuous run of the system is resumed after the detection of the relative positioning error, to mount the electric components on the other circuit substrates. Alternatively, the relative positioning error between the fiducial-mark imaging device and the substrate-holding device may be detected by interrupting the continuous production run of the system in response to a signal generated by a control device. This signal may be entered by the operator of the system through a suitable input device, or may be received from an external device such as a host computer.

After the initiation of the production run of the system to mount the electric components on the circuit substrate, the temperatures of the component members of the system rise due to frictional movements of movable members and operations of drive sources of the system, so that positioning errors of the component members due to their thermal expansion may arise, causing a risk of variation in the amount of relative positioning error between the fiducial-mark imaging device and the substrate-holding device. In view of this tendency, the detection of the relative positioning error between those two devices is desirably effected during an interruption of the continuous run of the system, to update the amount of the relative positioning error. Accordingly, the accuracy of mounting of the electric components on the circuit substrate can be significantly improved, by adjusting the movement data for positioning the substrate-holding device relative to the mounting head, so as to eliminate the updated relative positioning error between the fiducial-mark imaging device and the substrate-holding device.

(3) A method according to the above mode (1) or (2), wherein the substrate-holding device has a plurality of holding-device fiducial marks such that the plurality of holding-device fiducial marks are located adjacent to each other, and an average of coordinate values of positions of the plurality of holding-device fiducial marks is used as a position of the plurality of holding-device fiducial marks when the relative positioning error between the fiducial-mark imaging device and the substrate-holding device is detected on the basis of the positioning error of the images of the plurality of holding-device fiducial marks.

In the above mode (3) wherein the two or more holding-device fiducial marks are used, the position of the holding-device fiducial marks can be obtained with a higher degree of accuracy than in a system wherein only one holding-device fiducial mark is used.

The plurality of holding-device fiducial marks are preferably located such that the images of these fiducial marks can be taken simultaneously or at one time by the fiducial-mark imaging device, namely, without a relative movement between the fiducial-mark imaging device and the substrate-holding device, which would be required when the images of the holding-device fiducial marks are taken at different times. In this arrangement, the detected relative positioning error between the fiducial-mark imaging device and the substrate-holding device does not include an error of relative positioning of these two devices to take the images of the holding-device fiducial marks, so that the relative positioning error can be detected with higher accuracy, than in a system wherein the images of the holding-device fiducial marks are taken at different times with a relative movement of the two devices. However, the images of the holding-device fiducial marks may be taken at different times such that after a selected one or ones of the holding-device fiducial marks is/are imaged by the fiducial-mark imaging device, the fiducial-mark imaging device and the substrate-holding device are moved relative each other to image another or the other of the fiducial marks.

(4) A method according to any one of the above modes (1)–(3), wherein the substrate-holding device is provided with a plurality of holding-device fiducial marks such that the plurality of holding-device fiducial marks are located adjacent to each other, the method further comprising a step of determining that images of the plurality of holding-device fiducial marks have not been correctly taken by the fiducial-mark imaging device, if a distance between adjacent ones of the plurality of holding-device fiducial marks is outside a predetermined permissible range.

Where the lens system of the fiducial-mark imaging device or the holding-device fiducial marks or its vicinity is/are stained with dust or other foreign substances, these foreign substances may be imaged as part of the images of the fiducial marks. In this case, however, it is determined that the images of the holding-device fiducial marks have not been correctly taken by the fiducial-mark imaging device, so that inaccurate detection of the relative positioning error between the fiducial-mark imaging device and the substrate-holding device can be avoided. This arrangement is effective to prevent deterioration of the accuracy of mounting of the electric components due to such inaccurate detection of the relative positioning error.

(5) A method according to any one of the above modes (1)–(4), wherein a light guiding device is prepared to guide an imaging light to be incident upon the fiducial-mark imaging device, the imaging light representing an image of one of the mounting head, a component holder attached to the mounting head to hold the electric component, and a reference member held by the mounting head, which image is taken by the fiducial-mark imaging device, in an axial direction of the mounting head, the method further comprising a step of detecting a relative positioning error between the fiducial-mark imaging device and the mounting head or the component holder, on the basis of a positioning error of the image of the above-indicated one of the mounting head, the component holder and the reference member within the imaging area of the fiducial-mark imaging device.

The reference member may be held by the component holder or directly held by the mounting head. The relative positioning error between the fiducial-mark imaging device and the mounting head or component holder can be detected on the basis of the image of the reference member, provided the reference member and the component holder, and the reference member and the mounting head have predetermined relative positions.

In the presence of a relative positioning error between the fiducial-mark imaging device and the mounting head or the component holder, there arises an error of relative positioning between the circuit substrate and the mounting head or component holder when the electric component is mounted on the circuit substrate. Although the positioning error of the circuit substrate can be obtained with high accuracy by eliminating the relative positioning error between the fiducial-mark imaging device and the substrate-holding device, the relative positioning error between the fiducial-mark imaging device and the mounting head or component holder may be left and included in the positioning error of the circuit substrate, causing inaccurate positioning of the electric component as mounted on the circuit substrate.

Where there exists a relative positioning error between the fiducial-mark imaging device and the mounting head or component holder, this relative positioning error is caused by: (a) a positioning error of the mounting head or component holder relative to the fiducial-mark imaging device and the substrate-holding device; (b) a positioning error of the fiducial-mark imaging device relative to the substrate-holding device and the mounting head or component holder; or (c) both of those two positioning errors. In the case (a), the relative positioning error of the mounting head or component holder is not included in the positioning error of the circuit substrate as detected on the basis of the at least one substrate fiducial mark by the fiducial-mark imaging device. In this case, the positioning error of the electric component as mounted on the circuit substrate corresponds to the relative positioning error between the fiducial-mark imaging device and the mounting head or component holder, if the mounting head or component holder and the circuit substrate are positioned relative to each other so as to eliminate the positioning error of the circuit substrate. In the case (b), the relative positioning error between the fiducial-mark imaging device and the substrate-holding device is included in the positioning error of the circuit substrate, the positioning error of the electric component as mounted on the circuit substrate corresponds to the relative positioning error of the fiducial-mark imaging device and the mounting head or component holder, if the mounting head or component holder and the circuit substrate are positioned relative to each other so as to eliminate the positioning error of the circuit substrate, since there exists no relative positioning error between the mounting head or component holder and the substrate-holding device. In the case (c), there exists a similar positioning error of the electric component as mounted on the circuit substrate.

Where the relative positioning error between the fiducial-mark imaging device and the mounting head or component holder is obtained in addition to the relative positioning error between the fiducial-mark imaging device and the substrate-holding device, the relative position among the fiducial-mark imaging device, the substrate-holding device and the mounting head or component holder is obtained, so that the mounting head or component holder and the substrate-holding device may be positioned relative to each other, so as to eliminate the relative positioning error therebetween, and also eliminate the relative positioning error between the fiducial-mark imaging device and the substrate-holding device, and the positioning error of the circuit substrate, whereby the electric components can be mounted on the circuit substrate with a high degree of positioning accuracy.

The provision of the light guiding device in the above mode (5) permits the fiducial-mark imaging device to easily take the image of the mounting head, component holder or reference member, while the fiducial-mark imaging device is provided to take the image of the at least one substrate fiducial mark provided on the circuit substrate. Accordingly, it is possible to easily obtain the relative positioning error between the fiducial-mark imaging device and the mounting head or component holder, prior to or during the production run of the electric-component mounting system, so that the obtained relative positioning error can be used to adjust the movement data for moving the substrate-holding device and the mounting head upon mounting of each electric component on the circuit substrate, for improving the positioning accuracy of the electric component as mounted on the circuit substrate. In addition, the present arrangement permits a higher degree of accuracy of detection of the relative positioning error between the circuit substrate and the mounting head or component holder, than in an arrangement in which the relative positioning error is detected on the basis of an image of the electric component as mounted on the circuit substrate, which is taken by the fiducial-mark imaging device.

(6) A method of detecting a relative positioning error between a fiducial-mark imaging device and a mounting head in an electric-component mounting system wherein the fiducial-mark imaging device is arranged to take an image of at least one substrate fiducial mark provided on a circuit substrate, and a positioning error of the circuit substrate as held by the substrate-holding device is detected on the basis of the image of the at least one substrate fiducial mark, and wherein a component imaging device is provided to take an image of an electric component as held by the mounting head, and a positioning error of the electric component as held by the mounting head is detected on the basis of the image of the electric component, so that the electric component is mounted by the mounting head onto the circuit substrate, so as to eliminate the positioning errors of the circuit substrate and the electric component, the method comprising the steps of:

preparing a light guiding device operable to guide an imaging light to be incident upon the fiducial-mark imaging device in an axial direction of the mounting head, the imaging light representing an image of one of the mounting head, a component holder attached to the mounting head to hold the electric component, and a reference member held by the mounting head;

operating the fiducial-mark imaging device to take the image of the above-indicated one of the mounting head, the component holder and the reference member; and detecting a relative positioning error between the fiducial-mark imaging device and the mounting head or the component holder, on the basis of a positioning error of the image of the above-indicated one of the mounting head, the component holder and the reference member within an imaging area of the fiducial-mark imaging device.

In the presence of a relative positioning error between the fiducial-mark imaging device and the mounting head or component holder, there arises a positioning error of the electric component as mounted on the circuit substrate, as described above with respect to the above mode (5). However, the electric component can be mounted on the circuit substrate with a high degree of positioning accuracy, by adjusting the movement data for the relative positioning of the mounting head or component holder and the circuit substrate, so as to eliminate the detected relative positioning error between the fiducial-imaging imaging device and the mounting head or component holder and eliminate the detected positioning error of the circuit substrate.

(7) A method according to the above mode (5) or (6), wherein the relative positioning error between the fiducial-mark imaging device and the mounting head or the component holder is detected during an interruption of a continuous production run of the electric-component mounting system.

For example, the relative positioning error between the fiducial-mark imaging device and the mounting head or the component holder is detected when a predetermined condition for effecting the detection is satisfied during a continuous production run of the electric-component mounting system. The predetermined condition is selected as described above with respect to the above mode (2). Alternatively, the relative positioning error between the fiducial-mark imaging device and the mounting head or component holder may be detected when another predetermined condition is satisfied, or in response to a signal generated by a control device. The method according to the above mode (7) has substantially the same advantages as described above with respect to the above mode (2).

(8) A method according to any one of the above modes (5)–(7), further comprising a step of locating the light guiding device at a non-operating position thereof while the system is operating to mount the electric component on the circuit substrate, and at an operating position thereof while the relative positioning error between the fiducial-mark imaging device and the mounting head is detected.

The light guiding device may be automatically moved between its non-operating and operating positions by a suitable moving device including a drive source, or manually moved by the operator of the system.

(9) A method of detecting a relative positioning error between a substrate-holding device and a fiducial-mark imaging device in an electric-component mounting system including (a) a component-supplying device operable to supply electric components, (b) the substrate-holding device operable to hold a circuit substrate on which the electric components are to be mounted, (c) a mounting head operable to receive the electric component from the component-supplying device and mount the electric component on the circuit substrate held by the substrate-holding device, (d) the fiducial-mark imaging device operable to detect an image of at least one substrate fiducial mark provided on the circuit substrate as held by the substrate-holding device; and (e) a relative-movement device operable to relatively move the component-supplying device, the substrate-holding device, the mounting head and the fiducial-mark imaging device, the method comprising the steps of preparing the substrate-holding device having at least one holding-device fiducial mark;

operating the relative-movement device to move the substrate-holding device and the fiducial-mark imaging device to at least one predetermined relative position;

operating the fiducial-mark imaging device to take an image of the at least one holding-device fiducial mark; and detecting the relative positioning error between the substrate-holding device and the fiducial-mark imaging device, on the basis of the image of the at least one holding-device fiducial mark taken by the fiducial-mark imaging device.

For instance, the electric-component mounting system may include a plurality of mounting heads carried by a rotatable body rotatable about its axis such that the mounting heads are equiangularly spaced apart from each other in the circumferential or rotating direction of the indexing body. The rotatable body may be an intermittently rotating body intermittently rotated in a predetermined one direction, or a bidirectionally rotating body rotated in a selected one of opposite directions by a desired angle. The intermittently rotating body is intermittently rotated by a suitable rotating device, to turn the plurality of mounting heads about the axis of rotation of the intermittently rotating body, so that each mounting head is sequentially moved to and stopped at a plurality of working positions that are arranged along a circular path of turning of the mounting heads. The working positions include a component-receiving position at which each mounting head receives the electric component from the component-supplying device, and a component-mounting position at which each mounting head transfers the electric component onto the circuit substrate as held by the substrate-holding device. The bidirectionally rotating body is rotated in a selected direction by a suitable rotating device, to turn the mounting heads to be stopped at predetermined working positions. In either of those cases, the rotatable body and the rotating device constitute a head-moving device in the form of a head-turning device for turning the mounting heads to the working positions.

The mounting heads may be disposed on respective turnable members which are turnable independently of each other about a common axis of turning. In each cycle of operation of the electric-component mounting system, each turnable member is turned 360° about the common axis of turning by a circular-motion applying device such that the turnable members are successively stopped at each of at least one working position, at a predetermined time interval. Each mounting head is held by the corresponding turnable member such that all of the mounting heads are spaced from the common axis of turning by a predetermined radial distance. In this case, the head-turning device is constituted by the turnable members and the circular-motion applying device.

At least one mounting head may be carried by a movable member which is linearly movable in at least one of two mutually perpendicular directions in a plane, by a suitable moving device. Where the movable member is movable in the two mutually perpendicular directions, each mounting head is movable to any desired position in the above-indicated plane. In this case, the movable member and the moving device constitute a head-moving device for moving each mounting head.

The relative-movement device need not move all of the component-supplying device, substrate-holding device, mounting head and fiducial-mark imaging device relative to each other. In the cases described above, the relative-movement device includes the head-moving device. Where the system includes a plurality of mounting heads, these mounting heads and the above-indicated head-turning device constitute a major portion of a component-mounting device operable to mount the electric components on the circuit substrate. Where at least one mounting head is carried by the movable member, the at least one mounting head and the head-moving device (including the movable member and the moving device for moving the movable member) constitute a major portion of the component-mounting device.

The above-indicated rotatable body and the rotating device, or the above-indicated turnable members and the circular-motion applying device may be carried by a movable structure, which is movable along two mutually perpendicular axes in a plane by a movable-structure moving device, as disclosed in JP-A-10-163677. The axis of rotation of the rotatable body or the common axis of turning of the turnable members may be either perpendicular to the surface of the circuit substrate held by the substrate-holding device, for instance, may extend in the vertical direction, or inclined with respect to the surface of the circuit substrate, for instance, may be inclined with respect to the vertical direction. In this case, a major portion of a component-mounting operable to mount the electric components on the circuit substrate is constituted by the mounting heads, rotatable member, rotating device, movable structure and movable-structure moving device, while a major portion of the relative-movement device is constituted by the rotatable member, rotating device, movable structure and movable-structure moving device. Alternatively, a major portion of the component-mounting device is constituted by the mounting heads, turnable members, circular-motion applying device, movable structure and movable-structure moving device, while a major portion of the relative-movement device is constituted by the turnable members, circular-motion applying device, movable structure and movable-structure moving device.

The substrate-holding device may be stationary and is not movable in a plane parallel to a component-mounting surface of the circuit substrate, or movable by a suitable substrate-moving device along at least one of two mutually perpendicular axes in the plane parallel to the component-mounting surface of the circuit substrate. In the latter case, the relative-movement device includes the substrate-moving device.

The component-supplying device may be stationary or movable by a suitable moving device. In the latter case, the relative-movement device includes the moving device for the component-supplying device.

The component-supplying device may take any desired form. For instance, the component-supplying device may include a component supply table including a plurality of component feeders and a feeder carriage or table on which the component feeders are mounted such that component-supply portions of the component feeders are arranged along a line. The component feeders accommodate respective groups of electric components of different kinds. Each component feeder may include a tape feeding device operable to feed a carrier tape which accommodates a succession of electric components such that the electric components are fed to the component-supply portion one after another. Alternatively, each component feeder may be arranged to feed a succession of the electric components by oscillation, a ramp way, an air stream or a belt conveyor, or a combination thereof, such that the electric components are fed to the component-supply portion one after another. In either of the two cases described above, each component feeder includes a feeding device for feeding the electric components to the component-supply portion, and a container accommodating the electric components.

Where the component supply table of the component-supplying device is movable to supply the electric components, the feeder carriage is moved by a suitable carriage-positioning device in a direction of arrangement of the component-supply portions of the component feeders, so that a selected one of the component feeders is located at a predetermined component-supplying position. The line along which the component-supply portions of the component feeders are arranged may be a straight line or a line other than the straight line, such as a circle, a circular arc (a part of a circle), a curve other than the circular arc, and a line which is a combination of those non-straight lines. Where the component supply table is movable, the feeding devices and containers of the component feeders may be disposed on a common feeder carriage so that the feeding devices and the containers are moved together when the common feeder carriage is moved. Alternatively, the sets of feeding devices and containers of the component feeders may be disposed on respective separate feeder carriages. In the latter case, the feeding device and container of each component feeder may be disposed on respective separate feeder carriages and moved independently of each other, or the container may be fixedly disposed.

The component-supplying device may be of a tray type arranged to supply the electric components from a storage tray. The storage tray has a multiplicity of component-accommodating recesses for accommodating the respective electric components.

The fiducial-mark imaging device is constructed as needed depending upon the arrangements of the component-supplying device, the substrate-holding device and the mounting head. Similarly, the relative-movement device is constructed as needed depending upon the arrangements of those devices.

(10) A method according to the above mode (9), further comprising the steps of:

preparing a light guiding device operable to guide an imaging light to be incident upon the fiducial-mark imaging device in an axial direction of the mounting head, when the light guiding device is located at a predetermined position relative to the mounting head and the fiducial-mark imaging device, the imaging light representing an image of one of the mounting head, a component holder attached to the mounting head to hold the electric component, and a reference member held by the mounting head;

operating the relative-movement device to move the light guiding device, the mounting head and the fiducial-mark imaging device to a predetermined relative position in which the imaging light is guided by the light guiding device to be incident upon the fiducial-mark imaging device;

operating the fiducial-mark imaging device to take the image of the above-indicated one of the mounting head, the component holder and the reference member; and detecting a relative positioning error between the fiducial-mark imaging device and the mounting head or the component holder, on the basis of the image of the above-indicated one of the mounting head, the component holder and the reference member which has been taken by the fiducial-mark imaging device.

The method according to the above mode (10) has substantially the same advantages as described above with respect to the above mode (5). For example, the component holder is a suction nozzle arranged to hold the electric component by suction under a negative pressure, or a collet chuck including a plurality of gripper members in the form of gripper jaws which are moved by an opening and closing device, in the radial direction of the chuck, between a closed position and an open position for holding and releasing the electric component.

(11) A method of detecting a relative positioning error between a fiducial-mark imaging device and a mounting head in an electric-component mounting system including (a) a component-supplying device operable to supply electric components, (b) the substrate-holding device operable to hold a circuit substrate on which the electric components are to be mounted, (c) a mounting head operable to receive the electric component from the component-supplying device and mount the electric component on the circuit substrate held by the substrate-holding device, (d) the fiducial-mark imaging device operable to detect an image of at least one substrate fiducial mark provided on the circuit substrate as held by the substrate-holding device; and (e) a relative-movement device operable to relatively move the component-supplying device, the substrate-holding device, the mounting head and the fiducial-mark imaging device, the method comprising the steps of:

preparing a light guiding device operable to guide an imaging light to be incident upon the fiducial-mark imaging device in an axial direction of the mounting head, when the light guiding device is located at a predetermined position relative to the mounting head and the fiducial-mark imaging device, the imaging light representing an image of one of the mounting head, a component holder attached to the mounting head to hold the electric component, and a reference member held by the mounting head;

operating the relative-movement device to move the light guiding device, the mounting head and the fiducial-mark imaging device to a predetermined relative position in which the imaging light is guided by the light guiding device to be incident upon the fiducial-mark imaging device;

operating the fiducial-mark imaging device to take the image of the above-indicated one of the mounting head, the component holder and the reference member; and detecting a relative positioning error between the fiducial-mark imaging device and the mounting head or the component holder, on the basis of the image of the above-indicated one of the mounting head, the component holder and the reference member which has been taken by the fiducial-mark imaging device.

The method according to the above mode (11) has substantially the same advantages as described above with respect to the above mode (6).

(12) A method according to the above mode (10) or (11), further comprising a step of rotating the mounting head about an axis of rotation thereof to a plurality of different angular positions, and wherein the step of operating the fiducial-mark imaging device comprises operating the fiducial-mark imaging device to take images of the above-indicated one of the mounting head, the component holder and the reference member when the mounting head is placed in the different angular positions, respectively, and the step of detecting the relative positioning error between the fiducial-mark imaging device and the mounting head or the component holder comprises detecting a relative positioning error between the axis of rotation of the mounting head and the fiducial-mark imaging device, as the relative positioning error between the fiducial-mark imaging device and the mounting head.

The position of the axis of rotation of the mounting head can be obtained on the basis of the images of the mounting head, component holder or reference member, which are taken at the respective different angular positions.

(13) An electric-component mounting system comprising:
  a component-supplying device operable to supply electric components;
  a substrate-holding device operable to hold a circuit substrate on which the electric components are to be mounted and which has at least one substrate fiducial mark, the substrate-holding device having at least one holding-device fiducial mark;
  a mounting head operable to receive the electric component from the component-supplying device and mount the electric component on the circuit substrate held by the substrate-holding device;
  a fiducial-mark imaging device operable to take an image of the at least one holding-device fiducial mark on the substrate-holding device, and an image of the at least one substrate fiducial mark on the circuit substrate as held by the substrate-holding device;
  a relative-movement device operable to relatively move the component-supplying device, the substrate-holding device, the mounting head and the fiducial-mark imaging device; and
  a control device including (a) a first relative-positioning-error obtaining portion operable to obtain a first relative positioning error between the fiducial-mark imaging device and the substrate-holding device, on the basis of a positioning error of the image of the at least one holding-device fiducial mark within an imaging area of the fiducial-mark imaging device, (b) a second relative-positioning-error obtaining portion operable to obtain a second relative positioning error between the fiducial-mark imaging device and the circuit substrate, on the basis of the image of the at least one substrate fiducial mark within the imaging area of the fiducial-mark imaging device, and (c) a movement control portion operable to control the relative-movement device for moving the mounting head and the substrate-holding device to a predetermined relative position as adjusted on the basis of at least the first and second relative positioning errors.

The electric-component mounting system constructed according to the above mode (13) has substantially the same advantages as described above with respect to the above mode (1).

(14) An electric-component mounting system according to the above mode (13), wherein the control device includes a production-run relative-positioning-error detection control portion operable to control the relative-movement device, the fiducial-mark imaging device and the first relative-positioning-error obtaining portion, to obtain the first relative positioning error during an interruption of a continuous production run of the electric-component mounting system to mount the electric components on the circuit substrate.

For example, the first relative positioning error is detected when a predetermined condition for effecting the detection is satisfied during a continuous production run of the electric-component mounting system. The predetermined condition is selected as described above with respect to the above mode (2). Alternatively, the first relative positioning error may be detected when another predetermined condition is satisfied, or in response to a signal generated by the control device. The system according to the above mode (14) has substantially the same advantages as described above with respect to the above mode (2).

(15) An electric-component mounting system according to the above mode (13) or (14), wherein the substrate-holding device has a plurality of holding-device fiducial marks which are located adjacent to each other.

(16) An electric-component mounting system according to the above mode (15), wherein the control device includes a correct-mark-position determining portion operable to obtain a relative position of the plurality of holding-device fiducial marks on the basis of images of the holding-device fiducial marks, and determine whether positions of the plurality of holding-device fiducial marks have been correctly detected by the fiducial-mark imaging device, depending upon whether the obtained relative position of the plurality of holding-device fiducial marks is held within a predetermined permissible range.

The system according to the above mode (16) has substantially the same advantages as described above with respect to the above mode (4).

(17) An electric-component mounting system according to the above mode (16), further comprising at least one of (i) alarm indicating means and (ii) stopping means operable when the correct-mark-position determining portion has determined that the positions of the plurality of holding-device fiducial marks have not been detected by the fiducial-mark imaging device, the alarm indicating means informing an operator of the system that the positions of the plurality of holding-device fiducial marks have not been correctly detected, and the stopping means stopping an operation of the electric-component mounting system.

The alarm indicating means may be an audio indicator capable of generating a sound such as a buzzing sound or a voice message, an optical indicator such as a lamp arranged to be lit or flicker, or a visual indicator such as a display device.

(18) An electric-component mounting system according to any one of the above modes (15)–(18), wherein the first relative-positioning-error obtaining portion obtains the first relative positioning error on the basis of the positions of the plurality of holding-device fiducial marks.

(19) An electric-component mounting system according to any one of the above modes (13)–(18), wherein the relative-movement device includes:
  a head-turning device operable to turn the mounting head about an axis of turning, to a plurality of working positions including at least a component-receiving position at which the mounting head receives the electric component from the component-supplying device, and a component-mounting position at which the mounting head mounts the electric component onto the circuit substrate; and
  an XY table arranged to hold the substrate-holding device and movable in an XY plane defined by mutually perpendicular X and Y axes.

(20) An electric-component mounting system according to any one of the above modes (13)–(19), wherein the mounting head is arranged to hold a component holder for holding the electric component.

(21) An electric-component mounting system according to the above mode (20), further comprising a light guiding device operable to guide an imaging light to be incident upon the fiducial-mark imaging device in an axial direction of the mounting head, when the light guiding device is located at a predetermined position relative to the mounting head and the fiducial-mark imaging device, the imaging light representing an image of one of the mounting head, the component holder and a reference member held by the mounting head.

The system according to the above mode (21) has substantially the same advantages as described above with respect to the above mode (5).

(22) An electric-component mounting system according to the above mode (20), wherein the relative-movement device includes (a) a head-turning device operable to turn the mounting head about an axis of turning, to a plurality of working positions including at least a component-receiving position at which the mounting head receives the electric component from the component-supplying device, and a component-mounting position at which the mounting head mounts the electric component onto the circuit substrate, and (b) an XY table arranged to hold the substrate-holding device and movable in an XY plane defined by mutually perpendicular X and Y axes, the electric-component mounting system further comprising a light guiding device operable to guide an imaging light to be incident upon the fiducial-mark imaging device in an axial direction of the mounting head, when the light guiding device is located at a predetermined position relative to the mounting head and the fiducial-mark imaging device, the imaging light representing an image of one of the mounting head, the component holder and a reference member held by the mounting head.

(23) An electric-component mounting system according to any one of the above modes (20)–(22), further comprising a guiding-device positioning device operable to position the light guiding device relative to the substrate-holding device, in a plane perpendicular to the axial direction of the mounting head.

(24) An electric-component mounting system according to any one of the above modes (21)–(23), wherein the control device further includes a third relative-positioning-error obtaining portion operable to obtain a third relative positioning error between the fiducial-mark imaging device and the mounting head or the component holder, on the basis of a positioning error of the above-indicated one of the mounting head, the component holder and the reference member within an imaging area of the fiducial-mark imaging device.

(25) An electric-component mounting system according to the above mode (24), further comprising a head-rotating device operable to rotate the mounting head about an axis of rotation thereof to a plurality of angular positions, and wherein the third relative-positioning-error obtaining portion operates the head-rotating device to rotate the mounting head to the plurality of angular positions, and operates the fiducial-mark imaging device to take images of the above-indicated one of the mounting head, the component holder and the reference member when the mounting head is placed in the different angular positions, respectively, the third relative-positioning-error obtaining portion detecting a positioning error of the axis of rotation of the mounting head relative to the fiducial-mark imaging device, as the relative positioning error between the fiducial-mark imaging device and the mounting head.

The position of the axis of rotation of the mounting head can be obtained on the basis of the images of the mounting head, component holder or reference member, which are taken at the respective different angular positions.

The electric-component mounting system according to the above mode (25) wherein the mounting head is rotatable about its axis is advantageous in that the axis of rotation of the mounting head can be used as a reference position for positioning the circuit substrate relative to the mounting head when the electric component is mounted on the circuit substrate.

(26) An electric-component mounting system according to the above mode (24) or (25), wherein the control device includes a production-run third relative-positioning-error detection control portion operable to control the relative-movement device, the fiducial-mark imaging device and the third relative-positioning-error obtaining portion, to obtain the third relative positioning error during an interruption of a continuous production run of the electric-component mounting system to mount the electric components on the circuit substrate.

For example, the third relative positioning error is detected when a predetermined condition for effecting the detection is satisfied during a continuous production run of the electric-component mounting system. The predetermined condition is selected as described above with respect to the above mode (2). Alternatively, the third relative positioning error may be detected when another predetermined condition is satisfied, or in response to a signal generated by the control device. The system according to the above mode (26) has substantially the same advantages as described above with respect to the above mode (2).

(27) An electric-component mounting system comprising:

a component-supplying device operable to supply electric components;

a substrate-holding device operable to hold a circuit substrate on which the electric components are to be mounted and which has at least one substrate fiducial mark, the substrate-holding device having at least one holding-device fiducial mark;

a mounting head operable to receive the electric component from the component-supplying device and mount the electric component on the circuit substrate held by the substrate-holding device;

a fiducial-mark imaging device operable to take an image of the at least one holding-device fiducial mark on the substrate-holding device, and an image of the at least one substrate fiducial mark on the circuit substrate as held by the substrate-holding device;

a relative-movement device operable to relatively move the component-supplying device, the substrate-holding device, the mounting head and the fiducial-mark imaging device;

a light guiding device operable to guide an imaging light to be incident upon the fiducial-mark imaging device in an axial direction of the mounting head, when the light guiding device is located at a predetermined position relative to the mounting head and the fiducial-mark imaging device, the imaging light representing an image of one of the mounting head, the component holder and a reference member held by the mounting head; and a control device operable to control at least the fiducial-mark imaging device and the relative-movement device, and including (a) a relative-positioning-error obtaining portion operable to obtain a relative positioning error between the fiducial-mark imaging device and the mounting head or the component holder, on the basis of the image of the above-indicated one of the mounting head, the component holder and the reference member which is taken on the basis of the imaging light, (b) a relative-positioning-error compensating portion operable to adjust a predetermined relative position between the mounting head and the substrate-holding device to be established by the relative-movement device upon mounting of the electric component on the circuit substrate, such that the predetermined relative position is adjusted so as to eliminate at least the relative positioning error obtained by the relative-positioning-error obtaining portion.

In the system according to the above mode (27), the electric component can be mounted on the circuit substrate with a high degree of positioning accuracy, even in the presence of a relative positioning error between the mounting head and the fiducial-mark imaging device.

(28) An electric-component mounting system according to the above mode (27), wherein the control device further includes a production-run relative-positioning-error detection control portion operable to control the relative-movement device, the fiducial-mark imaging device and the relative-positioning-error obtaining portion, to obtain the relative positioning error during an interruption of a continuous production run of the electric-component mounting system to mount the electric components on the circuit substrate.

For example, the relative positioning error between the fiducial-mark imaging device and the mounting head or component holder is detected when a predetermined condition for effecting the detection is satisfied during a continuous production run of the electric-component mounting system. The predetermined condition is selected as described above with respect to the above mode (2). Alternatively, the relative positioning error may be detected when another predetermined condition is satisfied, or in response to a signal generated by the control device. The system according to the above mode (28) has substantially the same advantages as described above with respect to the above mode (2).

(29) A positioning-error detecting method for an electric-component mounting system, wherein an image of at least one substrate fiducial mark provided on a circuit substrate is taken by a fiducial-mark imaging device, and a positioning error of the circuit substrate as held by a substrate-holding device is detected on the basis of the image of the at least one substrate fiducial mark, so that an electric component is mounted by a mounting head onto the circuit substrate, so as to eliminate the positioning error of the circuit substrate, the method comprising the steps of:

provided a relatively-movable member which is movable relative to the fiducial-mark imaging device;

providing the relatively-movable member with a relative-movement fiducial mark;

operating the fiducial-mark imaging device to take an image of the relative-movement fiducial mark; and detecting a relative positioning error between the fiducial-mark imaging device and the relatively-movable member, on the basis of the image of the relative-movement fiducial mark taken by the fiducial-mark imaging device.

The relatively-movable member may be either a stationary member, or a movable member which is moved by a moving device. For example, the substrate-holding device serves as the relatively-movable member. Where the mounting head is movable in an XY plane by an XY robot, the relatively-movable member may be one of guide rails of a conveying device for conveying the circuit substrate, or an X-axis slide of the XY robot which is moved in the X-axis direction and which supports the mounting head and the fiducial-mark imaging device such that the mounting head and the fiducial-mark imaging device are movable in the Y-axis direction. In either of the above-indicated case, the image of the relatively-movable member is taken by the fiducial-mark imaging device, and a relative positioning error between the fiducial-mark imaging device and the relatively-movable member is obtained on the basis of the image of the relatively-movable member. By thus obtaining the relative positioning error, the zero point of a relative-movement device to move the fiducial-mark imaging device and the relatively-movable member relative to each other can be obtained with high accuracy, so that a positioning error of the circuit substrate can be detected with improved accuracy.

A relative positioning error between the mounting head and the fiducial-mark imaging device can be obtained by using a light guiding device operable to guide an imaging light to be incident upon the fiducial-mark imaging device in an axial direction of the mounting head. The imaging light represents an image of one of the mounting head, a component holder attached to the mounting head to hold the electric component, and a reference member held by the mounting head. As long as the light guiding device is capable of guiding the imaging light to be incident upon the fiducial-mark imaging device in the axial direction of the mounting head, the light guiding device may be disposed on any desired member which is movable relative to the mounting head and the fiducial-mark imaging device, for instance, disposed on the relatively-movable member provided with the relative-movement fiducial mark.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 14 is a flow chart illustrating a routine executed by a computer of the control device according to a control program stored in a RAM, for detecting relative positioning errors while the system is not in a production run;

DETAILED DESCRIPTION OF THE PREFERRED EMBODIMENTS

Referring to the accompanying drawings, there will be described the preferred embodiments of this invention.

Figure 1:
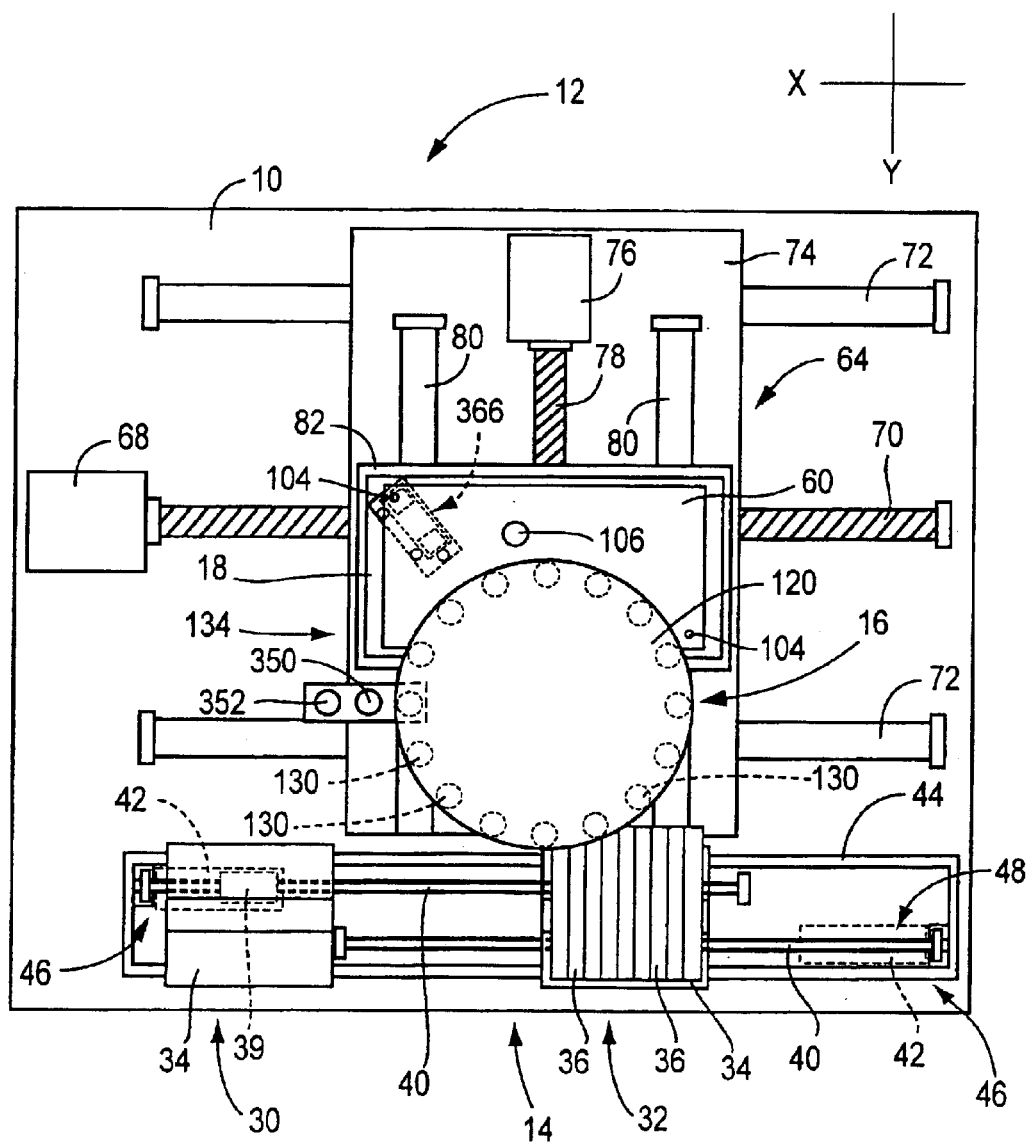
FIG. 1 is a plan view schematically showing an electronic-component mounting system constructed according to one embodiment of this invention.

Referring first to FIG. 1, reference numeral 10 denotes a machine base of an electric-component mounting system in the form of an electronic-component mounting system 12. The electronic-component-mounting device 12 includes a component-supplying device 14, a component-mounting device 16, and a substrate-holding device in the form of a printed-wiring-board holding device (hereinafter abbreviated as "PWB holding device") 18, which are mounted on the machine base 10.

Figure 5:
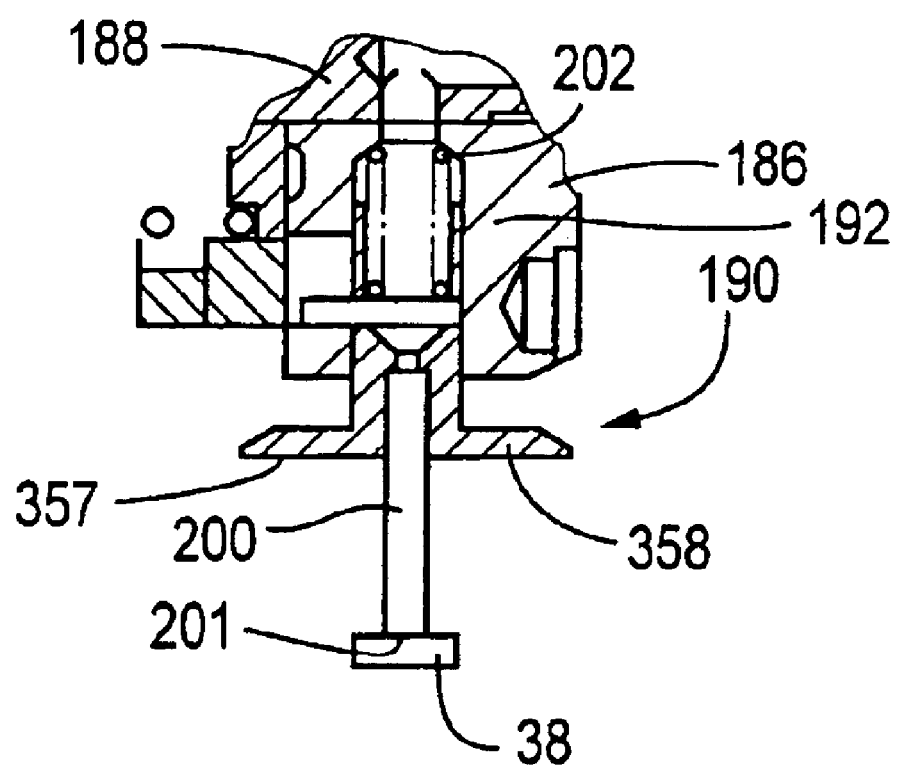
FIG. 5 is a front elevational view (partly in cross section) of a suction nozzle as held by the mounting head.

The component-supplying device 14 includes two component supply tables 30, 32. However, only one of these two component supply tables 30, 32 may be provided. Each of the two component supply tables 30, 32 includes a feeder carriage 34, and a plurality of tape feeders 36 mounted on the feeder carriage 34. Each tape feeder 36 is arranged to feed a carrier tape 22 (FIG. 3) which accommodates electric components in the form of electronic components 38 (FIG. 5).

The carrier tape 22 includes a carrier substrate (not shown) which has a multiplicity of component-accommodating recesses formed at a suitable interval along the length of the tape. The electronic components 38 are accommodated in the respective component-accommodating recesses, and the opening of each recess is closed by a covering film bonded to the carrier substrate. In operation of each tape feeder 36, the carrier tape 22 is fed by a feeding device (not shown), with a predetermined pitch, so that the electronic components 38 are fed one after another to a predetermined position at a component-supply portion of the tape feeder 36. The plurality of tape feeders 36 are removably mounted on the feeder carriage 34 such that the component-supply portions of the tape feeders 36 are arranged along a straight line, namely, along a horizontal straight line in the present embodiment.

In the electronic-component mounting system 12 of the present embodiment, movement data for positioning and moving the component supply tables 30, 32, PWB holding device 18 and other movable members are defined in an XY coordinate system having an X-axis direction and a Y-axis direction as indicated in FIG. 1. The component-supply portions of the tape feeders 36 are arranged on the feeder carriage 34 in the X-axis direction (in the right and left direction as seen in FIG. 1).

The feeder carriage 34 of each component supply table 30, 32 has a ballnut 39 fixed thereto. The ballnut 39 engages a feed screw in the form of a ballscrew 40, which is rotated by a table drive motor 42, so that each component supply table 30, 32 is moved in the X-axis direction while being guided by a guiding device including a guide rail 44. Thus, the component-supply portions of the plurality of tape feeders 36 are selectively brought into a predetermined component supply position. The ballscrew 40 and the table drive motor 42 constitute a major portion of a table-positioning device 46 operable to move each component supply table 30, 32. In other words, the two component supply tables 30, 32 are respectively moved by two table positioning devices 46, which cooperate to provide a component-supplying device positioning device 48. The guide rail 44 is used commonly for the two component supply tables 30, 32. The electronic components 38 are supplied from the two component supply tables 30, 32 in a manner well known in the art, for instance, in a manner as disclosed in JP-B2-8-21791. In FIG. 1, the nut 39 of the component supply table 30 is shown, but the tape feeders 36 mounted on the table 30 are not shown, while the tape feeders 36 of the component supply table 32 are shown, but the nut 39 of the table 32 is not shown.

The PWB holding device 18 is arranged to support or hold a circuit substrate in the form of a printed-wiring board 60, and is moved by a circuit-substrate positioning device in the form of an XY table 64, to a desired position in the above-indicated XY coordinate system defined by the mutually perpendicular X and Y axes. The XY table 64 includes an X-axis slide 74, and a Y-axis slide 82 movably mounted on the X-axis slide 74. The X-axis slide 74 is movable in the X-axis direction by an X-axis drive motor 68 through a feed screw in the form of a ballscrew 70 while being guided by a guiding device including guide rails 72, while the Y-axis slide 82 is movable in the Y-axis direction by a Y-axis drive motor 76 and a feed screw in the form of a ballscrew 78 while being guided by a guiding device including guide rails 80.

Figure 2:
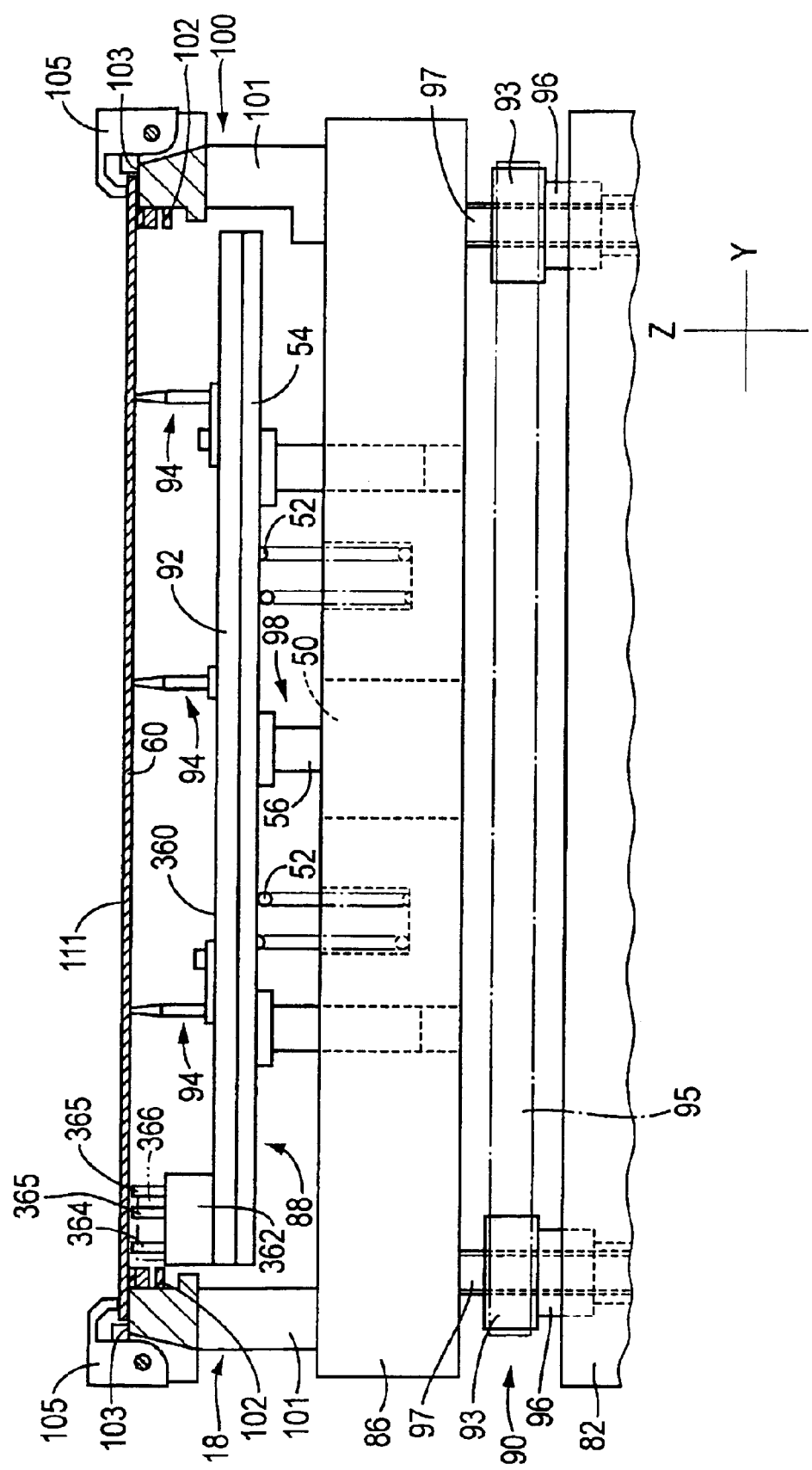
FIG. 2 is a side elevational view (partly in cross section) of a printed-wiring-board holding device of the electronic-component mounting system of FIG. 1.

The PWB holding device 18 is mounted on the Y-axis slide 82, and is arranged to support the printed-wiring board 60 such that the board 60 maintains a horizontal attitude or posture. The PWB holding device 18 includes a Z-axis slide 86, and a printed-wiring-board supporting device 88, as shown in FIG. 2. The Z-axis slide 86 is movable relative to the Y-axis slide 82 in a Z-axis direction or vertical direction by a Z-axis positioning device 90. The printed-wiring-board supporting device 88 (hereinafter referred to as "PWB supporting device 88) includes a support plate 92, and a plurality of support members in the form of support pins 94 disposed on the support plate 92. The support plate 92 is vertically moved relative to the Z-axis slide 86 by a board elevating and lowering device 98, and the support pins 94 support the printed-wiring board 60, in contact with the lower surface of the board 60. The support plate 92 has a plurality of pin-attaching portions (not shown) to which the support pins 94 are removably attached, for abutting contact with respective spots on the lower surface of the printed-wiring board 60.

Figure 11:
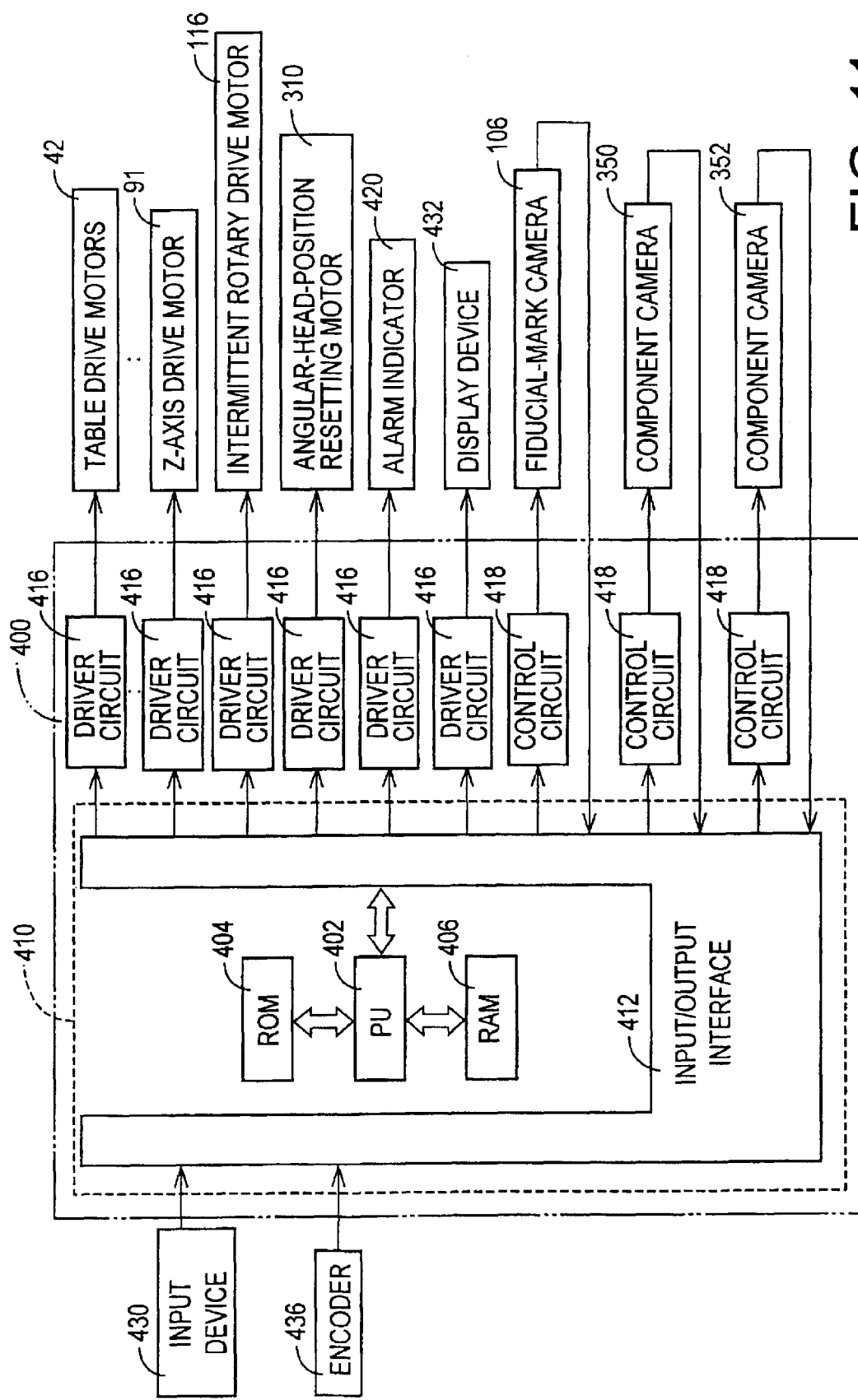
FIG. 11 is a block diagram showing a part of a control device for controlling the electronic-component mounting system, which part largely relates to the present invention.

The Z-axis positioning device 90 includes a drive source in the form of a Z-axis drive motor 91 (shown in FIG. 11). A rotary motion of the Z-axis drive motor 91 is transmitted to a plurality of ballnuts 96 supported by the Y-axis slide 82, through a rotation transmission device including timing pulleys 93 and a timing belt 95. Rotary motions of the ballnuts 96 are converted into vertical movements of ballscrews 97 disposed on the Z-axis slide 86, whereby the Z-axis slide is vertically moved. With the vertical movement of the Z-axis slide 86, the PWB holding device 18 is movable between a predetermined board-loading/unloading position and a component-mounting position. At the board-loading/unloading position, the printed-wiring board 60 is moved from a board-loading conveyor (not shown) onto a printed-wiring-board conveyor 100 (hereinafter referred to as "PWB conveyor 100") mounted on the Z-axis slide 86, and from the PWB conveyor 100 onto a board-unloading conveyor (not shown). At the component-mounting position, which is located below the board-loading/unloading position, the PWB holding device 18 holding the printed-wiring board 60 is moved in the XY plane, without an interference with the board-loading and board-unloading conveyors, to mount the electronic components 38 at the respective component-mounting spots on the board 60.

The board elevating and lowering device 98 includes a fluid-operated actuator in the form of a plurality of air cylinders 50 serving as a drive source, and a biasing device in the form of a plurality of compression coil springs 52 (hereinafter referred to as "springs 52"). When air chambers of the air cylinders 50 are open to the atmosphere, an elevator platform 54 is moved to its fully elevated position under a biasing action of the springs 52, so that the support plate 92 and support pins 94 removably mounted on the elevator platform 54 are moved to their fully elevated positions. When the air chambers of the air cylinders 50 are charged with compressed air, piston rods 56 fixed to pistons (not shown) of the air chambers 50 are lowered against the biasing forces of the springs 52, so that the elevator platform 54 is lowered to its fully lowered position, whereby the support plate 92 and support pins 94 are lowered to their fully lowered positions. Thus, the PWB supporting device 88 has fully elevated and fully lowered positions defined by the upper and lower stroke ends of the pistons of the air cylinders 50. In the fully elevated position of the PWB supporting device 88, the printed-wiring board 60 is supported by the support pins 94 and is clamped by clamping members 105 which will be described.

The PWB conveyor 100 includes a pair of guide rails 101, and a pair of endless belts 102 provided on the respective guide rails 101. The endless belts 102 are rotated by a belt drive device (not shown), to feed the printed-wiring board 60. Each of the guide rails 101 has a positioning surface for sliding contact with the corresponding one of opposite widthwise end faces of the printed-wiring board 60, so as to position the board 60 in the direction of its width. Namely, the board 60 is fed in sliding contact at its opposite widthwise end faces with the positioning surfaces of the guide rails 101. One of the guide rails 101 is a stationary guide rail, while the other guide rail 101 is a movable guide rail which is movable toward and away from the stationary guide rail. A distance between the stationary and movable guide rails 101 is adjustable to a specific width of the printed-wiring board 60, by moving the movable guide rail 101 without an interference with the support plate 92. The dimensions of the support plate 92 in the X-axis and Y-axis directions are determined such that the support plate 92 is able to support printed-wiring boards 60 of different sizes. The same support plate 92 is used for different widths of the PWB conveyor 100 corresponding to the different sizes of the board 60. However, the positions at which the support pins 94 are attached to the support plate 92 are changed depending upon the specific size of the printed-wiring board 60.

The printed-wiring board 60 loaded onto the PWB conveyor 100 from the board-loading conveyor when the PWB holding device 18 is placed at its board-loading/unloading position is positioned on the PWB supporting device 88, by a suitable stopper device (not shown), and is supported by the support pins 94 of the PWB supporting device 88 supported by the board elevating and lowering device 98, while the board 60 is clamped at its widthwise end portions of the upper and lower surfaces, by and between a support surface 103 provided on each guide rail 101 and the above-indicated clamping member 105 pivotally fixed to each guide rail 101.

The printed-wiring board 60 has a top surface or component-mounting surface 111, which has a plurality of component mounting spots or positions at which the electronic components 38 are mounted by the component-mounting device 16. With the printed-wiring board 60 moved with the PWB holding device 18, the component-mounting spots on the board 60 are sequentially brought into alignment with a predetermined component-mounting position (described below) of the component-mounting device 16. Further, the vertical position of the Z-axis slide 86 is adjusted to adjust the height of the component-mounting surface 111 of the printed-wiring board 60 when the electronic components are mounted at the respective component-mounting spots.

Figure 8:
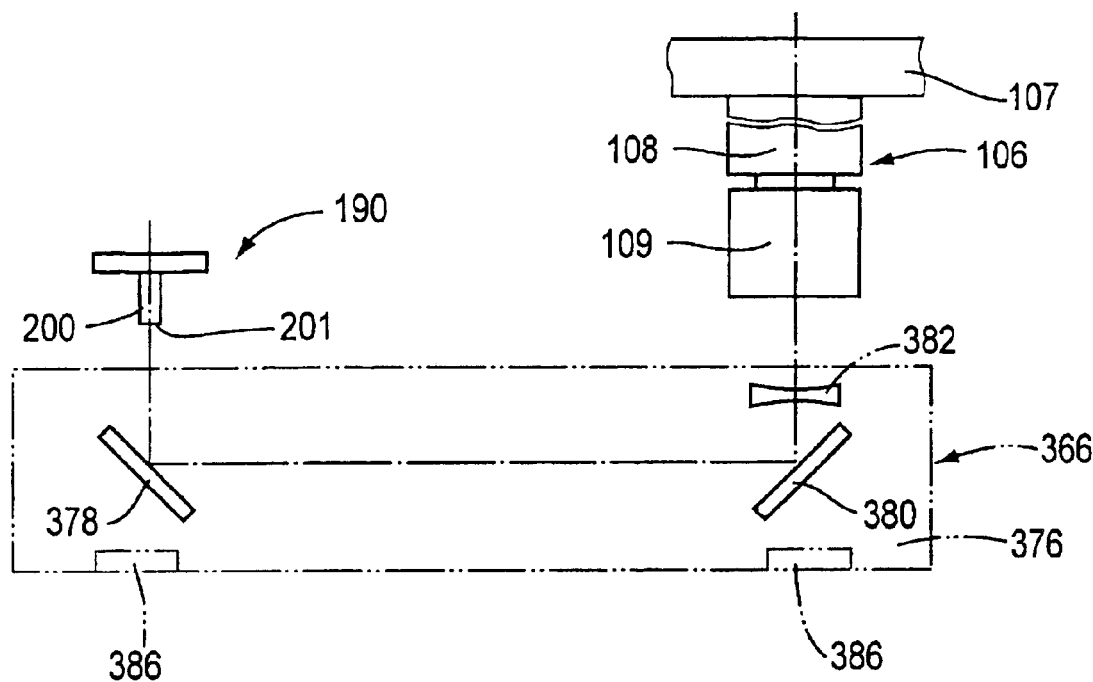
FIG. 8 is a side elevational view schematically showing a light guiding device attached to the printed-wiring-board holding device, together with a fiducial-mark camera.

In the present embodiment, two circular board fiducial marks 104 are provided on the component-mounting surface 111 of the printed-wiring board 60, as shown in FIG. 1. However, it is possible to use fiducial marks having any other shapes such as square, rectangular, triangular and other polygonal shapes, or an elliptical or criss-cross shape. The two board fiducial marks 104 are located in two corner portions of the rectangular board 60. Images of the fiducial marks 104 are taken by a fiducial-mark imaging device in the form of a fiducial mark camera 106 (FIG. 1), which is fixedly disposed on a holder member 107, as shown in FIG. 8. The holder member 107 is provided on a frame 110 (described below) of the component-mounting device 16, and is not shown in FIG. 1.

The fiducial mark camera 106 is a CCD camera which includes a matrix of solid image sensors in the form of CCDs (charge-coupled devices) 108, and a lens system 109 (including an imaging lens), as shown in FIG. 8, and functions as an image-taking device in the form of a surface-imaging device capable of taking a two-dimensional image of an object at one time. The fiducial-mark camera 106 is oriented with its optical axis extending in the vertical direction, so as to face downwards to take the images of the board fiducial marks 104 in the downward direction. The CCDs 108 are small-sized light receiving elements arranged in a matrix in a plane. Each of the light receiving elements generates an electric signal depending upon an amount of light received. The matrix of the light receiving elements defines an imaging area in which an image of the object is formed. In the present embodiment, the imaging area is defined in the XY coordinate system in which the movement data for positioning the printed-wiring board 60 are defined. An illuminating device (not shown) is incorporated in the lens system 109, to illuminate the object and its vicinity when the image of the object is taken by the fiducial camera 106.

Figure 3:
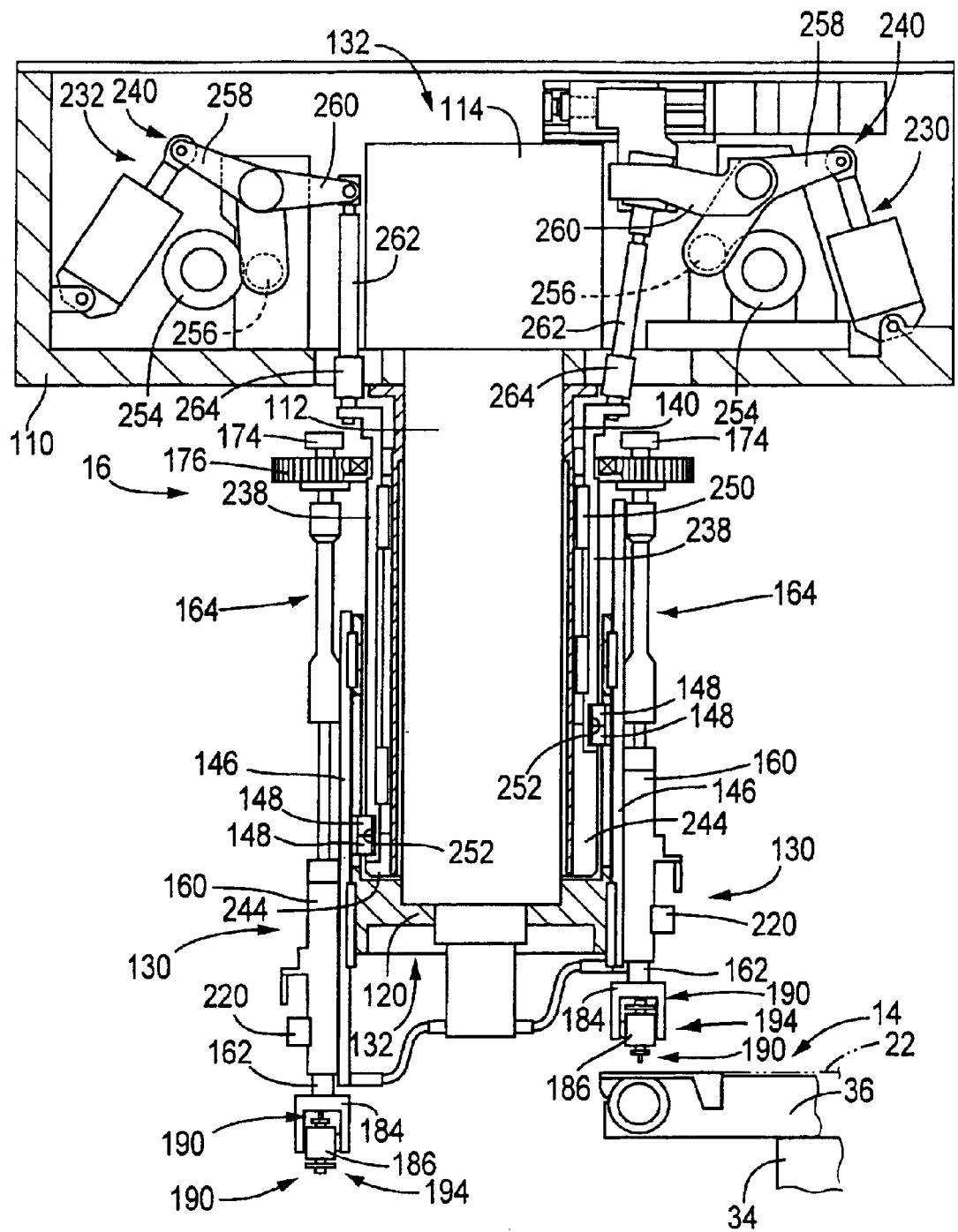
FIG. 3 is a side elevational view (partly in cross section) of a component-mounting device of the electronic-component mounting system.
Figure 4:
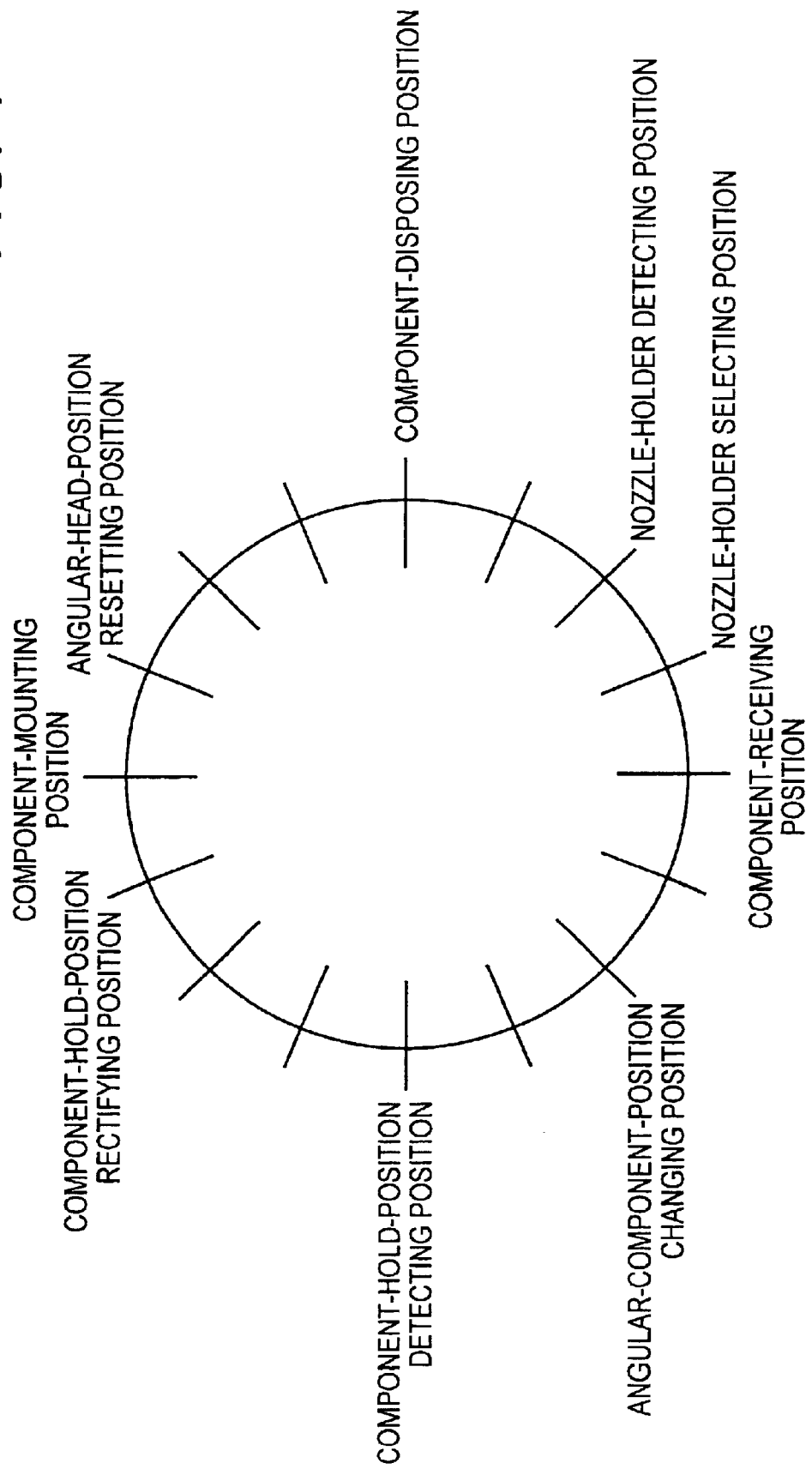
FIG. 4 is a view indicating working positions of mounting heads of the component-mounting device of FIG. 3.

Referring next to FIG. 3, the component-mounting device 16 will be described only briefly since the component-mounting device 16 per se does not significantly relate to the present invention. The component-mounting device 16 in the present embodiment is similar in construction with a component-mounting device as disclosed in JP-A-6-342998, and co-pending U.S. patent application filed May 24, 2001 claiming priority of Japanese Patent Application No. 2000-164958.

In FIG. 3, reference numeral 110 denotes the above-indicated frame supported by the machine base 10. The frame 110 supports a rotary shaft 112 such that the rotary shaft 112 is rotatable about a vertically extending axis. The rotary shaft 112 is rotated by a rotary drive device 114, which includes a roller gear and a roller-gear cam (not shown). The roller-gear cam is rotated in one direction at a constant speed by an intermittent rotary drive motor 116 (FIG. 11), so that a plurality of rollers of the roller gear are sequentially brought into engagement with a cam rib of the roller-gear cam, whereby the rotary shaft 112 is intermittently rotated about its axis by a predetermined angle for each intermittent rotary motion.

The rotary shaft 112 has a lower end portion extending downward from the frame 110. To this lower end portion of the rotary shaft 112, there is fixed a rotating body, more specifically, an intermittently rotating body in the form of an indexing body 120. The indexing body 120 carries 16 mounting heads 130 arranged equiangularly in its circumferential direction such that each mounting head 130 is movable in the axial direction of the indexing body 120, that is, movable in the vertical direction, and such that each mounting head 130 is rotatable about its axis. When the rotary shaft 112 is continuously rotated, the indexing table 120 is intermittently rotated at an angular spacing interval of the 16 mounting heads 130, that is, at an angular interval of 22.5°.

Thus, the 16 mounting heads 130 can be turned about a vertically extending common axis of turning, namely, about the axis of rotation of the indexing body 120, so that each mounting head 130 can be temporarily stopped at 16 working stations or positions which are equiangularly spaced from each other along a circular path of movement. The 16 working positions include: a component-receiving position at which each electronic component 38 is received or picked up by suction from a selected one of the tape feeders 36 of the component-supplying device 14 (at which the electric component 38 is transferred from the selected tape feeder 36 to a suction nozzle 190 described below); an angular-component-position changing position at which the attitude or angular position of the electronic component 38 is changed; a component-hold-position detecting position at which the position of the electronic component 38 as held by the mounting head 130 is detected; a component-hold-position rectifying position at which the angular position of the electronic component 38 is adjusted to eliminate an angular positioning error; a component-mounting position at which the electronic component 38 is mounted on the printed-wiring board 60; an angular-head-position resetting position at which the mounting head 130 is rotated to its predetermined angular-zero position; a nozzle-holder detecting position at which a currently selected one of nozzle holders 186 (described below) is detected; and a nozzle-holder selecting position at which the nozzle holder 186 to be used next is selected. In the present embodiment, the rotary shaft 112 and the rotary drive device 114 constitute a major portion of an intermittently rotating device operable to intermittently rotate the indexing body 120, and the intermittently rotating device and the indexing table body constitute a head-positioning device operable to position each mounting head 130, in the form of a head-turning device 132 operable to turn each mounting head 130 about the axis of rotation of the indexing body 120. Further, the head-turning device 132 cooperates with the component-supplying device positioning device 48 and the XY table 64 to constitute a relative-movement device 134 operable to move each mounting head 130, the component-supplying device 14 and the PWB holding device 18 relative to each other. The head-turning device 132 functions as an intermittently turning device operable to intermittently turn the mounting heads 130 about the common axis of turning.

A supporting member 146 which supports each mounting head 130 is vertically movably supported by the indexing body 120. A cam follower in the form of a roller 148 fixed to the supporting member 146 is held in engagement with a cam groove formed in a cylindrical cam 140 fixed to the frame 110. The cam groove is formed in the cylindrical cam 140 such that the vertical position of the cam groove gradually changes in the circumferential direction of the cylindrical cam 140, so that the roller 148 in rolling contact with the side surfaces of the cam groove is vertically moved to elevate and lower the supporting member 146 and the mounting head 130 as the mounting head 130 is turned with the indexing body 120 about the axis of rotation of the rotary shaft 112. In the present embodiment, the cam groove is formed so that each mounting head 130 is placed at its upper stroke end when the head 130 is stopped at its component-receiving position, and is placed at its lower stroke end when the head 130 is stopped at its component-mounting position, and so that the head 130 is moved horizontally when the head 130 is turned between positions spaced from the component-receiving and component-mounting positions along the circular path.

A support member in the form of a cylindrical sleeve 160 is fixed to the outer surface of the supporting member 146. A shaft member 162 having a circular shape in transverse cross section is fitted in the cylindrical sleeve 160 such that the shaft member 162 is rotatable about a vertical axis (an axis of rotation of the mounting head 130) relative to the cylindrical sleeve 160 and is axially movable together with the cylindrical sleeve 160. A first engaging member 174 is connected to the shaft member 162 through a rotation transmitting shaft 164 such that the first engaging member 174 is rotatable with the shaft member 162 and is axially movable relative to the shaft member 162. The first engaging member 174 is held stationary in the axial direction of the mounting head 130 even when the head 130 is vertically moved by the roller 148 held in engagement with the cam groove of the cylindrical cam 140 while the head 130 is turned with the indexing body 120. Namely, the first engaging member 174 is not vertically moved while the shaft member 162 is vertically moved with the cylindrical sleeve 160 by the supporting member 146.

The first engaging member 174 can be turned by a turning device including an externally toothed ring gear 176, about the axis of rotation of the indexing body 120. Since the first engaging member 174 is flexibly connected to the shaft member 162 through a flexible-joint mechanism, the first engaging member 174 can be turned at a higher angular velocity than the indexing body 120, so that the first engaging member 174 reaches each working position of each mounting head 130 before the head 130 reaches each working position, as disclosed in JP-A-6-342998. Since, this aspect of the first engaging member 174 regarding its movement relative to the mounting head 130 does not directly relate to the present invention, no further description in this respect is deemed necessary.

The shaft member 162 has a lower end portion which extends downwards from the sleeve 160 and which carries an attaching member 184 fixed thereto. A rotary nozzle holder 186 is supported by the attaching member 184, such that the rotary nozzle holder 186 is supported by a support shaft 188 (FIG. 5) rotatably about a horizontal axis perpendicular to the axis of the shaft member 162.

The rotary nozzle holder 186 includes a plurality of nozzle holders 192, more precisely, six nozzle holders 192, which are arranged equiangularly about the axis of rotation of the rotary nozzle holder 186 (about the support shaft 188). The six nozzle holders 192 (only one of which is shown in FIG. 5) are arranged to hold the respective six suction nozzles 190 such that the suction nozzles 190 extend in the radial directions of the support shaft 188 at a predetermined angular interval. The rotary nozzle holder 186 is rotated about the support shaft 188 by a nozzle-holder selecting device (not shown) disposed near the above-indicated nozzle-holder selecting position, to bring a selected one of the six nozzle holders 192 into an operating or working position. In the operating position, the suction nozzle 190 held by the selected nozzle holder 192 faces downwards, and the axis of the suction nozzle 190 is aligned with the axis of the shaft member 162.

In the present embodiment, the shaft member 162, the attaching member 184 and the rotary nozzle holder 186 constitute each mounting head 130 which holds the six suction nozzles 190. The mounting head 130 is rotatable about the vertically extending axis of the shaft member 162 parallel to the axis of rotation of the indexing body 120, and is arranged to hold the selected suction nozzle 190 placed in its operating position such that the selected suction nozzle 190 extends substantially in its axial direction The 16 mounting heads 130 are identified by respective codes of head-code data, and the six nozzle holders 192 of each mounting head 130 are also identified by respective codes of nozzle-holder-code data. Suction nozzle data indicative of the kinds of the suction nozzles 190 held by the respective nozzle holders 192 of each mounting head 130 are stored in a ROM 404 of a control device 400 (which will be described), so that the specific kind of the selected suction nozzle 190 placed in its operating position of each mounting head 130 can be identified on the basis of the above-indicated head-code data and nozzle-holder-code data, and the suction nozzle data.

Each mounting head 130 and the suction nozzles 190 held by the mounting head 130 cooperate to constitute a component-mounting unit 194. Namely, the component-mounting device 16 has 16 component-mounting units 194 arranged equiangularly in the circumferential direction of the indexing body 120. In FIG. 3, only two of the six suction nozzles 190 are shown for each of only two of the 16 mounting heads 130, in the interest of simplification. The component-supply portion of a selected one of the tape feeders 36 of the component-supplying device 14 is located below the selected suction nozzle 190 (placed in its operating position) of the mounting head 130 located at the component-receiving position. At the component-supplying position of the selected tape feeder 36, its component-supply portion is located below the selected suction nozzle 190 of the mounting head 130 located at the component receiving position, so that the electric component 38 is transferred from the component-supply portion to the selected suction nozzle 190.

Each of the six suction nozzles 190 held by each mounting head 130 is arranged to hold the electronic component 38 by suction under a negative pressure. One of the suction nozzles 190 is shown in FIG. 5. Each suction nozzle 190 includes a suction tube 200 the lower or free end face of which provides a sucking surface 201 for sucking the electronic component 38, as shown in FIG. 5. The suction nozzle 190 is removably held at the nozzle holder 192 such that the suction nozzle 190 is rotatable with the nozzle holder 192 and axially movable relative to the nozzle holder 192. When the electronic component 38 is sucked by the suction nozzle 190 or transferred from the suction nozzle 190 onto the printed-wiring board 60, the suction nozzle 190 is axially movable relative to the nozzle holder 192, owing to compression of a spring 202 interposed as a biasing device between the rotary nozzle holder 186 and the suction nozzle 190. The axial movement of the suction nozzle 190 relative to the nozzle holder 192 reduces an impact upon abutting contact of the suction nozzle 190 with the electronic component 38 or upon abutting contact of the electronic component 38 with the printed-wiring board 60. In the present embodiment, the six suction nozzles 190 held by each mounting head 130 are different in kind from each other, but have the same length so that the sucking surfaces 201 of all the suction nozzles 190 lie substantially on a circle whose center lies on the axis of rotation of the rotary nozzle holder 186.

The selected suction nozzle 190 placed in its operating position is selectively communicated with a vacuum pump serving as a negative pressure source, an air pump serving as a positive pressure source, and the atmosphere. The electronic component 38 is sucked by the selected suction nozzle 190 when a negative pressure is applied from the vacuum pump to the suction nozzle 190. When a positive air pressure is applied from the air pump to the suction nozzle 190, the electronic component 38 is released from the suction nozzle 190. After the electronic component 38 is released from the suction nozzle 190, the suction nozzle 190 is open to the atmosphere. Selective communication of the suction nozzle 190 with the vacuum pump, air pump and atmosphere is effected by a mechanical switching action of a control valve in the form of a directional control valve 220, which is attached to the cylindrical sleeve 160, as shown in FIG. 3.

As shown in FIG. 3, two head elevating and lowering devices 230, 232 are provided in respective portions of the frame 110 and the cylindrical cam 140, which portions correspond to the component-receiving position and the component-mounting position, respectively.

The head elevating and lowering device 230 disposed at the component-receiving position will be briefly described by reference to FIG. 3. The head elevating and lower device 230 includes a movable member in the form of a vertically movable member 238 and a vertical drive device 240 operable to elevate and lower the vertically movable member 238. The vertically movable member 238 is fitted in a guide groove 244 formed in the cylindrical cam 140 so as to extend in the axial direction of the indexing body 120, such that the vertically movable member 238 is movable in the axial direction of the indexing body 120. The vertically movable member 238 has, in its lower end portion, an engaging groove 252 which can be contiguous with the above-indicated cam groove formed in the cylindrical cam 140. When the vertically movable member 238 is placed at its upper stroke end, the engaging groove 252 becomes contiguous with the cam groove so that the roller 148 moves into the engaging groove 252, whereby the mounting head 130 at the component-receiving position is supported by the vertically movable member 238.

The vertical drive device 240 includes a drive source in the form of the intermittent rotary drive motor 116 (FIG. 11), a motion converting device operable to convert a rotary motion of the intermittent rotary drive motor 116 into a vertical movement, and a motion transmitting device operable to transmit the vertical movement to the vertically movable member 238. The motion converting device includes a cam in the form of a rotary cam 254, a cam follower in the form of a roller 256, and levers 258, 260. The motion transmitting device includes a connecting rod 262 and a spherical joint 264. Thus, the vertically movable member 238 is vertically moved by the vertical drive device 240, to elevate and lower the mounting head 130 and the selected suction nozzle 190. The vertical movement of the suction nozzle 190 and its turning movement about the axis of the indexing body 120 in timed relation with each other are controlled by the configurations of the cam used in the rotary drive device 114 and the rotary cam 254. The vertical operating stroke of the vertically movable member 238 is adjusted to adjust the lowermost position of the mounting head 130. Since this adjustment does not directly relate to the present invention, no further description in this respect is deemed necessary.

The vertically movable member 238 of the head elevating and lowering device 232 is not adjustable in its vertical operating stroke. Namely, the lowermost and uppermost positions of the mounting head 130 at the component-mounting position are kept constant. In the other aspects, the head elevating and lowering device 232 is identical with the head elevating and lowering device 230. The same reference signs as used for the head elevating and lowering device 230 are used for the functionally corresponding elements of the head elevating and lowering device 232, which will not be described.

An angular-component-position changing device, a component-hold-position rectifying device and an angular-head-position resetting device 300 (FIG. 6) are disposed at the angular-component-position changing position, the component-hold-position rectifying position and the angular-head-position resetting position, respectively. The angular-component-position changing device is operated where the component-mounting angular position of the electronic component 38 in which the electronic component 38 is mounted on the printed-wiring board 60 is different from the component-receiving angular position in which the electronic component 38 is transferred from the component-supply portion of the selected tape feeder 36 to the suction nozzle 190. The angular-component-position changing device is arranged to rotate the mounting head 130 holding the electronic component 38 about its axis, to establish the component-mounting angular position of the electronic component 38. The component-hold-position rectifying device is arranged to rotate the mounting head 130 about its axis, for rotating the selected suction nozzle 190 to adjust the angular position of the electronic component 38 as held by the suction nozzle 190, to eliminate an error of angular positioning of the electronic component 38 about an axis perpendicular to the sucking surface 201. The angular-head-position resetting device 300 is arranged to rotate the mounting head 130 to its angular zero position after the head 130 has been rotated by the angular-component-position changing device and/or the component-hold-position rectifying device. The mounting head 130 is placed in the angular zero position when it is located at the component-receiving position.

Figure 6:
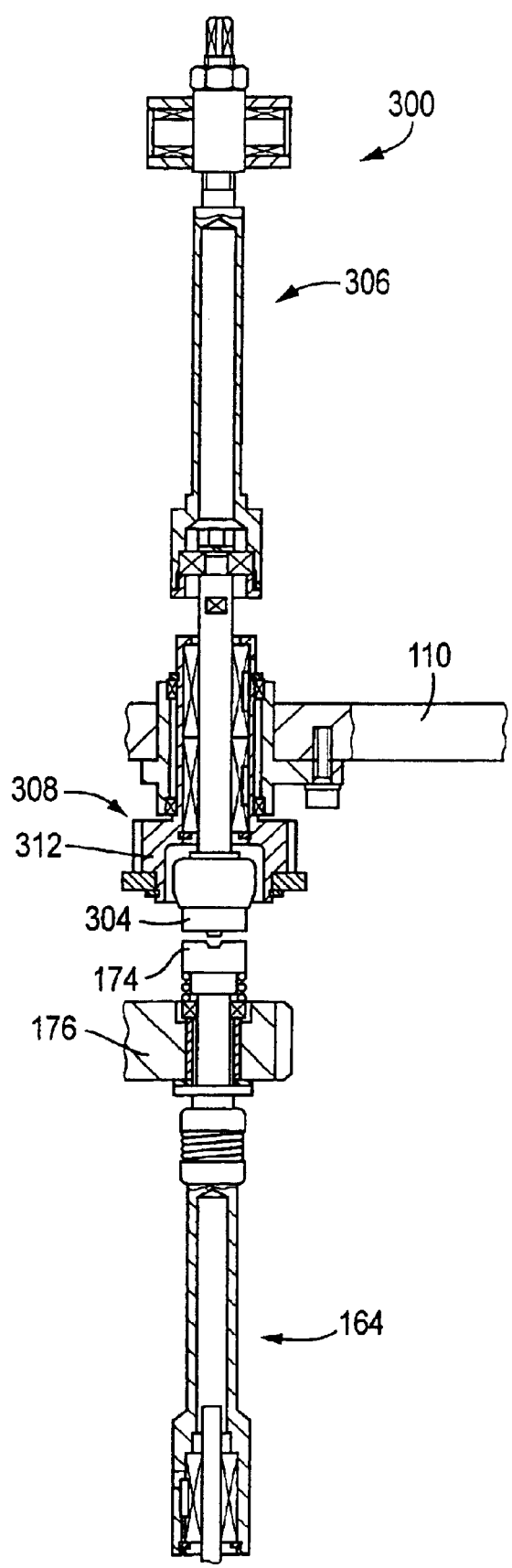
FIG. 6 is a front elevational view (partly in cross section) of an angular-head-position resetting device of the component-mounting device.

The angular-component-position changing device, the component-hold-position rectifying device and the angular-head-position resetting device 300 are all head rotating devices which are identical in construction with each other, in the present embodiment. Referring to FIG. 6, the angular-head-position resetting device 300 will be described by way of example. The angular-head-position resetting device 300 includes a second engaging member 304 supported by the frame 110 such that the second engaging member 304 is axially movable and rotatable relative to the frame 110. The resetting device 300 further includes a vertically moving device 306 and a rotating device 308. The vertically moving device 306 is arranged to move the second engaging member 304 in its axial direction, namely, in the vertical direction parallel to the axis of rotation of the indexing body 120, for engagement and disengagement of the second engaging member 304 with and from the first engaging member 174 described above. The rotating device 308 is arranged to rotate the second engaging member 304.

The vertically moving device 306 includes a motion converting device including a cam and a cam follower for converting the rotary motion of the intermittent rotary drive motor 116 into a vertical movement, and a motion transmitting mechanism for converting the vertical movement to the second engaging member 304 for engagement and disengagement with and from the first engaging member 174. The rotating device 308 includes an angular-head-position resetting motor 310 (FIG. 11), rotary motion of which is transmitted to the second engaging member 304 through a motion transmitting device including a timing pulley 312, so that the second engaging member 304 is rotated about its vertically extending axis. The second engaging member 304 in engagement with the first engaging member 174 is rotated, so that a rotary motion of the second engaging member 304 is transmitted to the mounting head 130 through the first engaging member 174 and the rotation transmitting shaft 164. Thus, the mounting head 130 can be rotated by a desired angle in a selected one of the clockwise and counterclockwise directions.

Figure 7:
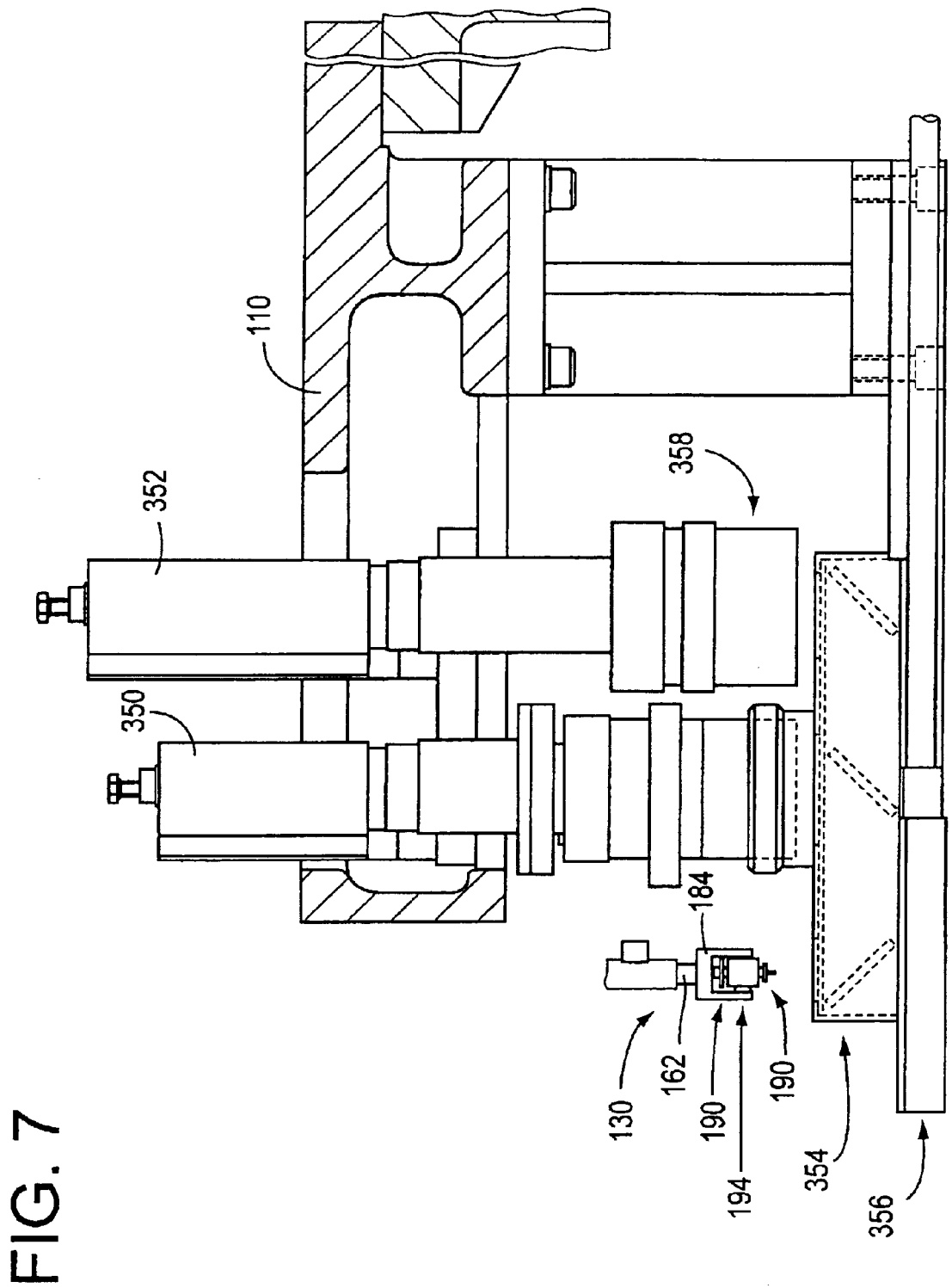
FIG. 7 is a front elevational view (partly in cross section) of an image-taking system of the component-mounting device, which includes a component camera.

At the component-hold-position detecting position, there are disposed two component cameras 350, 352, a light guiding device 354 and an illuminating device 356, as shown in FIG. 7. These component cameras 350, 352, light guiding device 354 and illuminating device 356, which are constructed as disclosed in JP-A-5-196441, will be described only briefly.

Like the fiducial mark camera 106, each of the component cameras 350, 352 is a CCD camera which includes CCDs and a lens system and which is an image-taking device in the form of a surface-imaging device capable of taking a two-dimensional image of an object at one time. Each component camera 350, 352 has an imaging area perpendicular to its centerline and having a center lying on its centerline. The two component cameras 350, 352 have respective different ratios or times of magnification. The component camera 350 has a comparatively low magnification ratio but has a comparatively wide field of view, while the component camera 352 has a comparatively high magnification ratio but has a comparatively narrow field of view. The two component cameras 350, 352 are selectively used depending upon the size of the electronic component 38.

The two component cameras 350, 352 are supported by a circumferential portion of the frame 110 which is located radially outwardly of the indexing body 120 and which corresponds to the component-hold-position detecting position. The two component cameras 350, 352 are positioned radially outwardly of the indexing body 120 and the mounting head 130 located at the component-hold-position detecting position, such that the centerlines of the cameras 350, 352 are parallel to each other and parallel to the vertically extending axis of rotation of the indexing disc 120 and are located on a straight line passing the axis of rotation of the indexing body 120 and the axis of rotation of the mounting head 130 located at the component-hold-position detecting position, and such that the two component cameras 350, 352 face downwards, so that an image of an object is formed in the horizontal imaging area.

At the component-hold-position detecting position, the light guiding device 354 is disposed so as to extend from a position right below the mounting head 130 located at the component-hold-position detecting position, to positions right below the lower ends of the component cameras 350, 352. The light guiding device 354 includes reflecting mirrors for reflecting a light indicative of images of the electronic component 38 held by the suction nozzle 190 and other objects, so that the light is incident upon the component cameras 350, 352. Thus, the image of the electronic component 38 is taken by the component cameras 350, 352, in the upward direction toward the electronic component 38.

The illuminating device 356 provided in the present embodiment is arranged to selectively irradiate the suction nozzle 190 with a visible light or a ultraviolet radiation, to take a silhouette image or a normal front image of the object. When the suction nozzle 190 is irradiated with the visible light, the visible light is reflected by the electronic component 38 held by the suction nozzle 190, so that a normal front image of the electronic component 38 is taken. When the suction nozzle 190 is irradiated with the ultraviolet radiation, the ultraviolet radiation is absorbed by a light-emitting surface 357 of a light-emitting body 358 provided on the suction nozzle 190, as shown in FIG. 5, and the light emitting surface 357 emits a visible light with which the upper surface of the electronic component 38 is irradiated so that a silhouette image of the electronic component 38 is taken. The light emitting surface 357 is coated with a fluorescent material for converting the ultraviolet radiation into the visible light. The component cameras 350, 352, light guiding device 354 and illuminating device 356 cooperate to constitute a component imaging system.

Figure 9:
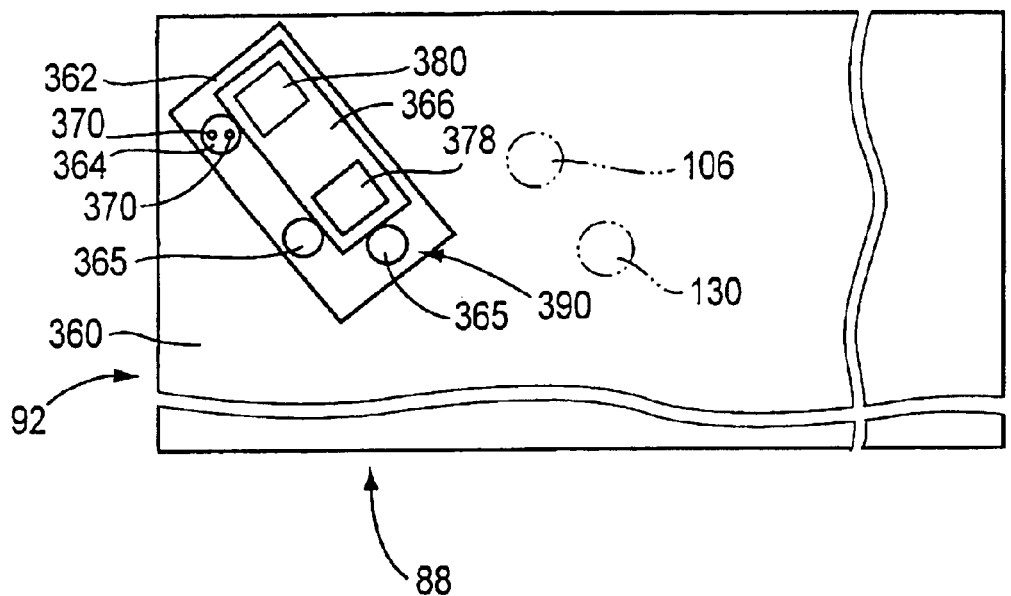
FIG. 9 is a plan view of the light guiding device as attached to a mounting block attached to the printed-wiring-board holding device.

On one corner area of an upper surface or support-member mounting surface 360 of the support plate 92 of the PWB supporting device 88 of the PWB holding device 18, there is fixed a mounting portion in the form of a mounting block 362, as shown in FIGS. 1, 2 and 9. On this mounting block 362, there are mounted at least one first positioning member and at least one second positioning member. In the present embodiment, one first positioning pin 364 and two second positioning pins 365 are mounted on the mounting block 362. The mounting block 362 is made of a magnetic material.

Figure 10:
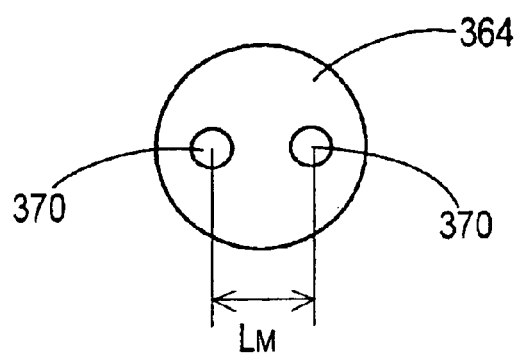
FIG. 10 is a plan view showing a positioning pin with holding-device fiducial marks, which is mounted on the mounting block to which the light guiding device is attached.

In the present embodiment, the first positioning pin 364 has a circular shape in transverse cross section, and extends perpendicularly to the support-pin mounting surface 360. On the upper end face of the first positioning pin 364, there are provided two holding-device fiducial marks 370 such that the two fiducial marks 370 are located adjacent to each other, as shown in FIG. 10, so that the images of the two fiducial marks 370 are simultaneously taken by the fiducial-mark camera. The second positioning pins 365 do not have such holding-device fiducial marks.

Each of the holding-device fiducial marks 370 has a circular shape and is formed so that the image of the fiducial mark 370 can be distinguished from the image of the upper end face of the first positioning pin 364. For instance, the fiducial marks 370 are formed by printing, in a color having a large difference in contrast with respect to the upper end face of the first positioning pin 364, so that the fiducial marks 370 can be easily distinguished from the upper end face of the pin 364. Where the upper end face of the pin 364 is white, for example, the fiducial marks 370 are black-colored. The fiducial marks 370 may be provided by printed adhesive films, or recesses or projections formed in or on the upper end face of the first positioning pin 364. Further, the fiducial marks 370 may have any shapes other than a circular shape, for instance, a triangular, rectangular or any other polygonal shape, a criss-cross or elliptical shape.

The images of the holding-device fiducial marks 370 are taken by the fiducial-mark camera 106 arranged to take the board fiducial marks 104 provided on the printed-wiring board 60. To this end, the mounting block 362 and the first positioning pin 364 are positioned on the support-pin mounting surface 360 of the support plate 92, so as to avoid an interference of the fiducial marks 370 with the printed-wiring board 60 as held by the PWB holding device 18, and such that the vertical position or height of the holding-device fiducial marks 370 (upper end face of the pin 364) is close to that of the board fiducial marks 104, so that the fiducial-mark camera 106 can be focused on the fiducial marks 370 as well as the fiducial marks 104.

The two positioning pins 365 also have a circular shape in transverse cross section, and extend perpendicularly to the support-pin mounting surface 360. The second positioning pins 365 have a length sufficient to be able to position a light guiding device 366. In the present embodiment, the second positioning pins 365 have the same length as the first positioning pin 364, as indicated in FIG. 2.

As shown in FIG. 8, the light guiding device 366 includes a main body in the form of a casing 376, two reflecting members in the form of two mirrors 378, 380 accommodated within the casing 376, and a focusing lens 382. The mirrors 378, 380 are inclined with respect to the vertical plane (perpendicular to the support-pin mounting surface 360)

such that a distance between the two mirrors 378, 380 in the horizontal direction increases in the upward direction. In the example of FIG. 8, the mirrors 378, 380 are inclined by 45° with respect to the vertical plane. The distance between the centers of the two mirrors 378, 380 is made equal to a nominal distance between the predetermined component-mounting position of the component-mounting device 16 and the center of the imaging area of the fiducial-mark camera 106. The light guiding device 366 is manufactured with a high degree of mechanical accuracy, such that the opposite side surfaces of the casing 376 extending in its longitudinal direction and a straight line passing the centers of the two mirrors 378, 380 have a high degree of parallelism.

As shown in FIG. 8, magnets in the form of two permanent magnets 386 are embedded in the bottom wall of the casing 376. The light guiding device 366 is positioned relative to the mounting block 362, with the casing 376 held in abutting contact with the one first positioning pin 364 and the two second positioning pins 365. The thus positioned light guiding device 366 is removably fixed to the mounting block 362 with magnetic forces of the permanent magnets 386. In the present embodiment, the permanent magnets 386 and the mounting block 362 made of a magnetic material cooperate to constitute a fixing device for fixing the light guiding device 366.

The first positioning pin 364 with the fiducial marks 370 and one of the two second positioning pins 365 are held in abutting contact with one of the opposite side surfaces of the casing 376 extending in the longitudinal direction in which the two mirrors 378, 380 are spaced apart from each other. The other second positioning pin 365 is held in abutting contact with one of the opposite end faces of the casing 376 which are perpendicular to the longitudinal direction. The positioning pins 364, 365 are positioned to position the casing 376 of the light guiding device 366 such that the straight line passing the centers of the two mirrors 378, 380 is parallel to a horizontally extending straight line which passes the component-mounting position of the component-mounting device 16 and the center of the imaging area of the fiducial-mark camera 106. It will be understood that the positioning pins 364, 365 cooperate to constitute a guiding-device positioning device 390 arranged to position the light guiding device 366 relative to the PWB holding device 18, in the XY plane which is perpendicular to the axis of the mounting head 130 at the component-mounting position.

The first positioning pin 364 with the holding-device fiducial marks 370 and the second positioning pins 365 are mounted on the mounting block 362, with a high degree of positioning accuracy, so that the light guiding device 366 is fixed on the support plate 92, at a predetermined position in a predetermined attitude, with a high degree of positioning accuracy. The light guiding device 366 thus positioned and fixed on the support plate 92 is located below the fiducial-mark camera 106 and the mounting head 130 located at the component-mounting position. When an image of the sucking surface 201 of the suction nozzle 190 selected on the mounting head 130 is taken by the fiducial-mark camera 106, as described below, a light emitted downwards from the illuminating device is reflected by the two mirrors 380, 378 inclined 45° to the horizontal plane, so that the direction of propagation of the light is changed 180°, whereby the light is eventually incident upon the sucking surface 201 in the upward direction along the axis of the mounting head 130. The light which is reflected by the sucking surface 201 and which defines the image of the sucking surface 201 is reflected by the two mirrors 378, 380 and is eventually incident upon the fiducial-mark camera 106. Thus, the light defining the image of the sucking surface 201 of the suction nozzle 190 as viewed in the upward direction along the vertical axis of the mounting head 130 is guided by the light guiding device 366 so as to be incident upon the fiducial-mark camera 106.

The fiducial-mark camera 106 takes the images of the board fiducial marks 104 as viewed in the downward direction. In the present embodiment, the image of the sucking surface 201 taken in the upward direction is reversed with respect to the image of each board fiducial marks 104 taken in the downward direction, such that the image of the sucking surface 201 in the imaging area of the fiducial-mark camera 106 is symmetrical with the image of the board fiducial mark 104, with respect to the Y-axis. In view of this reversal of the image of the sucking surface 201 taken in the upward direction, image data indicative of this image are processed so as to obtain an image of the sucking surface 201 as taken in the downward direction. The component cameras 350, 352 are also arranged to take the images of the object in the upward direction, and image data indicative of the image taken by the component cameras 350, 352 are also processed so as to obtain images of the object as taken in the downward direction. It is also noted that the angular positions of the component cameras 350, 352 about their axes are determined so that the image of the electronic component 38 (as held by the suction nozzle 190) taken by the component camera 350, 352 taken at the component-hold-position detecting position represents the angular positioning error of the electronic component 38 at the component-mounting position, which is spaced from the component-hold-position detecting position in the rotating direction of the indexing body 120. Accordingly, the positioning error of the electronic component 38 obtained on the basis of the image data taken by the component camera 350, 352 can be used to eliminate the positioning error at the component-mounting position. In the following description, the various positioning errors to be obtained on the basis of the images of the sucking surface 201 taken by the fiducial-mark camera 106 and the images of the electronic component 38 and the sucking surface 201 taken by the component camera 350, 352 are those as viewed in the downward direction, which are obtained by processing the image data in view of the above-indicated reversal of the images taken in the upward direction, with respect to the images taken in the downward direction. It is further noted that the adjustment of the angular position of the mounting head 130 at the component-hold-positioning rectifying position is effected to eliminate the angular positioning error of the electronic component 38 as located at the component-mounting position.

The focusing lens 382 is interposed between the lens system 109 of the fiducial-mark camera 106 and the mirror 380, to focus the fiducial-mark camera 106 on the sucking surface 201 of the suction nozzle 200 when the image of the sucking surface 201 is taken by the fiducial-mark camera 106.

The operation of the present electronic-component mounting system 12 is controlled by the control device 400, which is primarily constituted by a computer 410 incorporating a processing unit (PU) 402, a read-only memory (ROM) 404, a random-access memory (RAM) 406, and a bus interconnecting those elements 402, 404, 406, as indicated in FIG. 11. To the bus, there is connected an input/output interface 412, which in turn are connected to an input device 430, an encoder 436 and various other sensors. The input device 430 has ten keys, alphabet keys and function keys for use by the operator to enter various kinds of data.

To the input/output interface 312, there are also connected through driver circuits 416 various actuators such as the table drive motors 42, Z-axis drive motor 92, intermittent rotary drive motor 116 and angular-head-position resetting motor 310, and an alarm indicator 420 and an display device 432. Those actuators serving as drive sources are electric motors in the form of servomotors whose operating amounts or angles can be controlled with a comparatively high degree of accuracy. However, stepping motors may be used in place of the servomotors. The operating amounts or angles of the servomotors such as the table drive motors 42 are detected by respective rotary encoders. In FIG. 11, only the encoder 436 for the X-axis drive motor 68 is shown by way of example. The alarm indicator 420 is arranged to provide a suitable form of alarm such as a buzzer. The display device 432 may have a display screen arranged to provide information in the form of characters and graphical representations.

To the interface 412, there are also connected the fiducial-mark camera 106 and the component cameras 350, 352 through respective control circuits 418. The driver circuits 416, control circuits 418 and computer 410 constitute the control device 400. The RAM 406 is used to store various control programs and to temporarily store various kinds of data. The control programs include a control program for a main control routine, a control program for mounting the electronic component 38 on the printed-wiring board 60, a control program for executing a non-production-run relative-positioning-error detecting routine for detecting relative positioning errors between the suction nozzle 190 and the fiducial-mark camera 106, etc. while the system 12 is not in a production run, as illustrated in the flow chart of FIG. 14, and a control program for executing a production-run relative-positioning-error detecting routine for detecting the relative positioning errors during an interruption of the production run of the system 12, as illustrated in the flow chart of FIG. 15.

Basic operations of the electronic-component mounting system 12 constructed as described above to mount the electronic component 38 on the printed-wiring board 60 are well known in the art, as disclosed in JP-B2-8-21791, and will be briefly described.

When the electric component 38 is mounted on the printed-wiring board 60, the suction nozzle 190 selected on the mounting head 130 located at the component-receiving position is elevated by the head elevating and lowering device 230, so that the selected suction nozzle 190 placed in its operating position picks up the electronic component 38 by suction from the component-supplying device 14. Then, the mounting head 130 is turned to the angular-component-position changing position at which the mounting head 130 is rotated by the angular-component-position changing device, if necessary to change the angular position of the electronic component 38. At the angular-component-position changing position, the second engaging member 304 of the angular-component-position changing device is lowered by the vertically moving device 306, into engagement with the first engaging member 174, and is rotated by the rotating device 308 to rotate the mounting head 130 about its axis, so that the suction nozzle 190 placed in the operating position is rotated to rotate the electronic component 38. After the angular position of the electronic component 38 is changed, the mounting head 130 is turned to the component-hold-position detecting position at which the image of the electronic component 38 is taken by the component camera 350, 352.

The image of the electronic component 38 taken is compared with a reference or nominal image, to calculate XY positioning errors $\Delta XE$ and $\Delta YE$ and an angular positioning error $\Delta\theta$ of the electronic component 38. The XY positioning errors $\Delta XE$ and $\Delta YE$ are X-axis and Y-axis errors of a predetermined sucking position of the electronic component 38 with respect to the axis of rotation of the mounting head 130 in the XY or horizontal plane, while the angular positioning error $\Delta\theta$ is an error of the angular position of the electronic component 38 about a vertical axis perpendicular to the sucking surface 201 of the suction nozzle 190. At the component-hold-position rectifying position, the mounting head 130 is rotated by the component-hold-position rectifying device, to adjust the angular position of the electronic component 38 for compensation for the angular positioning error $\Delta\theta$. Namely, the second engaging member 304 of the component-hold-position rectifying device is brought into engagement with the first engaging member 174, and is rotated to rotate the mounting head 130.

Distances of movements of the PWB holding device 18 in the X-axis and Y-axis directions for mounting the electronic component 38 on the printed-wiring board 60 are adjusted for compensation for the XY positioning errors $\Delta XE$ and $\Delta YE$. According to the adjusted distances of movement, the PWB holding device 18 is moved by the XY table 64 to move the printed-wiring board 60 so that the component-mounting spot on the board 60 at which the electronic component 38 is to be mounted is aligned with the component-mounting position of the mounting head 130. Accordingly, the electronic component 38 can be mounted at the nominal component-mounting position on the board 60, in the predetermined attitude. The adjustment of the movement distances of the PWB holding device 18 is effected while taking into account the XY positioning errors $\Delta XP$ and $\Delta YP$ of the printed-wiring board 60, and the positioning error of the sucking position of the electronic component 38 which has been caused by the angular position adjustment at the component-hold-position rectifying position for compensation for the angular positioning error $\Delta\theta$. Before initiation of the operation to mount the electronic components 38 on the printed-wiring board 60, the images of the board fiducial marks 104 provided on the board 60 are taken by the fiducial-mark camera 106. In the present embodiment, the fiducial-mark camera 106 is operated to take the image of the board fiducial marks 104 while the board 60 supported by the PWB supporting device 88 is clamped by the clamping members 105, with the PWB holding device 18 located at the component-receiving position. On the basis of image data indicative of the image of the board fiducial marks 104, XY positioning errors of the printed-wiring board 60 as held by the clamping members 105 are calculated. On the basis of the calculated XY positioning errors of the board 60, XY positioning errors $\Delta XP$ and $\Delta YP$ of each component-mounting spots on the printed-wiring board 60 are calculated.

At the component-mounting position, the suction nozzle 190 is lowered by the head elevating and lowering device 232, to mount the electronic component 38 onto the printed-wiring board 60. Then, the mounting head 130 is stopped at the angular-head-position resetting position at which the mounting head 130 is rotated by the angular-head-position resetting device 300 to its angular zero position, from the angular position which has been established at the component-hold-position rectifying position to eliminate the angular positioning error $\Delta\theta$ of the electronic component 38 (after the rotation at the mounting head 130 at the angular-component-position changing position). Thus, the mounting head 130 is returned to its component-receiving angular position.

In the present electronic-component mounting system, an error of relative positioning between the fiducial-mark camera 106 and the PWB holding device 18 is detected while the system 12 is not in a production run, for instance, during manufacture, maintenance inspection or daily inspection of the system 12, upon replacement or setup changeover of the suction nozzles 190, or when a predetermined condition for detecting the relative positioning error is satisfied during a continuous operation to mount the electronic components 38, for example, when a predetermined cumulative time of continuous component mounting operation has passed. Referring to the flow chart of FIG. 14, the non-production-run relative-positioning-error detecting routine will be described. In this embodiment, this routine is executed as a part of the daily inspection of the system 12 (prior to a production run on each working day), and upon replacement of the suction nozzles 190.

When the routine of FIG. 14 is executed, the light guiding device 366 is mounted on the mounting block 362 by the operator. Namely, the light guiding device 366 is positioned with its casing 376 held in abutting contact with the three positioning pins 364, 365, and is fixed on the mounting block 362 with the magnetic forces of the permanent magnets 386. Since the positioning pins 364, 365 and the casing 376 are manufactured with high dimensional accuracy, so that the light guiding device 366 is attached to the PWB holding device 18 via the mounting block 362, with high positioning accuracy. The position of the light guiding device 366 established by abutting contact of the casing 376 with the positioning pins 364, 365 is the operating position of the light guiding device 366.

Figure 12A:
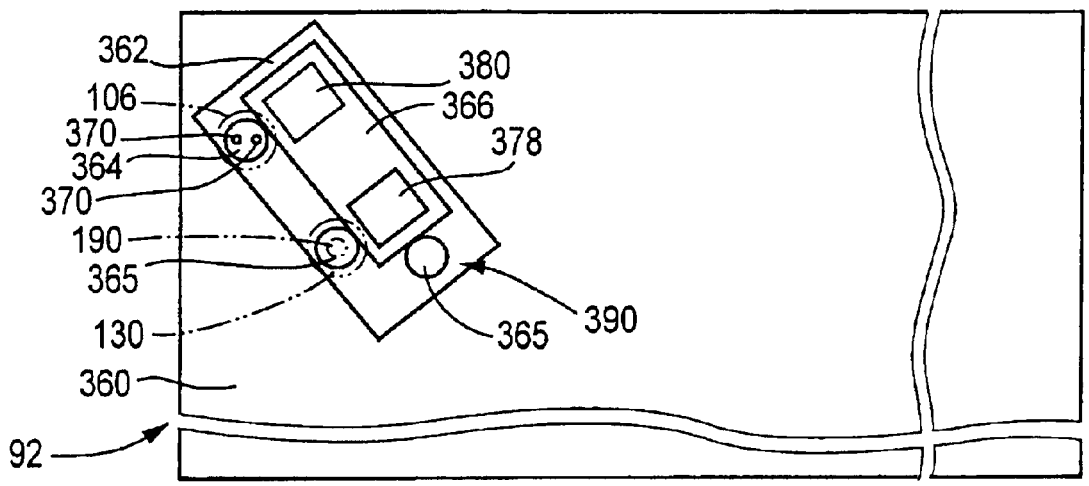
FIGS. 12A and 12B are views for explaining a manner of obtaining images of holding-device fiducial marks and a suction nozzle by the fiducial-mark camera.

The operator manipulates the input device 430 to inform the computer 410 that the light guiding device 366 has been mounted on the mounting block 362. In response to this information, the computer 410 initiates the non-production-run relative-positioning-error detecting routine of FIG. 14, with step S1 in which the image of the holding-device fiducial marks 370 are taken. To this end, the XY table 64 is operated to move the PWB holding device 18 according to predetermined movement data, to a predetermined image-taking position at which the images of the holding-device fiducial marks 370 are taken by the fiducial-mark camera 106. That is, the PWB holding device 18 is moved to the image-taking position at which a midpoint between the two fiducial marks 370 is aligned with the center of the imaging area of the fiducial-mark camera 106, and at which the first positioning pin 364 having the fiducial marks 370 is located right below the fiducial-mark camera 106, as indicated in FIG. 12A. Thus, the PWB holding device 18 is moved by the XY table 64 relative to the fiducial-mark camera 106, to the image-taking position at which the fiducial-mark camera 106 is operated to take the images of the holding-device fiducial marks 370 in the downward direction. The images of the two fiducial marks 370 located relatively adjacent to each other can be simultaneously taken by the fiducial-mark camera 106.

When the relative positioning error of the PWB holding device 18 and the fiducial-mark camera 106 is detected, the PWB holding device 18 is located at its board-loading/unloading position, and the PWB supporting device 88 is located at its fully elevated position for supporting the printed-wiring board 60. In this condition, the vertical position or height of the holding-device fiducial marks 370 is substantially the same as that of the board fiducial marks 104 whose images are also taken by the fiducial-mark camera 106. Accordingly, the fiducial-mark camera 106 can be focused on the holding-device fiducial marks 370. It will be understood that the Z-axis positioning device 90 and the board elevating and lowering device 98 cooperate to constitute an axial positioning device for positioning the light guiding device 366 in the axial direction of the fiducial-mark camera 106.

Step S1 is followed by step S2 to determine whether the images of the holding-device fiducial marks 370 have been taken in a normal manner. On the image data indicative of the images of the two fiducial marks 370, a distance LM (indicated in FIG. 10) between the centers of the two fiducial marks 370 is calculated. The determination in step S2 is effected by determining whether the calculated distance LM is within a predetermined permissible range. If the calculated distance LM is not within the permissible range, that is, is larger or smaller than a predetermined upper or lower limit of the permissible range, it means that the fiducial marks 370 are not in a normal state, for instance, are stained with foreign matters, that is, the images of the fiducial marks 370 have not been normally taken, so that the positions of the fiducial marks 370 cannot be correctly calculated on the basis of the obtained image data. In this case, a negative decision (NO) is obtained in step S3, and the control flow goes to step S7 in which the alarm indicator 420 is activated to inform the operator that the positions of the fiducial marks 370 have not been correctly obtained. In this case, the electronic-component mounting system 12 is turned off.

If the calculated distance LM between the two holding-device fiducial marks 370 is within the permissible range, it indicates that the fiducial marks 370 have been imaged in the normal manner, or that the positions of the fiducial marks 370 have been correctly obtained. In this case, an affirmative decision (YES) is obtained in step S2, and the control flow goes to step S3 to calculate X-axis and Y-axis coordinate values of a midpoint of a straight segment connecting the centers of the images of the two fiducial marks 370. These coordinate values are average values of the X-axis and Y-axis coordinate values of the center points of the two holding-device fiducial marks 370, and represent the position of the first positioning pin 364 provided with those fiducial marks 370.

If there exists a relative positioning error between the PWB holding device 18 and the fiducial-mark camera 106, the above-indicated midpoint between the images of the two fiducial marks 370 is offset from the center of the imaging area of the fiducial-mark camera 106. The X-axis and Y-axis coordinate values of the XY table 64 when the midpoint of the two fiducial marks 370 is aligned with the center of the imaging area of the fiducial-mark camera 106 are stored in the RAM 406 as a provisional zero position of the XY table 64. More specifically, the X-axis and Y-axis coordinate values as represented by the output signals of the encoders provided to detect the angular positions of the X-axis and Y-axis drive motors 68, 76 are stored in the RAM 406 as the provisional zero position of the XY table 64. The provisional zero position may be obtained by actually moving the XY table 64 to align the midpoint of the fiducial marks 370 with the center of the imaging area of the fiducial-mark camera 106, or by calculation on the basis of the detected relative positioning error between the PWB holding device 18 and the fiducial-mark camera 106. By moving the XY table 64 on the basis of the thus obtained provisional zero point of the XY table 64 and according to predetermined movement data sets corresponding to the predetermined component-mounting spots, the PWB holding device 18 can be moved relative to the fiducial-mark camera 106, without the relative positioning error. The provisional zero point of the XY table 64 is subsequently converted into an actual zero point by compensating the provisional zero point by a positioning error of the center of the imaging area of the fiducial-mark camera 106 relative to the axis of rotation of the suction nozzle 190.

The first positioning pin 364 with the fiducial marks 370 provided to obtain the actual zero point of the XY table 64 is provided in one corner portion of the support plate 92, which corner portion is outside a component-mounting area of the printed-wiring board 60 in which the electronic components 38 are mounted. That is, all of the component-mounting spots on the board 60 are located on the same side of the position of the first positioning pin 364 in the X-axis and Y-axis directions. In other words, the X-axis and Y-axis coordinate values of each component-mounting spot on the board 60 as represented by the output signals of the encoders of the X-axis and Y-axis drive motors 68, 76 are either smaller or larger than those of the position of the first positioning pin 364. Therefore, the position of the first positioning pin 364 aligned with the center of the imaging area of the fiducial-mark camera 106 can be used as the zero point of the XY coordinate system in which the XY table 64 is moved to move the board 60 (together with the PWB holding device 18), so as to mount the electronic components 38 at the respective component-mounting spots. In other words, when the electronic component 38 is mounted at each component-mounting spot on the board 60, the board 60 is moved with the PWB holding device 18, according to the X-axis and Y-axis coordinate values of the component-mounting spot, relative to the mounting head 130 located at the component-mounting position, so that the component-mounting spot is aligned with the mounting head 130. The above-indicated XY coordinate system is in the horizontal plane in which the component supply tables 30, 32 of the component-supplying device 14 are moved when the mounting head 130 receives the electronic component 38 from the selected tape feeder 36, and in which the XY table 64 is moved when the mounting head 130 transfers the electronic component 38 onto the corresponding component-mounting spot on the board 60. This XY coordinate system is convenient for programming the movements of the component supply tables 30, 32 and the XY table 64 (PWB holding device 18 or board 60), since the operations of the mounting head 130 to receive the electronic component 38 from the component-supply device 14 and to transfer the electronic component 38 onto the board 60 are performed above the board 60. As described below, the position of the fiducial-mark camera 106 used when the light guiding device 366 is moved to take the image of the reference suction nozzle 190 has a negative Y-axis coordinate value.

Figure 12B:
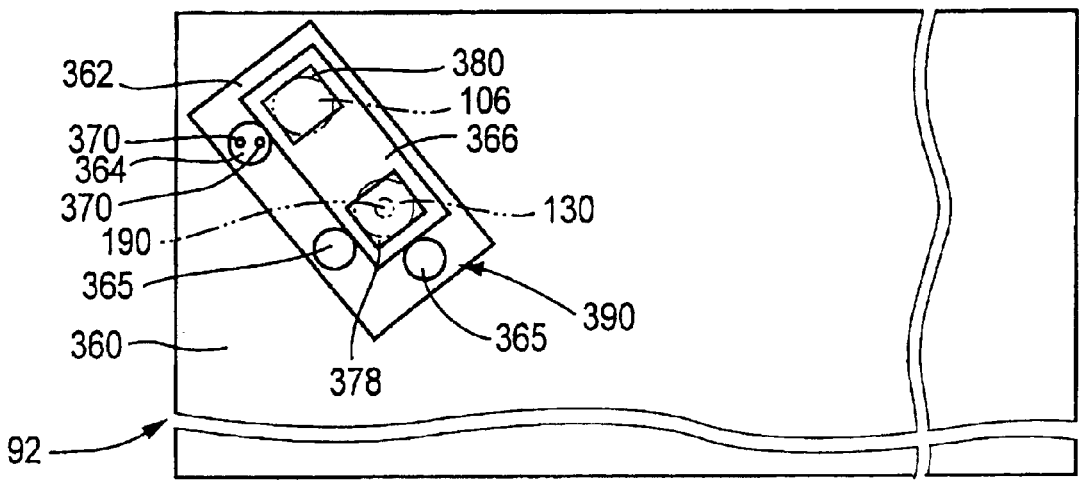

Then, the control flow goes to step S4 to take an image of the reference suction nozzle 190. To this end, the PWB holding device 18 is moved by the XY table 64 to move the light guiding device 366 to a predetermined image-taking position at which the mirror 378 is opposed to the suction nozzle 190 of the mounting head 130 located at the component-mounting position of the component-mounting device 16, while the mirror 380 is opposed to the fiducial-mark camera 106, as shown in FIG. 8 and FIG. 12B. The PWB holding device 18 is moved to move the light guiding device 366 to the predetermined image-taking position, on the basis of the provisional zero point obtained as described above and according to predetermined movement data. At this image-taking position, the center of the mirror 380 is aligned with the center of the imaging area of the fiducial-mark camera 106, as indicated in FIG. 8. The mirrors 378, 380 of the light guiding device 366 are positioned such that the distance between the centers of those two mirrors 378, 380 is equal to a distance between the component-mounting position of the component-mounting device 16 and the center of the imaging area of the fiducial-mark camera 106, and such that the two mirrors 378, 380 are spaced apart from each other in a direction parallel to a direction in which the axis of the fiducial-mark camera 106 and the mounting head 130 at the component-mounting position are spaced apart from each other. At the image-taking position indicated above, the mirror 378 is located right below the mounting head 130 and in alignment with the axis of rotation of the mounting head 130, while the mirror 380 is located right below the fiducial-mark camera 106 and in alignment with the optical axis of the camera 106.

The holding-device fiducial marks 370 to be imaged by the fiducial-mark camera 106 are located close to the mirror 380 of the light guiding device 366, and the positioning pins 364, 365 and the light guiding device 366 have high dimensional accuracies, so that the light guiding device 366 can be moved, with substantially no positioning error, to the predetermined image-taking position at which the mirrors 378, 380 are opposed to the fiducial-mark camera 106 and the mounting head 130 at the component-mounting position.

A predetermined one of the six suction nozzles 190 held by a predetermined one of the 16 mounting heads 130 is selected as the reference suction nozzle 190 whose image is to be taken by the fiducial-mark camera 106. The axis of rotation of this reference suction nozzle 190 will be referred to as "reference nozzle axis". In the present embodiment wherein each of the 16 mounting heads 130 has the six suction nozzles 190, the axis of rotation of each of the six suction nozzles 190 has the nominal position in the XY plane when each suction nozzle 190 is placed in its operating position. However, the actual position of the axis of rotation of the suction nozzle 190 placed in the operating position may be offset from the nominal position, due to an error during manufacture of the mounting head 130 or a positioning error of the suction nozzle 190 as held on the mounting head 130. In other words, the axes of rotation of the six suction nozzles 190 when placed in the operating position on each mounting head 130 may have different actual positions in the XY plane. In the present embodiment, the relative position between the mounting head 130 and the fiducial mark camera 106, and the relative positioning error therebetween are obtained on the basis of the detected position of the reference nozzle axis of the reference suction nozzle 190.

To take the image of the reference suction nozzle 190, the mounting head 130 carrying the reference suction nozzle 190 is moved to the component-mounting position by turning the indexing body 120 with the head-turning device 132, and the light guiding device 366 is moved by moving the PWB holding device 18 with the XY table 64, as described above. Thus, the reference suction nozzle 190, fiducial-mark camera 106 and light guiding device 366 have a predetermined relative position.

After the above-indicated movements of the reference suction nozzle 190 and the light guiding device 366, the fiducial-mark camera 106 is operated to take the image of the sucking surface 201 of the reference suction nozzle 190 placed in the operating position on the mounting head 130 located at the component-mounting position. The light defining the image of the sucking surface 201 is reflected by the mirrors 378, 380, so as to be incident upon the fiducial-mark camera 106. Thus, a normal front image of the sucking surface 201 is taken in the upward direction. Although the reference suction nozzle 190 and the fiducial-mark camera 106 are spaced apart from each other, the focusing lens 382 permits the fiducial-mark camera 106 to be focused on the sucking surface 201. The fiducial-mark camera 106 is operated to take images of the sucking surface 201 at respective different angular positions of the reference suction nozzle 190.

In the present electronic-component mounting system 12, the mounting head 130 can be rotated to rotate the selected suction nozzle 190 at each of the angular-component-position changing position, the component-hold-position rectifying position and the angular-head-position resetting position. Where the mounting head 130 located at the angular-head-position resetting position is rotated back to the original angular position by the angular-head-position resetting device 300 in the present embodiment, for instance, a first image of the reference suction nozzle 190 of the mounting head 130 located at the component-mounting position is taken by the fiducial-mark camera 106 when the mounting head 130 is placed in its component-mounting angular position. Then, this mounting head 130 is turned to the angular-head-position resetting position by a turning movement of the indexing body 120, and is rotated by 180° by the angular-head-position resetting device 300, so that the mounting head 130 is placed in its original angular position in which the mounting head 130 receives the electronic component 38 from the component-supplying device 14. The same mounting head 130 is then turned back to the component-mounting position, and a second image of the reference suction nozzle 190 is taken by the fiducial-mark camera 106 when the mounting head 130 is placed in its original angular position. Thus, the two images of the reference suction nozzle 190 are taken when the mounting head 130 is placed in its component-mounting angular position and original angular position, respectively. At the angular-head-position resetting position, the mounting head 130 is rotated with the first engaging member 174 held in engagement with the second engaging member 304 of the angular-head-position resetting device 300.

Figure 13A:
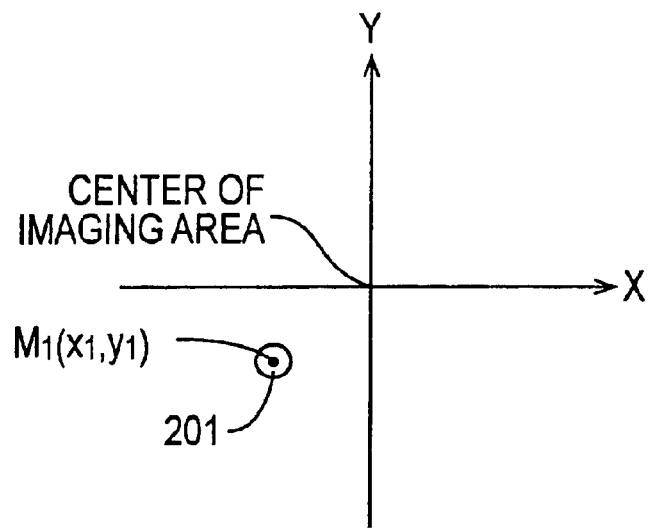
FIGS. 13A and 13B are views for explaining a manner of detecting the axis of rotation of a reference suction nozzle on the basis of the images taken by the fiducial-mark camera.
Figure 13B:
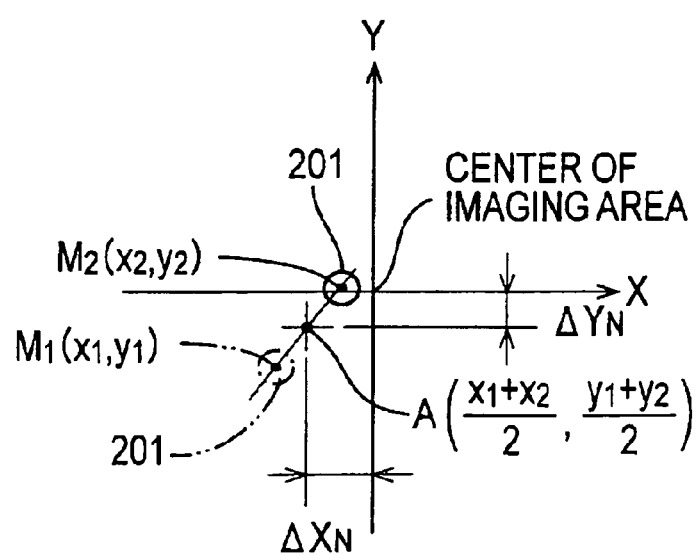
Figure 16A:
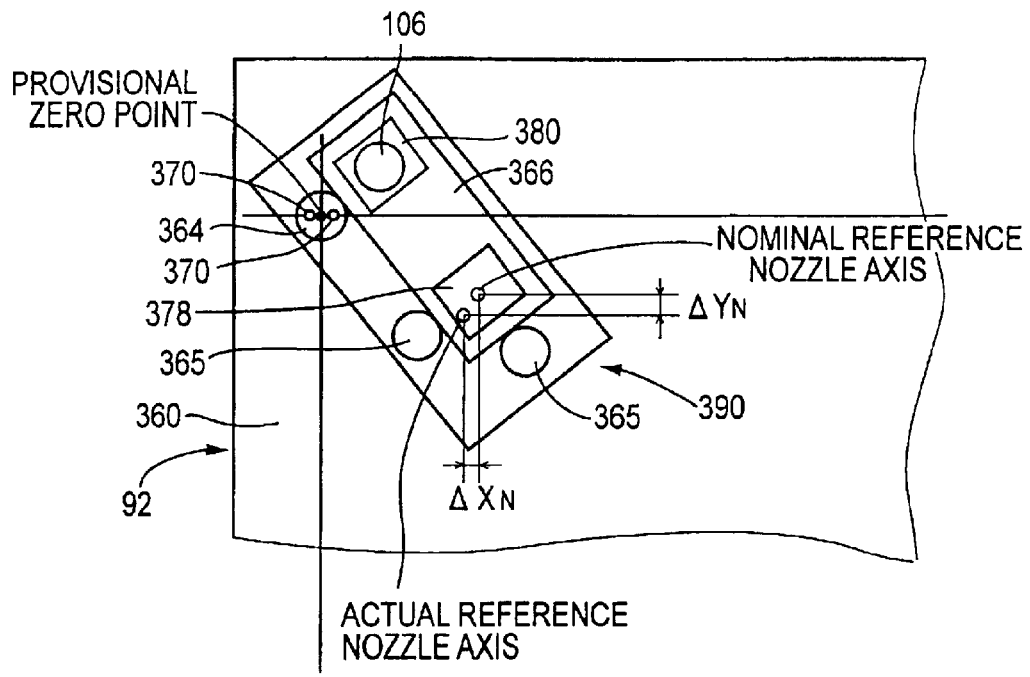
FIGS. 16A and 16B are view for explaining a manner of detecting a relative positioning error between a center position of an imaging area of the fiducial-mark camera and the axis of rotation of the reference suction nozzle, and a manner of setting the actual zero point of an XY table.

After the two images of the suction nozzle 190 have been taken, the control flow goes to step S5 to obtain a relative positioning error between the reference suction nozzle 190 and the fiducial-mark camera 106. In the presence of a relative positioning error between the reference suction nozzle 190 and the fiducial-mark camera 106, the actual axis of rotation of the reference suction nozzle 190 is offset from the nominal axis of rotation in the absence of the relative positioning error, as indicated in FIG. 16A. In this case, the first image of the sucking surface 201 of the reference suction nozzle 190 is taken as indicated in FIG. 13A, and the second image of the sucking surface 201 is taken as indicated in FIG. 13B. In FIG. 13B, "M1" and "M2" represent the center positions of the sucking surface 201 of the reference suction nozzle 190 in the images taken when the mounting head 130 is placed in the respective component-mounting and original angular positions, while "A" represents the position of the actual reference nozzle axis, which is offset from the center positions M1, M2 of the sucking surface 201. For easier understanding, a distance of offset between the position A of the actual reference nozzle axis and the center positions of the sucking surface 201 is exaggeratedly shown in FIG. 13B. The X-axis and Y-axis coordinate values (x1, y1) and (x2, y2) of the center positions M1, M2 in the two images of the sucking surface 201 are calculated on the basis of the image data indicative of the two images. Since the two images of the sucking surface 201 are taken when the mounting head 130 is placed in the respective angular positions of 0° and 180°, the position A of the actual reference nozzle axis is represented by the X-axis and Y-axis coordinate values {(x1+x2)/2, (y1+y2)/2} of the midpoint between the center positions M1, M2 of the sucking surface 201. Thus, the relative position between the position A of the actual axis of rotation of the reference nozzle 190 and the optical axis (center of the imaging area) of the fiducial-mark camera 106 is obtained. Namely, X-axis and Y-axis relative positioning errors $\Delta$XN and $\Delta$YN between the position A and the center of imaging area of the fiducial-mark camera 106 can be obtained. It is noted that while the images of the sucking surface 201 are actually taken in the upward direction, the images are shown in FIGS. 13A and 13B as if they were taken in the downward direction.

In the present embodiment in which the positioning pins 364, 365 and the light guiding device 366 have high degrees of positioning and dimensional accuracies, there are substantially no relative positioning errors between the positioning pins 364, 365 and the light guiding device 366. Since the first positioning pin 364 with the holding-device fiducial marks 370 and the mirror 380 are located considerably close to each other, the mirror 380 can be aligned with the fiducial-mark camera 106, after a movement of the PWB supporting device 88 from the position at which the images of the fiducial marks 370 are taken by the fiducial-mark camera 106 in the downward direction. Accordingly, the relative positioning error between the reference suction nozzle 190 and the fiducial-mark camera 106 can be obtained with high accuracy, on the basis of the images of the sucking surface 201 of the reference suction nozzle 190. This relative positioning error represents a positioning error of the reference suction nozzle 190 relative to the zero point determined on the basis of the images of the holding-device fiducial marks 370. The thus obtained relative positioning error is eliminated by adjusting or compensating movement data used to position the PWB holding device 18, at an appropriate opportunity, for example, upon detecting of the positioning error of the printed-wiring board 60 on the basis of the images of the board fiducial marks 104 taken by the fiducial-mark camera 106. The relative positioning error detected on the basis of the images of the reference suction nozzle 190 is a positioning error of the reference suction nozzle 190 relative to the center of imaging area of the fiducial-mark camera 106. On the basis of this relative positioning error, a positioning error of the center of imaging area of the fiducial-mark camera 106 relative to the reference nozzle axis (axis of rotation of the reference suction nozzle 190) is subsequently obtained. The positioning error of the center of imaging area of the fiducial-mark camera 106 consists of X-axis and Y-axis positioning errors whose signs are opposite to those of the above-indicated X-axis and Y-axis positioning errors $\Delta$XN and $\Delta$YN of the reference suction nozzle 190 relative to the center of imaging area of the fiducial-mark camera 106.

Figure 16B:
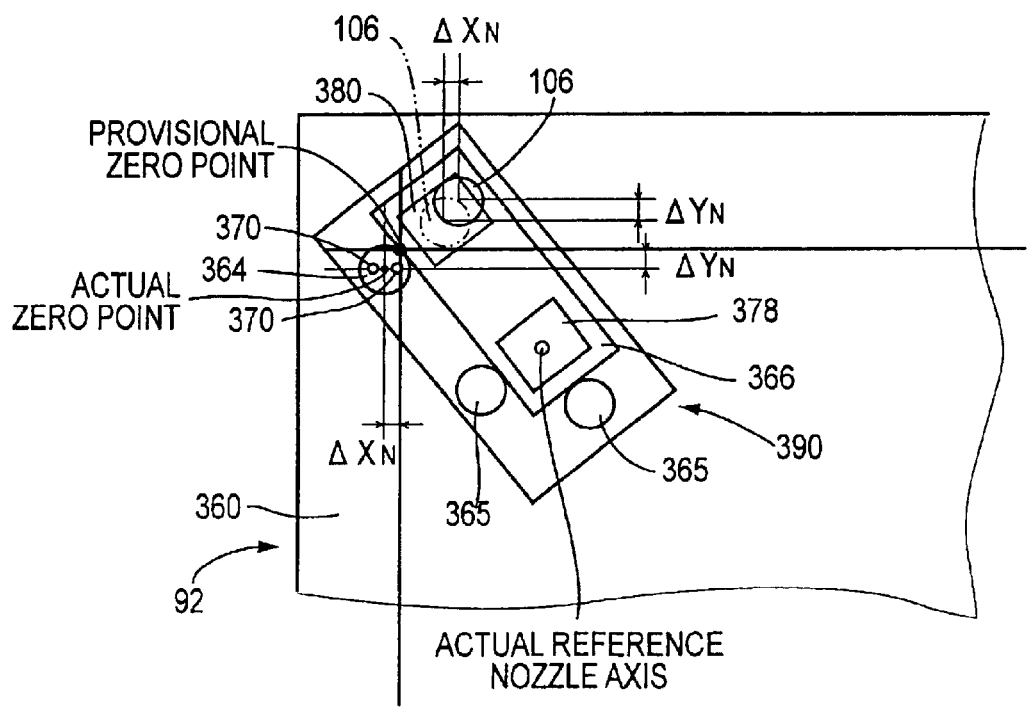

As described above, the data indicative of the provisional zero point of the XY table 64 are stored in the RAM 406. The provisional zero point is represented by the angular positions of the X-axis and Y-axis drive motors 68, 76 when the center of imaging area of the fiducial-mark camera 106 which has a positioning error relative to the reference nozzle axis is aligned with the midpoint between the two holding-device fiducial marks 370. Accordingly, the actual zero point is obtained by compensating the provisional zero point by the positioning error of the center of imaging area of the fiducial-mark camera 106 relative to the reference nozzle axis. By moving the PWB holding device 18 on the basis of the actual zero point and the predetermined movement data, the holding-device fiducial marks 370 and the mirror 378 of the light guiding device 366 are located at respective nominal positions relative to the reference nozzle axis, as indicated in FIG. 16B, while the fiducial-mark camera 106 is located at a position (indicated by solid line in FIG. 16B) which is spaced or offset from a nominal position (indicated by two-dot chain line in FIG. 16B) by the above-indicated X-axis and Y-axis relative positioning errors $\Delta$XN and $\Delta$YN.

Then, the control flow goes to step S6 to obtain a relative positioning error between the center of imaging area of the component camera 350, 352 and the axis of rotation of the reference suction nozzle 190 (reference nozzle axis), and relative positioning errors between the center of imaging area of the component camera 350, 352 and the axes of rotation of all of the other suction nozzles 190 (suction nozzles 190 other than the reference suction nozzle 190, which will be referred to as "ordinary suction nozzles 190"). On the basis of the relative positioning error between the reference nozzle axis and the center of imaging of the component camera 350, 352, and the relative positioning errors between the axes of the ordinary suction nozzles 190 and the center of imaging area of the component camera 350, 352, positioning errors of the axes of the ordinary suction nozzles 190 relative to the reference nozzle axis are obtained. Since the axes of rotation of the six suction nozzles 190 of each mounting head 130 may have different positions in the XY plane when the suction nozzles 190 are selectively placed in the operating position, as described above, the relative positioning errors of the axes of rotation of all of the six suction nozzles 190 are obtained.

There will be described a manner of obtaining the relative positioning error between the center of imaging area of each component camera 350, 352 and the reference nozzle axis. To obtain this relative positioning error, the reference suction nozzle 190 is moved to the component-hold-position detecting position, and the image of the sucking surface 201 of the reference suction nozzle 190 is taken by the component camera 350, 352. Like the two images of the sucking surface 201 taken by the fiducial-mark camera 106 as described above, two or more front images of the sucking surface 201 are taken by the component camera 350, 352, when the mounting head 130 is placed in respective angular positions. For instance, two images are taken when the mounting head 130 is placed in the component-mounting and original angular positions (e.g., angular positions of 180° and 0°). As described above, the original angular position is established by moving the mounting head 130 to the angular-head-position resetting position and operating the angular-head-position resetting device 300 to rotate the mounting head 130 by 180°. A midpoint of the center positions of the two images of the sucking surface 201 is determined as the position of the reference nozzle axis. Then, positioning errors of the component cameras 350, 352 relative to the determined reference nozzle axis are obtained, and are stored in the RAM 406, together with identification codes of the cameras 350, 352.

Like the front images of the sucking surface 201 of the reference suction nozzle 190, two front images of the sucking surface 201 of each of the ordinary suction nozzles 190 are taken by a selected one of the two component cameras 350, 352 when the corresponding mounting head 130 is placed in the respective two angular positions, for example, at the respective component-mounting and original angular positions (e.g., angular positions of 180° and 0°). On the basis of the two front images of the sucking surface 201 of each ordinary suction nozzle 190, the positioning error of the axis of rotation of each ordinary suction nozzle 190 relative to the center of imaging area of the selected component camera 350, 352 is obtained. Subsequently, a positioning errors of the axis of each ordinary suction nozzle 190 relative to the reference nozzle axis is calculated on the basis of the relative positioning error between the reference nozzle axis and the center of imaging area of the selected component camera 350, 352, and the relative positioning error between the axis of each ordinary suction nozzle 190 and the center of imaging area of the selected component camera 350, 352. The thus calculated relative positioning errors are stored in the RAM 406, together with an identification code of the mounting head 130 and an identification code of the nozzle holder 192 which holds the reference suction nozzle 190. Thus, a relative positioning error between the mounting head 130 and the fiducial-mark camera 106 when each ordinary suction nozzle 190 is placed in the operating position is obtained indirectly by obtaining the relative positioning error between the axis of each ordinary suction nozzle 190 and the reference nozzle axis.

As described above, two images of the sucking surface 201 of each of the six suction nozzles 190 including the reference suction nozzle 190 are respective obtained when the mounting head 130 is placed in the component-mounting angular position (180° position) while the mounting head 130 is located at the component-mounting position, and when the mounting head 130 is placed in the original angular position (0° position) while the mounting head 130 is located at the angular-head-position resetting position. The original angular position is established by operating the angular-head-position resetting device 300 to rotate the mounting head 130 by 180°. After the second image of one suction nozzle 190 has been taken in the original angular position of the mounting head 130, the mounting head 130 is again rotated by 180° to establish the component-mounting angular position, and is then moved to the nozzle-holder-selecting position. At this nozzle-holder-selecting position, the rotary nozzle holder 186 is rotated to bring the next suction nozzle 190 into the operating position. The operations described above are repeated to take the two images of the sucking surface 201 of this suction nozzle 190.

After the detection of the relative positioning errors while the system 12 is not in the production run is completed as described above, the light guiding device 366 is removed from the mounting block 362. Namely, the light guiding device 366 is not mounted on the PWB holding device 18 while the operation to mount the electronic components 38 on the printed-wiring board 60 is performed. Accordingly, the mass of the PWB holding device 18 during the component mounting operation is reduced, and the amount of vibration upon starting and stopping of positioning movements of the PWB holding device 18 is accordingly reduced. The computer 410 may be arranged to activate the display device 432 for providing an indication that the detection of the relative positioning errors has been completed. In this case, the operator removes the light guiding device 366, when the indication is provided, and manipulates the input device 430 to provide the computer 410 with a signal indicating that the light guiding device 366 has been removed, so that the system 12 is ready for initiating the component mounting operation. In the component mounting operation, the XY table 64 is operated to position the PWB holding device 18, in the XY coordinate system which has the actual zero point established as described above. The positioning error of the printed-wiring board 60 (component-mounting spots on the board 60) and the horizontal positioning errors of each electronic component 38 as held by the suction nozzle 190 are detected, while taking account of the relative positioning errors obtained in the relative-positioning-error detecting routine of FIG. 14.

When each printed-wiring board 60 is loaded onto the PWB holding device 18 and clamped thereon, the images of the board fiducial marks 104 are taken by the fiducial-mark camera 106, as described above, to detect the positioning error of the board 60 and the positioning error of each component-mounting spot on the board 60. To this end, the PWB holding device 18 is moved to image-taking positions by the XY table 64, which is controlled on the basis of the zero point determined on the basis of the images of the holding-device fiducial marks 370, and according to the predetermined movement data as compensated to eliminate the relative positioning errors ΔXN and ΔYN of the center of imaging area of the fiducial-mark camera 106.

After the PWB holding device 18 has been moved to the image-taking position corresponding to each board fiducial mark 104, the fiducial-mark camera 106 is operated to take the image of each board fiducial mark 104, and the positioning errors of the centers of the fiducial marks 104 relative to the center of imaging area of the fiducial-mark camera 106 are obtained on the basis of the image data indicative of the images of the fiducial marks 104. These relative positioning errors do not include the relative positioning error between the fiducial-mark camera 106 and the PWB holding device 18, the relative positioning error between the reference nozzle axis and the center of imaging area of the fiducial-mark camera 106 and the relative positioning error between the reference nozzle axis and the zero point. Therefore, the relative positioning errors between the centers of the board fiducial marks 104 and the center of imaging area of the fiducial-mark camera 106 accurately represent the relative positioning error between the printed-wiring board 60 and the reference nozzle axis. Thus, the relative positioning error between each component-mounting spot on the board 60 and the reference nozzle axis can be accurately obtained on the basis of the positioning errors of the two board fiducial marks 104 relative to the fiducial-mark camera 106.

As described above, the actual zero point of the XY table 64 is determined on the basis of the positioning error of the center of imaging area of the fiducial-mark camera 106 relative to the reference nozzle axis. Accordingly, there exist no relative positioning errors among the actual zero point, light guiding device 366, holding-device fiducial marks 370 and reference suction nozzle. However, the center of imaging area of the fiducial-mark camera 106 is offset from the fiducial marks 370 and the reference nozzle axis by the positioning error of the center of imaging area relative to the reference nozzle axis, as indicated by solid line in FIG. 16B. In view of this, the predetermined movement data used to move the PWB holding device 18 to the image-taking positions for taking the images of the fiducial marks 104 are compensated so as to eliminate the relative positioning errors ΔXN and ΔYN, so that the fiducial-mark camera 106 is located at the nominal position indicated by two-dot chain line in FIG. 16B, whereby the images of the fiducial marks 104 can be taken by the fiducial-mark camera 106, as if there exist no relative positioning errors among the fiducial-mark camera 106, actual zero point, light guiding device 366, holding-device fiducial marks 370 and reference nozzle axis. Thus, the positioning error of the printed-wiring board 60 relative to the reference nozzle axis can be accurately obtained, without an influence by the positioning errors of the fiducial-mark camera 106 relative to the reference nozzle axis and the fiducial marks 370.

The thus detected positioning error of each component-mounting spot on the printed-wiring board 60 is eliminated when the corresponding electronic component 38 is mounted at that spot. Since the detected positioning error of each component-mountings spot does not include the positioning error of the fiducial-mark camera 106 relative to the reference nozzle axis, a movement of the PWB holding device 18 according to the predetermined movement data as compensated so as to eliminate the positioning error of the component-mounting spot makes it possible to establish the relative position between the component-mounting spot and the reference nozzle axis, which relative position is determined on the basis of the relative positioning errors among the fiducial-mark camera 106, holding-device fiducial marks 370 and board fiducial marks 104. If there exists a relative positioning error between the reference nozzle axis and the center of imaging area of the fiducial-mark camera 106, this relative positioning error must be eliminated. To this end, either the center of imaging area of the fiducial-mark camera 106 or the reference nozzle axis may be used as a reference to eliminate the relative positioning error. In this embodiment, however, the reference nozzle axis is used as the reference. Further, the relative positioning error between the center of imaging area of the fiducial-mark camera 106 and the reference nozzle axis is first obtained, and after adjustment of the movement data for the PWB holding device 18 so as to eliminate this relative positioning error, the images of the board fiducial marks 104 are taken by the fiducial-mark camera 106, so that the positioning errors of the fiducial marks 104 obtained on the basis of their images are positioning errors relative to the reference nozzle axis used as the reference.

The movement data to move the PWB holding device 18 need not be adjusted or compensated to eliminate the relative positioning error between the reference nozzle axis and the center of imaging area of the fiducial-mark camera 106, when the images of the board fiducial marks 104 are taken by the fiducial-mark camera 106. That is, the adjustment may be made when the positioning errors of the centers of the fiducial marks 104 relative to the reference nozzle axis are obtained.

The positioning error of each component-mounting spot on the printed-wiring board 60 may include an error of positioning of the PWB holding device 18 at the image-taking position for taking the image of each board fiducial mark 104. Since a similar positioning error of the PWB holding device 18 also arises when the corresponding electronic component 38 is mounted at the component-mounting spot, the movement data for the PWB holding device 18 (printed-wiring board 60) to mount the electronic component 38 are adjusted only to eliminate the positioning error of the component-mounting spot. Further, the fiducial-mark camera 106 is located as close as possible to the component-mounting position at which the electronic component 38 is transferred from the suction nozzle 190 to the component-mounting spot. Accordingly, the error of positioning of the board 60 is small and may be substantially ignored. A relatively short distance between the fiducial-mark camera 106 and the component-mounting position reduces the required area of movement of the PWB holding device 18 and therefore reduces the required size of the system 12.

In the operation to mount the electronic component 38 on the board 60, the image of the electronic component 38 as held by the suction nozzle 190 is taken by the component camera 350, 352, and the horizontal positioning errors of the electronic component 38 and its center position errors due to adjustment of the angular position to eliminate the angular positioning error are detected. These horizontal positioning errors and center position errors are eliminated by adjustment of the movement data used to move the corresponding component-mounting spot to the component-mounting position. The horizontal positioning errors of the electronic component 38 as held by each suction nozzle 190 are obtained with respect to the reference nozzle axis.

The center position errors of the electronic component 38 arise as a result of rotating the suction nozzle 190 to eliminate the angular positioning error $\Delta\theta$ of the electronic component 38. The center position errors of the electronic component 38 are obtained on the basis of the positioning error of the axis of rotation of each ordinary suction nozzle relative to the reference nozzle axis, and the angular positioning error $\Delta\theta$ and the horizontal positioning errors of the electronic component 38. Since the positioning errors of the axes of all of the ordinary suction nozzles 190 relative to the reference nozzle axis have been obtained as described above, the center position errors of the electronic component 38 as held by each ordinary suction nozzle 190 can be obtained with high accuracy, by taking account of the positioning error of the axis of the ordinary suction nozzle 190 relative to the reference nozzle axis.

In the present electronic-component mounting system 12 described above, the zero point of the PWB holding device 18 is determined with respect to the axis of rotation of the reference suction nozzle 190, and the positioning errors of the fiducial-mark camera 106 and the component cameras 350, 352 are obtained with respect to the reference nozzle axis. In view of these positioning errors, the positioning error of the printed-wiring board 60 is obtained on the basis of the images of the board fiducial marks 104 taken by the fiducial-mark camera 106, and the positioning errors of the electronic component 38 are obtained on the basis of the images taken by the component camera 350, 352. The predetermined movement data used to move each component-mounting spot on the board 60 to the component-mounting position are compensated or adjusted to eliminate those positioning errors of the board 60 and the electronic component 38, so that the electronic component 38 is mounted at the corresponding component-mounting spot with a high degree of positioning accuracy.

Once the operation to mount the electronic components 38 on the printed-wiring board 60 has been initiated, the initially obtained relative positioning errors (obtained as part of the daily inspection of the system 12 effected prior to a production run of each day) are used to detect the positioning error of the board 60, and the horizontal positioning errors and the center position errors of the electronic components 38. The movement data used to position the board 60 for mounting the electronic components 38 at the respective component-mounting spots are adjusted on the basis of the thus detected positioning errors and center position errors, and the board 60 is positioned in the XY coordinate system whose zero point (actual zero point) is determined as described above. The initially obtained relative positioning errors are used until they are updated on the basis of the image data obtained again by the fiducial-mark camera 106 and the component cameras 350, 352.

Figure 15:
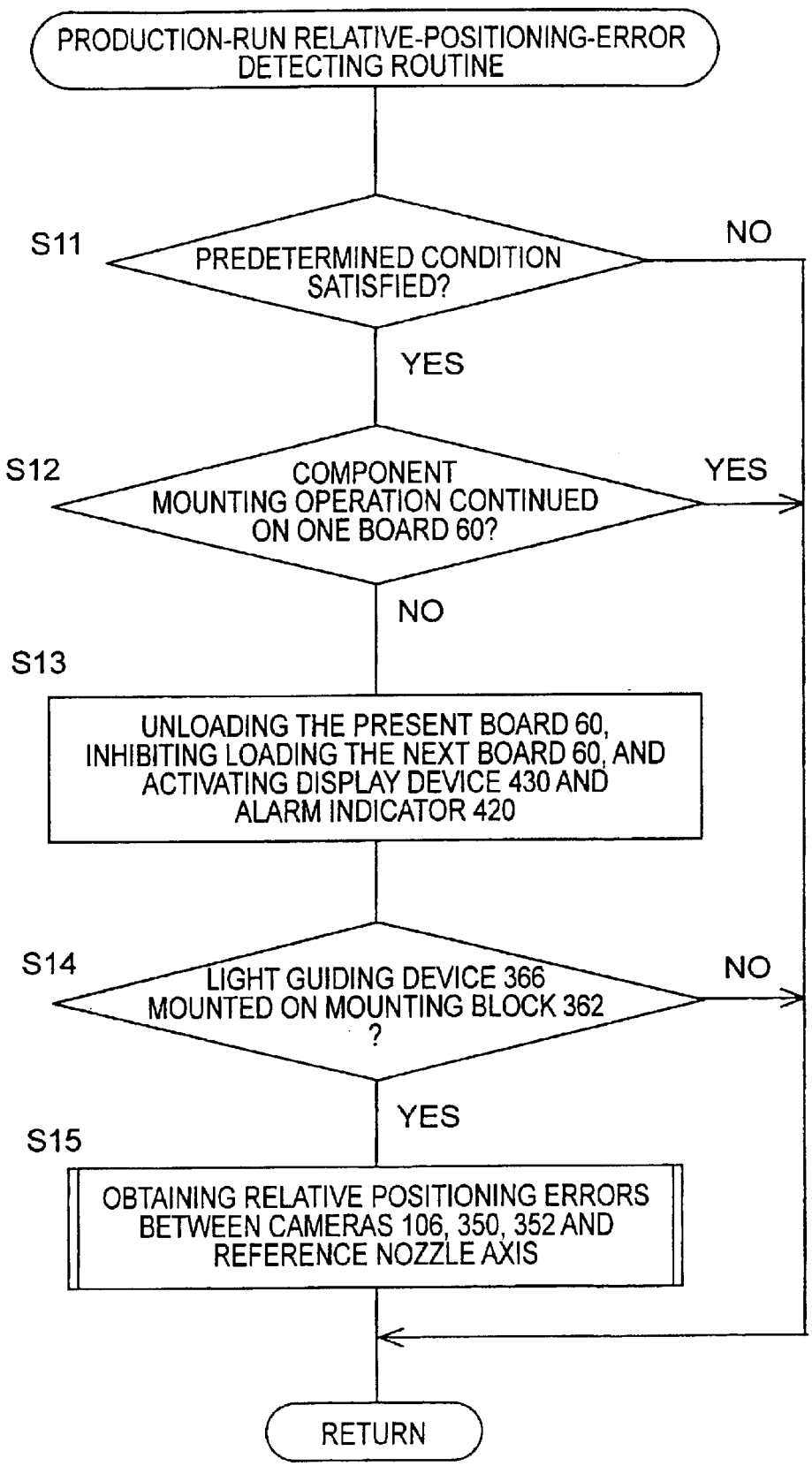
FIG. 15 is a flow chart illustrating a routine executed by the computer according to a control program stored in the RAM, for detecting relative positioning errors while the system is in a production run.

Referring next to the flow chart of FIG. 15, there will be described the production-run relative-positioning-error detecting routine which is executed during an interruption of the continuous operation to mount the electronic components 38 on the printed-wiring boards 60. This routine is initiated with step S11 to determine whether a predetermined condition for initiating the routine is satisfied. In this specific example of FIG. 15, step S11 is formulated to determine whether the component mounting operation has been performed for a predetermined time. A negative decision (NO) is obtained in step S11 until the predetermined time has passed after the moment of initiation of the component mounting operation of the system 12. When the negative decision (NO) is obtained in step S11, one cycle of execution of the routine of FIG. 15 is terminated.

When the predetermined time has passed after the moment of initiation of the component mounting operation of the system 12, an affirmative decision (YES) is obtained in step S11, and the control flow goes to step S12 to determine whether the component mounting operation is continued on one printed-wiring board 60. If an affirmative decision (YES) is obtained in step S12, one cycle of execution of the routine is terminated. Thus, the detection of the relative positioning errors is not initiated even after the predetermined condition is satisfied, if the component mounting operation on one board 60 is continued.

When the component mounting operation on the present board 60 is terminated, a negative decision (NO) is obtained in step S12, and the control flow goes to step S13 in which the board 60 on which the electronic components 38 has been mounted is unloaded from the PWB holding device 18, and the loading of the next board 60 onto the PWB holding device 18 is inhibited. In the present embodiment, the light guiding device 366 is mounted on a portion of the support plate 92 of the PWB supporting device 88, which portion is covered by the board 60 placed on the support plate 92. For this reason, the board 60 is removed from the support plate 92 of the PWB holding device 18, to permit the light to be guided by the light guiding device 366 between the fiducial-mark camera 106 and the sucking surface 201 of the suction nozzle 190, as described above, when the relative positioning errors between the reference suction nozzle 190 and the fiducial-mark camera 106 are detected. Step S13 is further formulated to activate the display device 432 and the alarm indicator 420 to provide respective visible and audible indications that the detection of the relative positioning errors is going to be initiated. At this time, the alarm indicator 420 is activated in a manner different from that where the images of the holding-device fiducial marks 370 have not been correctly taken.

In response to the visible and audible indications provided by the display device 432 and the alarm indicator 420, the operator mounts the light guiding device 366 on the mounting block 362 of the PWB holding device 18. After the light guiding device 366 has been mounted on the mounting block 362, the operator manipulates the input device 430 to inform the computer 410 that the light guiding device 366 has been mounted on the mounting block 362. As a result, an affirmative decision (YES) is obtained in step S14, which is formulated to determine whether the light guiding device 366 has been mounted on the mounting block 362. Accordingly, the control flow goes to step S15 to determine the provisional zero point of the XY table 64 on the basis of the images of the holding-device fiducial marks 370 taken by the fiducial-mark camera 106, obtain the positioning error of the center of imaging area of the fiducial-mark camera 106 relative to the reference nozzle axis, determine the actual zero point of the XY table 64, and obtain the positioning error of the centers of imaging areas of the component cameras 350, 352 relative to the reference nozzle axis. In the production-run relative-positioning-error detecting routine of FIG. 15, the relative positioning errors, etc. are obtained or determined in substantially the same manner as in the non-production-run relative-positioning-error detecting routine of FIG. 14

When the electronic-component mounting system 12 has been operated to perform the component mounting operation for the predetermined time, various component members such as the ballscrews 70, 78 of the XY table 64 of the system 12 have thermal expansion due to a rise of the operating temperature of the various devices. Accordingly, the distances of movement of the X-axis slide 74 and the Y-axis slide 82 of the XY table 64 according to certain movement data vary depending upon the amount of the thermal expansion, or depending upon whether the ballscrews 70, 78 have thermal expansion or not. Further, the positions of the stationary members may vary due to their thermal expansion. For example, the position of the fiducial-mark camera 106 relative to the holder member 107, and the positions of the component cameras 350, 352 relative to the frame 110 may vary due to the thermal expansion of the system 12. Accordingly, the positions of the images of the holding-device fiducial marks 370 in the imaging area of the fiducial-mark camera 106 may vary. In view of such variations, the positioning error of the fiducial-mark camera 106 relative to the reference nozzle axis and the actual zero point of the XY table 64 must be updated in the presence of the thermal expansion, on the basis of the images of the fiducial marks 370 and the sucking surface 201 of the reference suction nozzle 190 taken by the fiducial-mark camera 106. When the images of the fiducial marks 370 are taken, the PWB holding device 18 is moved to the zero point presently established for the XY table 64. Further, the positioning errors of the centers of imaging areas of the component cameras 350, 352 relative to the reference nozzle axis are also updated.

After the relative positioning errors, etc. have been obtained, the light guiding device 366 is removed from the mounting block 362, and the component mounting operation of the system 12 is resumed. In this component mounting operation, the printed-wiring boards 60 are moved according to the actual zero point newly established for the XY table 64, and the newly obtained relative positioning errors. While the positioning error of each component-mounting spot on the board 60 which is obtained on the basis of the images of the board fiducial marks 104 is influenced by the thermal expansion of the ballscrews 70, 78 of the XY table 64, the use of the obtained positioning error of each component-mounting spot to adjust the movement data for mounting the electronic component 38 at the component-mounting spot does not cause a problem, since the movements of the board 60 to mount the electronic components 38 at the respective component-mounting spots are influenced by the thermal expansion in the same manner as the movement of the board 60 when the images of the board fiducial marks 104 are taken by the fiducial-mark camera 106.

It is also noted that the temperature of the printed-wiring board 60 newly loaded onto the PWB holding device 18 is not so high. Further, the board 60 is not influenced by the temperature of the PWB holding device 18 having the thermal expansion, since the board 60 is merely supported in abutting point-contact with the support pins 94 and is clamped only at its widthwise end portions by and between the support surfaces 103 and the clamping members 105. Accordingly, the electronic components 38 can be mounted on the respective component-mounting spots on the board 60 with high accuracy, by moving the board 60 relative to the newly established zero point, according to the predetermined movement data sets as adjusted so as to eliminate the newly obtained relative positioning errors.

The center position errors of the electronic component 38 are obtained on the basis of the positioning error of the axis of rotation of the corresponding ordinary suction nozzle 190 relative to the reference nozzle axis, which is obtained prior to the production run of the system 12. Although the positioning error of each ordinary suction nozzle 190 relative to the reference nozzle axis may be detected on the basis of the images of the sucking surface 201 taken by the component camera 350, 352 during the production run, it is not necessary to detect this positioning error during the production run, since the position of the axis of rotation of each suction nozzle 190 usually remains unchanged after the suction nozzle 190 is held on the mounting head 130.

If the reference suction nozzle 190 is replaced by a new reference suction nozzle 190, the positioning errors of the axes of rotation of all of the ordinary suction nozzles 190 relative to the reference nozzle axis are obtained during the production run, in the same manner prior to the production run. If any one of the ordinary suction nozzles 190 is replaced by a new ordinary suction nozzle, the positioning error of the axis of rotation of that new ordinary suction nozzle 190 relative to the reference nozzle axis is obtained during the production run.

It will be understood from the foregoing description of the present embodiment that a portion of the control device 400 assigned to implement step S3 of the non-production-run relative-positioning-error detecting routine of FIG. 14 constitutes a first relative-positioning-error obtaining portion operable to obtain a first relative positioning error between the fiducial-mark camera 106 and the PWB holding device 18, on the basis of a positioning error of images of the holding-device fiducial marks 370 taken within the imaging area of the fiducial-mark camera 106, and that the control device 400 provides a second relative-positioning-error obtaining portion operable to obtain a second relative positioning error between the fiducial-mark camera 106 and the printed-wiring board 60, on the basis of a positioning error of images of the board fiducial marks 104 taken within the imaging area of the fiducial-mark camera 106. It will also be understood that a portion of the control device 400 assigned to implement steps S4 and S5 of the routine of FIG. 14 constitutes a relative-positioning-error obtaining portion or a third relative-positioning-error obtaining portion operable to obtain a relative positioning error between the fiducial-mark camera 106 and the mounting head 130, or a third relative positioning error between the fiducial-mark camera 106 and the axis of rotation of the reference suction nozzle 190 or the mounting head 130, on the basis of a positioning error of the image of the sucking surface 201 of the reference suction nozzle 190 taken within the imaging area of the fiducial-mark camera 106. It will further be understood that the control device 400 also provides a relative-positioning-error compensating portion operable to obtain the horizontal positioning errors of each component-mounting spot on the board 60, which do not include the above-indicated third positioning error (between the fiducial-mark camera and the axis of rotation of the reference suction nozzle 190), and further operable to position the board 60 so as to eliminate the horizontal positioning errors of each component-mounting spot, so that the electronic component 38 is mounted at the corresponding component-mounting spot, without the horizontal positioning errors. It will further be understood that the control device 400 further provides a movement control portion operable to control the XY table 64 according to the zero point established on the basis of the images of the holding-device fiducial marks 370, and according to the predetermined movement data as adjusted so as to eliminate the horizontal positioning errors of each component-mounting spot on the board 60 detected on the basis of the images of the board fiducial marks 104, so that each component-mounting spot on the board 60 is aligned with the axis of rotation of the suction nozzle 190 located at the component-mounting position. It will also be understood that a portion of the control device 400 assigned to implement step S2 of the routine of FIG. 14 provides a correct-mark-position determining portion operable to determine whether the positions of the holding-device fiducial marks 370 have been correctly obtained, depending upon whether the relative position between the fiducial marks 370 is located within a permissible area set in the imaging area of the fiducial-mark camera 106. It will further be understood that a portion of the control device 400 assigned to implement step S7 of the routine of FIG. 14 constitutes stopping means for stopping the operation of the electric-component mounting system 12, and cooperates with the alarm indicator 420 to constitute alarm indicating means for providing an indication that the positions of the fiducial marks 370 have not been correctly detected. It will also be understood that a portion of the control device 400 assigned to implement step S15 of the production-run relative-positioning-error detecting routine of FIG. 15 constitutes a production-run relative-positioning-error detection control portion operable to control the relative-movement device 134, the fiducial-mark camera 106 and the above-indicated relative-positioning-error obtaining portion or first or third relative-positioning-error obtaining portion, to obtain the relative positioning error between the fiducial-mark camera 60 and the mounting head 130, or the first relative positioning error between the fiducial-mark camera 106 and the PWB holding device 18, or the third relative positioning error between the fiducial-mark camera 106 and the mounting head 130.

Figure 17:
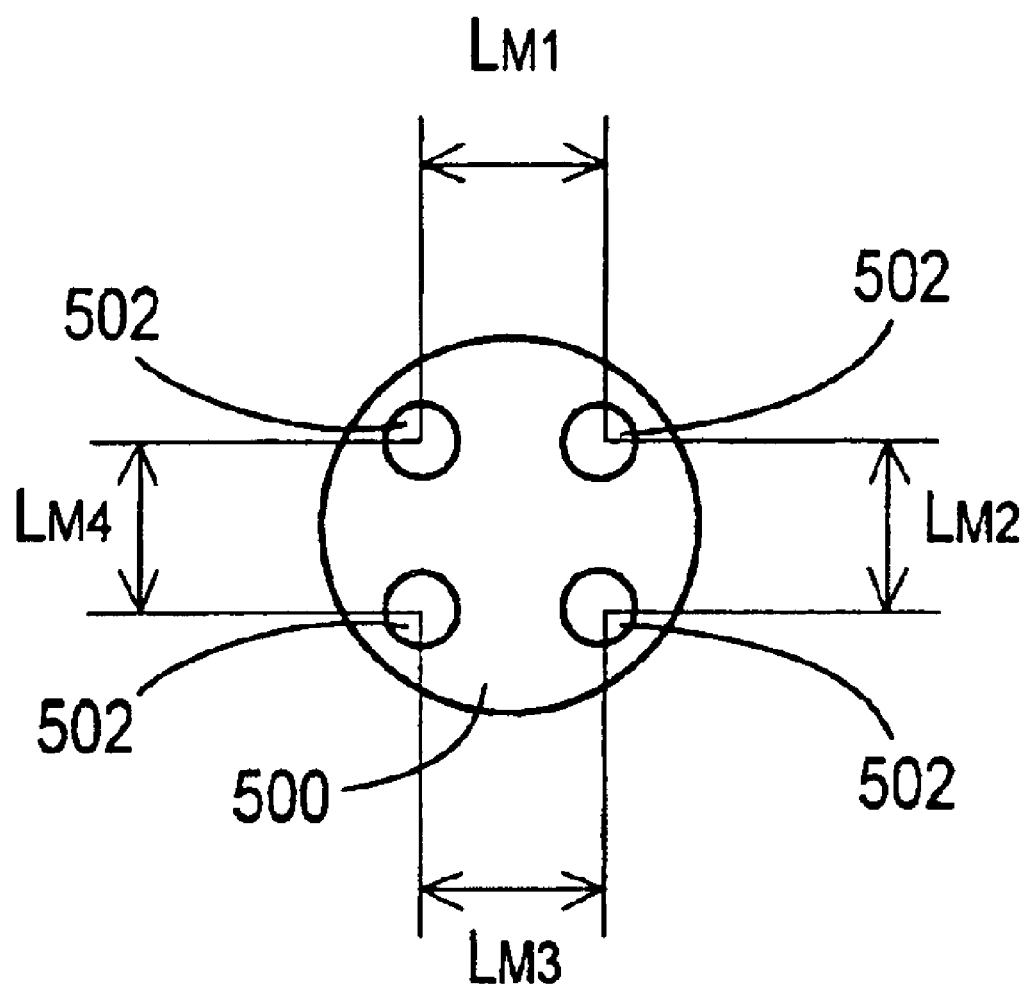
FIG. 17 is an example of a positioning pin provided with four holding-device fiducial marks.

In the first embodiment described above, the first positioning pin 364 is provided with the two holding-device fiducial marks 370. However, the first positioning pin may be provided with three or more holding-device fiducial marks. For instance, a first positioning pin 500 shown in FIG. 17 is provided with four holding-device fiducial marks 502. Images of all of the four fiducial marks 502 are simultaneously taken by the fiducial-mark camera 106, if possible. If not possible, the images of selected two of the four fiducial marks 502 are taken at one time, and the images of the other two fiducial marks 502 are then taken at another time, for example.

In the modified embodiment of FIG. 17, distances LM1–LM4 between distances between the centers of the adjacent fiducial marks 502 are obtained. Step S2 of FIG. 14 is modified to determine whether all of the distances LM1–LM4 are within a predetermined permissible range. Step S2 is further formulated to determine that the positions of the images of the fiducial marks 502 have not been correctly obtained by the fiducial-mark camera 106, if any one of the distances LM1–LM4 is not within the permissible range. If the distances LM1–LM4 are all within the permissible range, it is determined that the positions of the fiducial marks 502 have been correctly obtained on the basis of the images of the fiducial marks 502 taken by the fiducial-mark camera 106. In this case, a center position of the four fiducial marks 502 (which is represented by average values of the four sets of X-axis and Y-axis coordinate values at the center positions of the four fiducial marks 502) is determined as the position of the fiducial marks 502.

While the mounting heads 130 are turned about the vertical common axis by the head-turning device 132 in the first embodiment described above, the principle of the present invention is applicable to an electric-component mounting system which uses a mounting head that is arranged to be movable in the X-axis and Y-axis directions by an XY positioning device in an XY plane parallel to the plane of a printed-wiring board. An example of this type of electric-component mounting system will be described as a second embodiment of this invention, by reference to FIGS. 18–23. This mounting system is constructed as disclosed in Japanese Patent No. 2824378.

Figure 18:
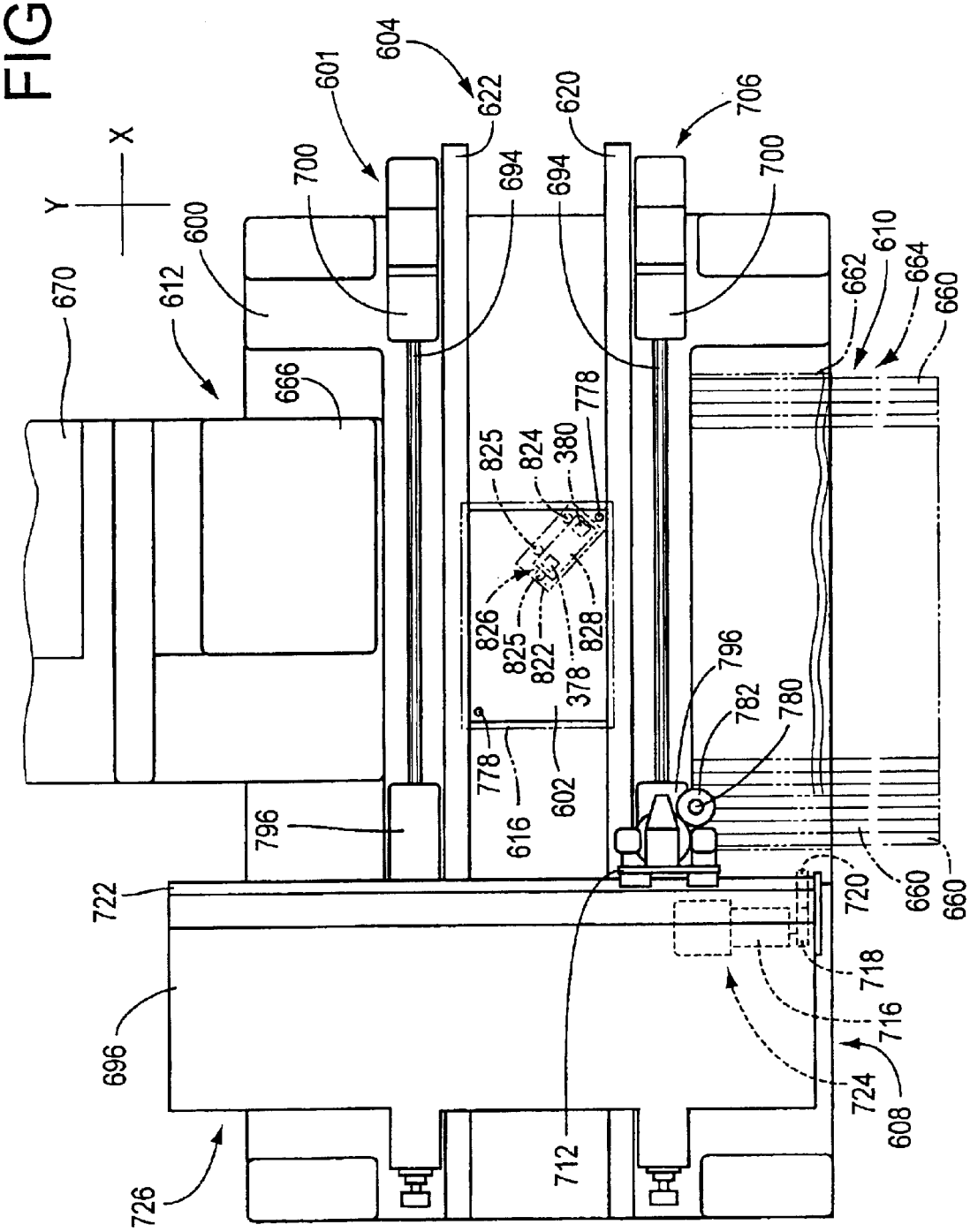
FIG. 18 is a plan view of en electronic-component mounting system according to another embodiment of the present invention.

Referring to FIG. 18, the electronic-component mounting system according to the second embodiment is shown generally at 601. The electronic-component mounting system 601 has a main body in the form of a machine base 600. The present mounting system 601 includes a printed-wiring board conveyor (PWB conveyor) 604, a component-mounting device 608 and component-supplying devices 610, 612, which are mounted on the machine base 600. The PWB conveyor 604 is arranged to transfer a circuit substrate in the form of a printed-wiring board 602 in an X-axis direction (in the left and right directions as seen in FIG. 18). The component-mounting device 608 is arranged to mount electric components in the form of electronic components 606 (shown in FIG. 20) on the printed-wiring board 602. The component-supplying devices 610, 612 are arranged to supply the component-mounting device 608 with the electronic components 606.

The present electronic-component mounting system 601 has a predetermined XY coordinate system in which movement data for positioning various movable members such as a mounting head 690 of the component-mounting device 608 are defined. The XY coordinate system is defined by the above-indicated X-axis and Y-axis directions cooperating with the XY plane parallel to the printed-wiring board 602.

In the present second embodiment, the printed-wiring board 602 is transferred by the PWB conveyor 604 such that the printed-wiring board 602 maintains a horizontal attitude or posture. The PWB conveyor 604 is stopped by a suitable stopper device (not shown), to locate the board 602 at a predetermined component-mounting position. The board 602 located at the component-mounting position is supported by a substrate holding device in the form of a printed-wiring-board holding device (PWB holding device) 616. In the present electronic-component mounting system 601, the printed-wiring board 602 is supported such that a component-mounting surface 618 (shown in FIG. 21) of the board 602 on which the electronic components 606 are mounted is parallel to the horizontal plane.

Figure 22:
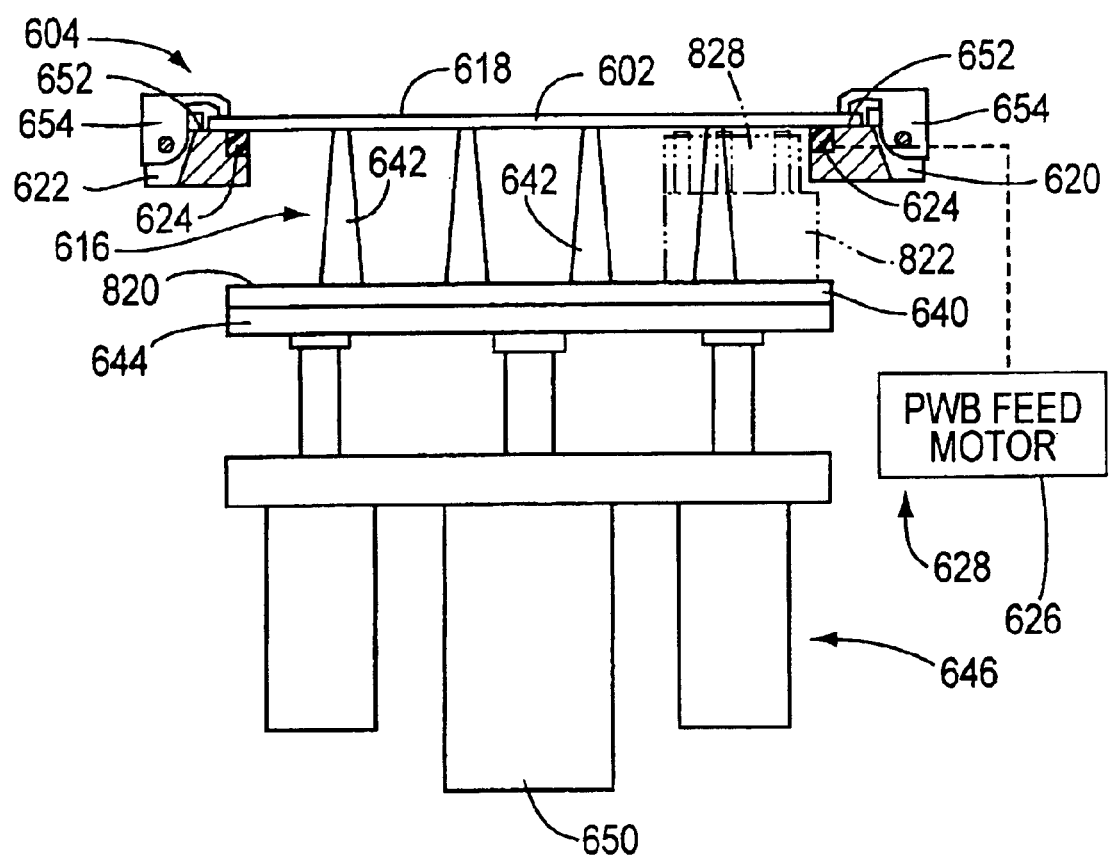
FIG. 22 is a side elevational view (partly in cross section) schematically showing a printed-wiring-board holding device of the electronic-component mounting system of FIG. 18.

The PWB conveyor 604 is provided with a pair of guide rails 620, 622, as schematically shown in FIGS. 18 and 22. Each of the guide rails 620, 622 is constructed to guide an endless conveyor belt 624 such that the belt 624 can travel in a hoop. The printed-wiring board 602 is placed on the conveyor belts 624, and is transferred by the conveyor belts 624 when the conveyor belts 624 are rotated in synchronization with each other by a drive source in the form of a belt drive device 628 which includes a printed-wiring-board feed motor (PWB feed motor) 626, as indicated in FIG. 22. The printed-wiring board 602 is transferred with its opposite widthwise ends held in sliding contact with respective positioning surfaces formed on the respective guide rails 620, 622.

As schematically shown in FIG. 22, the PWB holding device 616 includes a support plate 640 and a plurality of support members 642 fixed upright on the support plate 640. The support plate 640 is mounted on an elevator platform 644, which is lifted and lowered by an elevator drive device 646. The support members 642 support the printed-wiring board 602, in contact with the lower surface of the board 602. In the present embodiment, the elevator drive device 646 uses as a drive source a fluid-actuated actuator or a fluid-operated cylinder in the form of an air cylinder 650.

The guide rails 620, 622 are provided with support surfaces 652 facing upwards, and pivotally supported clamping members 654. When the elevator platform 644 is placed at its elevated operating position, the board 602 is clamped at its widthwise end portions, by and between the support surfaces 652 and the clamping members 654.

Figure 19:
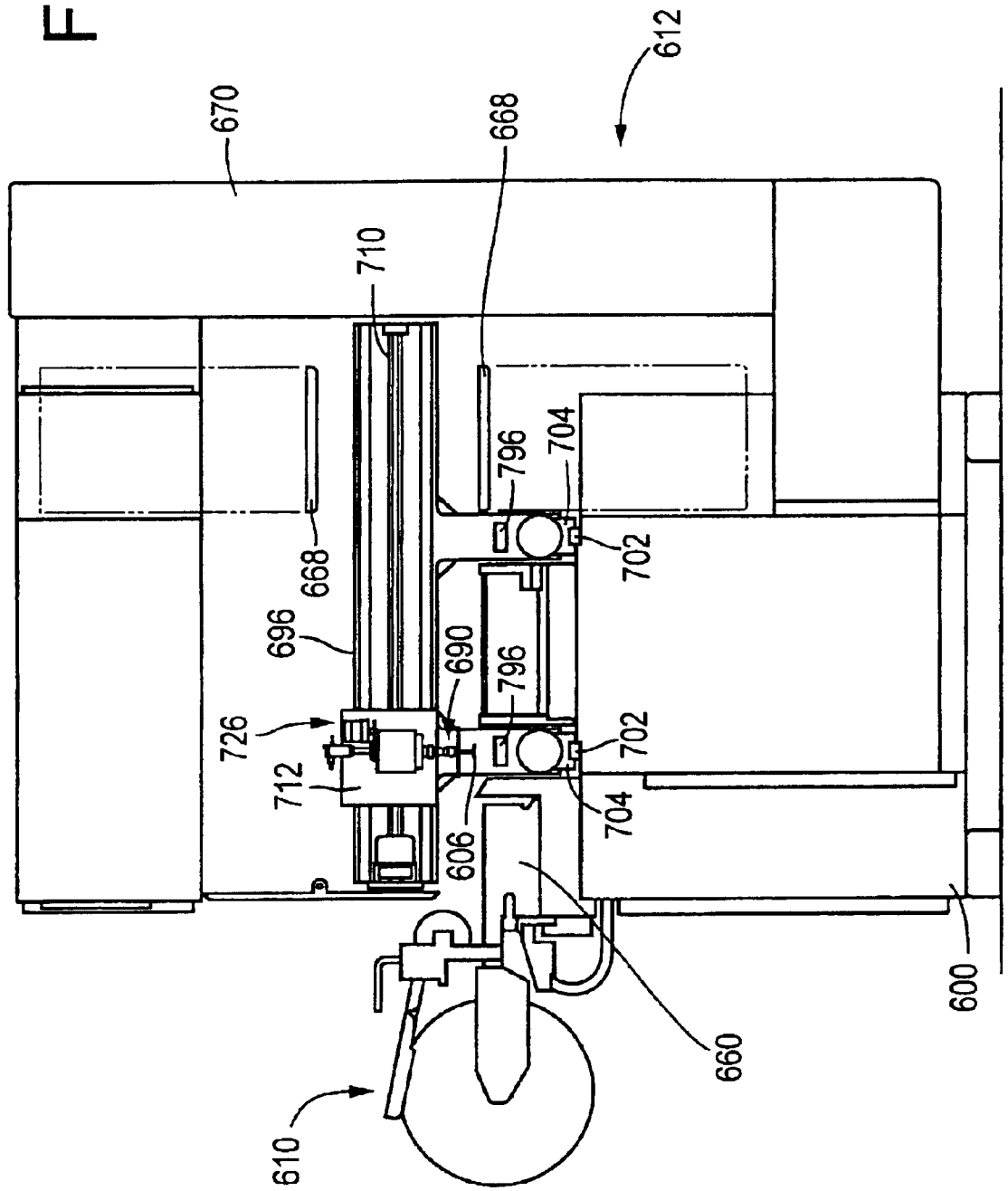
FIG. 19 is a side elevational view of the electronic-component mounting system of FIG. 18.

The component-supplying devices 610, 612 are spaced from each other in the Y-axis direction perpendicular to the X-axis direction, and located on the opposite sides of the PWB conveyor 604, as shown in FIGS. 18 and 19. In the present embodiment, the component-supplying device 610 is of tape feeder type, while the component-supplying device 612 is of tray type.

The component-supplying device 610 of tape feeder type has a component supply table 664, which includes a feeder carriage 662 and a multiplicity of tape feeders 660 that are mounted on the feeder carriage 662 such that the component-supply portions of the tape feeders 660 are arranged along a straight line parallel to the X-axis direction. Like the tape feeder 36 used in the first embodiment, each of the tape feeders 660 uses a carrier tape accommodating a succession of electronic components 606.

The component-supplying device 612 of tray type includes a multiplicity of component trays 666 as shown in FIG. 18. The component trays 666, which accommodate the electronic components 606, are accommodated in respective multiple tray boxes 668 (FIG. 19), which are vertically arranged and are supported by respective support members. The tray boxes 668 are elevated one after another by an elevator device disposed within a column 670, to a predetermined component-supply position. For the mounting head 690 to receive the electronic components 606 from the component tray 666 in the tray box 668 located at the component-supply position, some vertical space must be provided above the component-supply position. To provide this vertical space, the tray box 668 from which the electronic components 606 have been transferred to the mounting head 690 is moved further upwards from the component-supply position to a predetermined retracted position when the next tray box 668 is moved to the component-supply position, so that the required vertical space is provided between the component-supply position and the retracted position. The component-supplying device 612 of tray type is identical in construction with a component-supplying device disclosed in JP-B2-2-57719.

Figure 20:
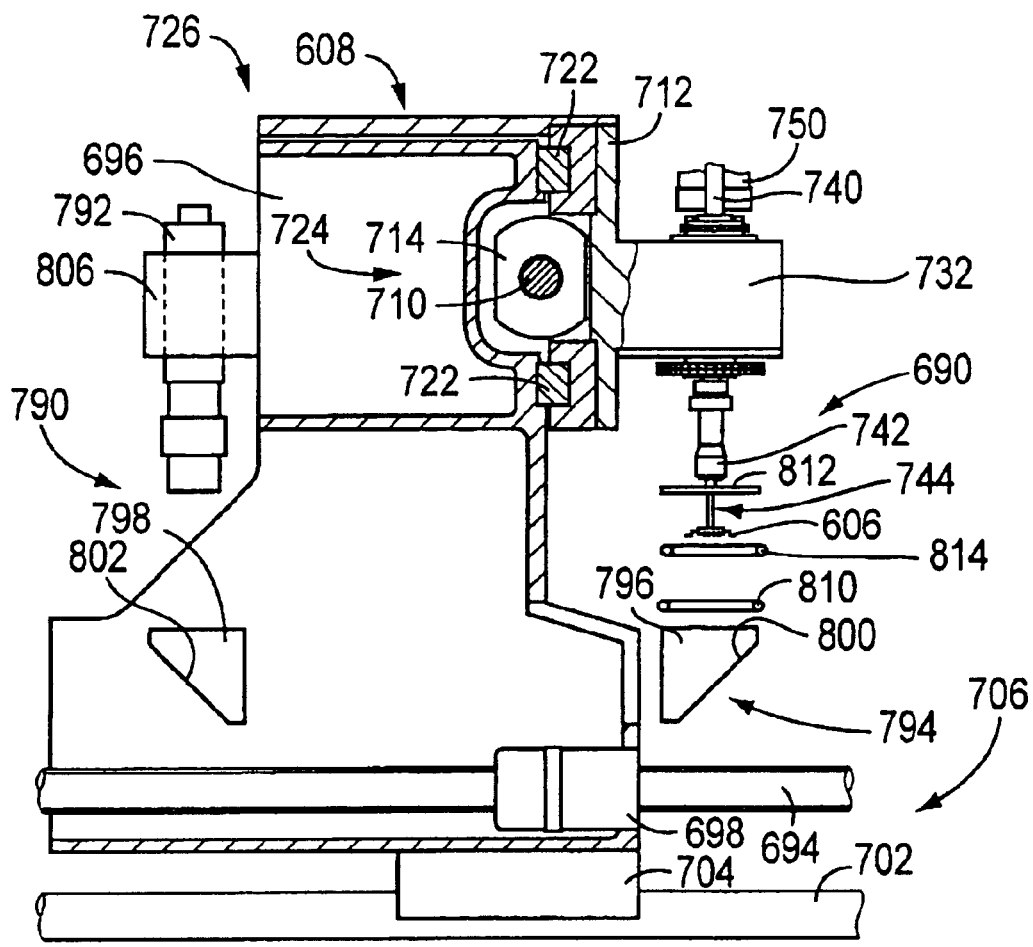
FIG. 20 is a front elevational view (partly in cross section) of the electronic-component mounting system of FIG. 18.

The mounting head 690 of the component-mounting device 608 is movable in the mutually perpendicular X-axis and Y-axis directions, so that the mounting head 690 can take a linear movement having X-axis and Y-axis components, to move each electronic component 606 to a desired position on or above the component-mounting surface 618 of the printed-wiring board 602. To move the mounting head 690 in the X-axis direction, the component-mounting device 608 includes two ballscrews 694 disposed on the machine base 600, on the opposite sides of the PWB conveyor 604, so as to extend in the X-axis direction, as shown in FIG. 18, and an X-axis slide 696 having two ballnuts 698 (only one of which is shown in FIG. 20) which engage the respective ballscrews 694. The component-mounting device 608 further includes two X-axis drive motors 700 for rotating the ballscrews 694, for moving the X-axis slide 696 in the X-axis direction.

As shown in FIG. 18, the X-axis slide 696 extends in the Y-axis direction across the PWB conveyor 604, and has a length corresponding to the distance between the component-supplying device 610 of feeder type and the component-supplying device 612 of tray type. On the machine base 600, there are disposed two guide rails 702 (shown in FIG. 20) located under the respective ballscrews 694. The X-axis slide 696 has two guide blocks 704 which slidably engage the guide rails 702, for guiding the X-axis slide 696 in the X-axis direction. It will be understood that the ballscrews 694, ballnuts 698 and X-axis drive motors 700 cooperate with each other to constitute an X-axis positioning device 706.

On the X-axis slide 696, there is disposed a ballscrew 710 so as to extend in the Y-axis direction, as shown in FIG. 20. The X-axis slide 696 carries a Y-axis slide 712 having a ballnut 714 which engages the ballscrew 710. The ballscrew 710 is rotated by a Y-axis drive motor 716 (shown in FIG. 18) through gears 718, 720, so that the Y-axis slide 712 is moved in the Y-axis direction while being guided by a pair of guide rails 722 (FIG. 20). It will be understood that the ballscrew 710, ballnut 714 and Y-axis drive motor 716 constitute a Y-axis positioning device 724, and that the Y-axis positioning device 724 cooperates with the X-axis slide 696, X-axis positioning device 706 and Y-axis slide 712, to constitute an XY robot 726 operable to move the mounting head 690 to a desired position in the XY plane.

Figure 21:
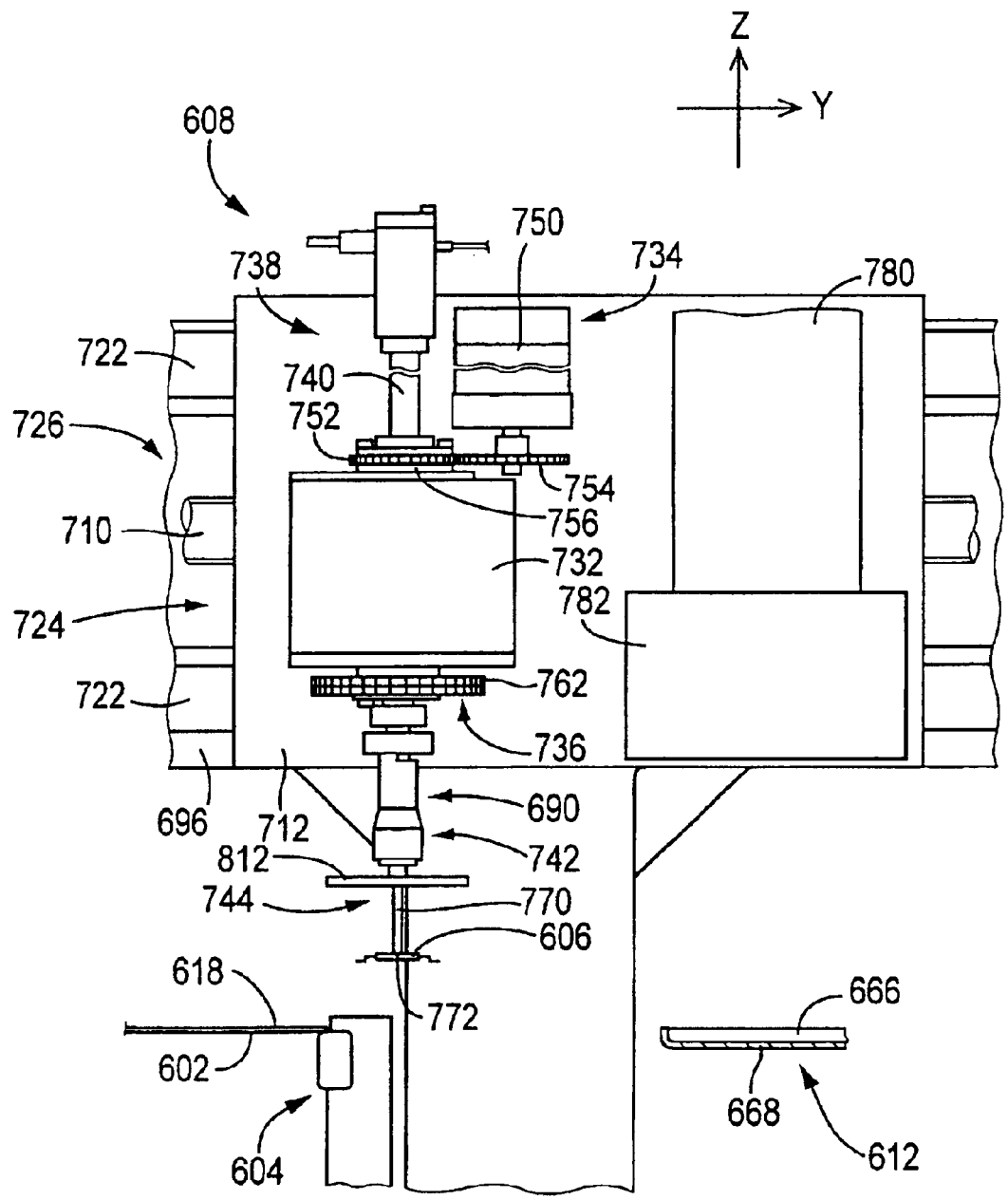
FIG. 21 is a side elevational view (partly in cross section) of a component-mounting device of the electronic-component mounting system of FIG. 18.

The Y-axis slide 712 has a support portion 732 on which there are mounted the above-indicated mounting head 690, a head elevating and lowering device 734 for moving up and down the mounting head 690 in a Z-axis direction, and a head-rotating device 736 about its axis, as shown in FIGS. 20 and 21. The mounting head 690, the head elevating and lowering device 734 and the head-rotating device 736 constitute a component-mounting unit 738. Although the component-mounting device 608 in the present electronic-component mounting system 601 includes only one component-mounting unit, the system may include a plurality of component-mounting units. For instance, two or more component-mounting units are disposed on the Y-axis slide 712 such that the units are arranged in a row in the Y-axis direction.

The component-mounting unit 738 in the present embodiment is identical with a component-mounting unit as disclosed in JP-B2-3093339. The component-mounting unit 738 will be described only briefly. The support portion 732 of the Y-axis slide 712 carries a rotary shall 740 which is movable in the Z-axis direction and rotatable about a vertical axis, as shown in FIG. 21. The rotary shaft 740 has a nozzle holder 742 at its lower end portion. The nozzle holder 742 is provided to removably hold a component holder in the form of a suction nozzle 744. In the present embodiment, the nozzle holder 742 and the rotary shaft 740 constitute the mounting head 690. The Z-axis direction is perpendicular to the X-axis and Y-axis directions which define the XY plane parallel to the horizontal component-mounting surface 618 of the printed-wiring board 602.

As shown in FIG. 21, the head elevating and lowering device 734 includes a vertical drive motor 750 as a drive source, a motion transmitting device including gears 752, 754, and a ballnut 756. A rotary motion of the vertical drive motor 750 is transmitted through the motion transmitting device to the ballnut 756, so that the rotary shaft 740 engaging the ballnut 756 is vertically moved to move the mounting head 690 in the Z-axis direction. The head-rotating device 736 includes a rotary drive motor 760 (shown in FIG. 23), and a motion transmitting device including a gear 762 and a splined member (not shown). A rotary motion of the rotary drive motor 760 is transmitted to the rotary shall 740 through the motion transmitting device, so that the rotary shaft 740 is rotated about its axis to rotate the mounting head 690.

The suction nozzle 744 is arranged to hold the electronic component 606 by suction under a negative pressure, so that the electronic component 606 is transferred from the suction nozzle 744 onto the printed-wiring board 602. The suction nozzle 744 is connected to a negative-pressure source, a positive-pressure source and the atmosphere, which are not shown. With a switching operation of a solenoid-operated directional control valve (not shown), a suction tube 770 of the suction nozzle 744 is selectively communicated with the negative- and positive-pressure sources and the atmosphere, to hold and release the electronic component 606 on and from a sucking surface 772 provided at its lower end.

The Y-axis slide 712 further carries a stationary fiducial-mark imaging device in the form of a fiducial-mark camera 780 (shown in FIGS. 18 and 21) operable to take images of board fiducial marks 778 provided on the printed-wiring board 602. In the present second embodiment, the fiducial-mark camera 780 is a CCD camera capable of taking two-dimensional images of the fiducial marks 778 in the downward direction. An illuminating device 782 is provided to illuminate the fiducial marks and its vicinity.

The X-axis slide 696 is provided with two image-taking devices 790, which are disposed at respective Y-axis positions at which the respective two ballscrews 694 are disposed. Namely, one of the two image-taking devices 790 is located between the component-supplying device 610 of feeder type and the PWB conveyor 604 (printed-wiring board 602 placed thereon), while the other image-taking device 790 is located between the component-supplying device 612 of tray type and the PWB conveyor 604. The two image-taking devices 790 are identical in construction with each other.

Each image-taking device 790 includes a component camera 792 for taking an image of the electronic component 606, and a light guiding device 794, as shown in FIG. 20. The light guiding device 794 includes a reflecting device in the form of reflecting minors 796, 798, which are attached through respective brackets to the underside of the X-axis slide 696. The reflecting minor 796 is disposed at a position within a path of movement of the mounting head 690 in the Y-axis direction, and has a reflecting surface 800 which is inclined about 45° with respect to a vertical plane including the centerline of the suction nozzle 744, such that one of the opposite ends of the reflecting surface 800 (as viewed in the X-axis direction) which is closer to the X-axis slide 696 is the lower end, that is, the left end of the reflecting surface 800 is the lower end.

The other reflecting mirror 798 is disposed on the side of the X-axis slide 696 which is remote from the reflecting mirror 796, and has a reflecting surface 802 which is inclined with respect to the vertical plane, symmetrically with the reflecting surface 800. The component camera 792 for taking the image of the electronic component 606 held by the suction nozzle 744 is located on the side of the X-axis slide 696 remote from the mounting head 690, such that the component camera 792 faces downwards toward the reflecting surface 802 of the reflecting mirror 798.

In the above arrangement of the image-taking device 790, the image of the electronic component 606 held by the suction nozzle 744 can be taken by the component camera 792 when the mounting head 690 is moved by the XY robot 726 to the Y-axis position of the corresponding ballscrew 694 at which the electric component 606 is located right above the reflecting mirror 796. Thus, the image-taking device 790 is arranged to image the electronic component 606 located at the predetermined image-taking position which lies within a path of movement of the electronic component 606 when the Y-axis slide 712 is moved in the Y-axis direction relative to the X-axis slide 696. In the present embodiment, the component camera 792 is a two-dimensional CCD camera, like the fiducial-mark camera 780 described above. The component camera 792 is capable of taking a two-dimensional image of the object in the upward direction, and the image data obtained by the component camera 792 are processed to obtain the image of the object as viewed in the downward direction. The reflecting mirror 798 may be eliminated. In this case, the component camera 792 is disposed so as to have a horizontal attitude and face toward the reflecting mirror 796.

A strobe light 810 as a UV irradiating device is disposed near the reflecting mirror 796, for irradiating a light-emitting plate 812 of the suction nozzle 744 with a ultraviolet radiation. The light-emitting plate 812 absorbs the ultraviolet radiation, and emits a visible light for illuminating the upper surface of the electronic component 606. The component camera 792 takes a silhouette image of the electronic component 606 in the upward direction, with the light-emitting plate 812 used as a background light. In the present embodiment, the light-emitting plate 812 and the strobe light 810 provided as the UV irradiating device cooperate to constitute an illuminating device for the image-taking device 790.

Another strobe light 814 for emitting a visible light is disposed nearer to the suction nozzle 744 than the above-indicated strobe light 810. This strobe light 814 serves as an illuminating device for illuminating the bottom surface of the electronic component 606 with a visible light, for taking a normal image of the electronic component 606 rather than a silhouette image, in the upward direction. The electronic component 606 is mounted at its bottom surface on the printed-wiring board 602. The image-taking device 790 and the illuminating device constitute an imaging system.

On an upper surface or support-pin mounting surface 820 of the support plate 640 of the PWB holding device 616, there is disposed a mounting block 822 similar to the mounting block 362 (in the first embodiment), as shown in FIG. 22. On this mounting block 822, there are fixedly mounted one first positioning pin 824 with holding-device fiducial marks (not shown) and two second positioning pins 825, as shown in FIG. 18. The first and second positioning pins 824, 825 provide a guiding-device positioning device 826 by which a light guiding device 828 is removably positioned on the mounting block 822. The first positioning pin 824, second positioning pins 825 and light guiding device 826 are identical with the first positioning pin 364, second positioning pins 365 and light guiding device 366, which are provided in the first embodiment. Briefly described, the guiding-device positioning device 826 is arranged to position the light guiding device 828 such that a straight line passing the centers of the two mirrors 378, 380 (FIG. 18) of the light guiding device 828 is parallel to a straight line passing an axis of rotation of the mounting head 690 and the center of imaging area of the fiducial-mark camera 780. The two mirrors 378, 380 are spaced apart from each other by a distance equal to a distance between the axis of rotation of the mounting head 690 and the center of imaging area of the fiducial-mark camera 780. The fiducial-mark camera 780 takes the images of the board fiducial marks 778 in the downward direction, and the image of the sucking surface 772 of the suction nozzle 744 in the upward direction. Image data indicative of the image of the sucking surface 772 taken in the upward direction are processed to obtain an image of the sucking surface 772 as taken in the downward direction.

Figure 23:
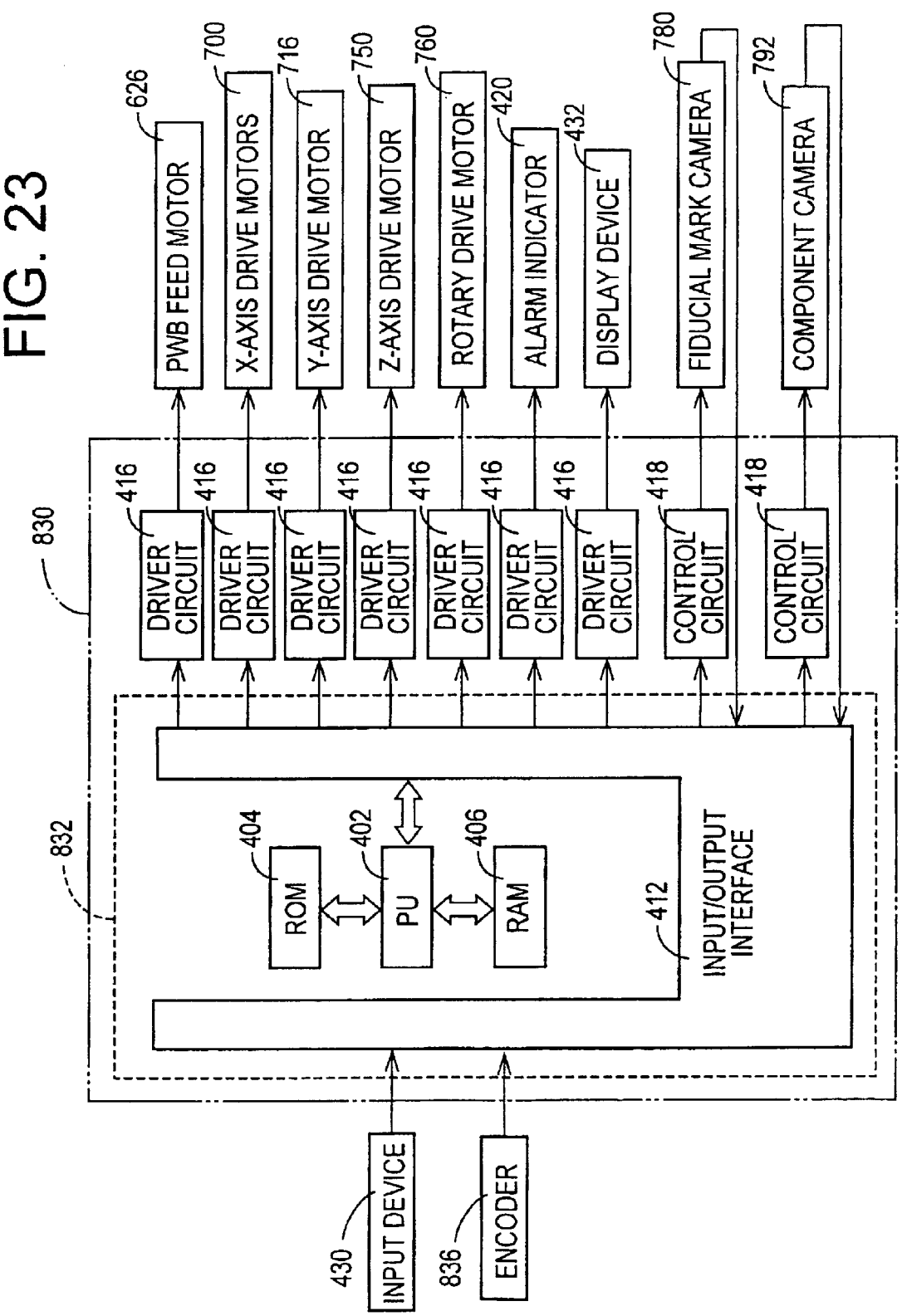
FIG. 23 is a block diagram showing a part of a control device for controlling the electronic-component mounting system of FIG. 18, which part largely relates to the present invention.

The present electronic-component mounting system 601 has a control device 830 as shown in FIG. 23. Like the control device 400 used in the first embodiment, the control device 830 is principally constituted by a computer 832. In FIG. 23, the same reference signs as used in FIG. 11 are used to identify the functionally corresponding elements. In the present second embodiment, too, the X-axis drive motors 700 and other drive motors are servomotors whose operating angles are detected by rotary encoders, the output signals of which are applied to the computer 832. Those rotary encoders include a rotary encoder 836 for the X-axis drive motor 700, which is shown in FIG. 23 by way of example. The RAM 406 stores various control programs such as programs for executing a main control routine, a non-production-run relative-positioning-error detecting routine, a production-run relative-positioning-error detecting routine, an electronic-component mounting routine, and various kinds of data necessary to execute the control programs.

An operation of the present electronic-component mounting system 601 will be described. The mounting system 601 operates to mount the electronic components 606 on the printed-wiring board 602, in a manner as disclosed in JP-B2-2824378. Since the understanding of the operation of mounting the electronic components 606 on the board 602 in general is not deemed necessary to understand the present invention, the following description primarily refers to those aspects which relate to the present invention.

When the electronic component 606 is mounted on the printed-wiring board 602, the mounting head 690 is moved to the component-supply position of the component-supplying device 610 of tape feeder type or component-supplying device 612 of tray type, by movements of the X-axis slide 696 and the Y-axis slide 712. Further, the mounting head 690 is vertically moved by the head elevating and lowering device 734, to permit the suction nozzle 744 to hold the electronic component 606 by suction under the negative pressure. The following description refers to a component mounting operation where the mounting head 690 receives the electronic component 606 from the component-supplying device 610 of tape feeder type.

The mounting head 690 with its suction nozzle 744 holding the electronic component 606 is moved from the component-receiving position to a predetermined component-mounting spot on the printed-wiring board 602 at which the electronic component 606 is mounted. At the component-receiving position, the mounting head 690 receives the electronic component 606 from an appropriate one of the tape feeders 660. During the movement of the mounting head 690 from the component-receiving position to the component-mounting spot, the mounting head 690 is necessarily moved over the reflecting mirror 796 which is fixed to a portion of the X-axis slide 696 which is located between the component-receiving position and the component-mounting spot. In other words, the mounting head 690 necessarily passes across the reflecting mirror 796 between the component-supplying device 610 and the board 602, in the Y-axis direction, while the mounting head 690 is moved from the component-supplying position to the component-mounting spot. Accordingly, an image of the electronic component 606 can be taken by the component camera 792. A position at which the component camera 792 takes the image of the electronic component 606 while the mounting head 690 is located right above the reflecting mirror 796 will be referred to as "a component-hold-position detecting position" or "an image-taking position".

Where the angular position of the electronic component 606 in which the electronic component 606 is mounted on the board 602 is different from the angular position in which the electronic component 606 is held by the suction nozzle 744, the mounting head 690 is rotated about its axis by the head-rotating-device 736, to rotate the electronic component 606 to its mounting angular position, while the mounting head 690 is moved from the component-receiving position to the component-hold-position detecting position.

When the mounting head 690 has reached the component-hold-position detecting position, the image of the electronic component 606 is taken by the image-taking device 790. Since the image-taking device 790 and the strobe lights 810, 814 are disposed on the X-axis slide 696, the image of the electronic component 606 is taken while the mounting head 690 is moved in the X-axis direction and while the movement of the mounting head 690 in the Y-axis direction is interrupted. The control device 830 compare actual image data indicative of the image of the electronic component 606 with reference image data indicative of a nominal image of the electronic component 606 which does not have any errors of positioning on the suction nozzle 744. As a result of comparison of the actual image data with the reference image data, the control device 830 calculates horizontal positioning errors $\Delta XE$ and $\Delta YE$ and an angular positioning error $\Delta\theta$ of the electronic component 606.

Horizontal positioning errors $\Delta XP$ and $\Delta YP$ of the printed-wiring board 602 are calculated on the basis of images of the fiducial-marks 778 provided on the board 602, which have been taken by the fiducial-mark camera 780. During the movement of the mounting head 690 to the component-mounting spot on the board 602, movement data representative of the distances of movements of the mounting head 690 to the component-mounting spot on the board 602 are adjusted for compensation for the horizontal positioning errors 66 XE and $\Delta YE$ of the electronic component 606, the horizontal positioning errors $\Delta XP$ and $\Delta YP$ of the board 602, and the center position errors of the electronic components 606 to be caused by the compensation for the angular positioning error $\Delta\theta$ of the electronic component 606. Further, the mounting head 690 is rotated by the head-rotating-device 736, for compensation for the angular positioning error $\Delta\theta$ of the electronic component 606. These compensations permit the electronic component 606 to be mounted exactly at the predetermined mounting spot, in the desired attitude. When the electronic component 606 is mounted on the board 602, the above-indicated positioning errors are calculated by the control device 830 while the mounting head 690 is moved to the component-mounting spot in the XY plane and lowered to its mounting position. This, one cycle of operation to mount one electronic component 606 on the printed-wiring board 602 is completed.

Like the electronic-component mounting system 12 of the first embodiment, the present electronic-component mounting system 601 is arranged such that the images of the holding-device fiducial marks 370 (not shown in FIG. 18) provided on the first positioning pin 824 are taken by the fiducial-mark camera 780, and the provisional zero point of the XY robot 726 is determined on the basis of the image of the fiducial mark 370. Then, the fiducial-mark camera 780 and the suction nozzle 744 are moved to be aligned with the light guiding device 794, to take the image of the sucking surface 772 of the suction nozzle 744, and a positioning error of the fiducial-mark camera 780 relative to the axis of rotation of the suction nozzle 744 is detected on the basis of the image of the sucking surface 772. Further, the actual zero point of the XY robot 726 is determined on the basis of the provisional zero point and the detected positioning error of the fiducial-mark camera 780 relative to the axis of rotation of the suction nozzle 744. Subsequently, the image of the sucking surface 772 of the suction nozzle 744 is taken by the component camera 792, and a positioning error of the center of imaging area of the component camera 792 relative to the axis of the suction nozzle 744 is detected on the basis of the image of the sucking surface 772.

The relative positioning errors indicated above are detected while the system 601 is not in a production run to mount the electronic components 606 on the board 606, or example, upon initiation of the production run or upon replacement of the suction nozzle 744, and in the production run. To detect the relative positioning errors, the light guiding device 828 is mounted on the mounting block 822 on the support plate 640 of the PWB holding device 616, such that the light guiding device 828 is positioned by the guiding-device positioning device 826 such that the holding-device fiducial marks 370 have substantially the same vertical position or height as the board fiducial marks 778 provided on the printed-wiring board 602 held by the PWB holding device 616 placed at its fully elevated position. Then, the fiducial-mark camera 780 is moved by the XY robot 726, 50 as to be positioned right above the first positioning pin 824 with the fiducial marks 370. The images of the fiducial mark 370 are taken by the fiducial-mark camera 780. Where the images of the fiducial marks 370 have been correctly obtained, the provisional zero point of the XY robot 726 is determined to be a position represented by the X-axis position of the X-axis slide 696 and the Y-axis position of the Y-axis slide 712 when the center of imaging area of the fiducial-mark camera 780 is aligned with the fiducial mark 370.

Then, the fiducial-mark camera 780 and the mounting head 690 are moved to be aligned with the light guiding device 828, and an image of the sucking surface 772 of the suction tube 770 of the suction nozzle 744 is taken in the upward direction by the fiducial-mark camera 780. At this time, the fiducial-mark camera 780 and the mounting head 690 are moved on the basis of the provisional zero position and predetermined movement data, to a position right below the nominal position of the axis of rotation of the mounting head 690. Images of the sucking surface 772 are taken while the mounting head 690 is placed in different angular positions, and the actual position of the axis of rotation of the mounting head 690 (suction nozzle 744) is obtained on the basis of the images of the sucking surface 772. Then, a positioning error of the center of imaging area of the fiducial-mark camera 780 relative to the axis of rotation of the mounting head 690 is obtained, and the actual zero point of the XY robot 726 is determined on the basis of the provisional zero point and the thus obtained positioning error of the fiducial-mark camera 780 relative to the axis of rotation of the mounting head 690.

On the basis of the thus determined actual zero point and according to the predetermined movement data, the mounting head 690 is moved to the component-hold-position detecting position, at which images of the sucking surface 772 of the suction nozzle 744 are taken by the component camera 792 while the mounting head 690 is placed in different angular positions. On the basis of the thus obtained images of the sucking surface 772 taken by the component camera 792, the position of the axis of rotation of the mounting head 690 (suction nozzle 744) is detected, and a positioning error of the center of imaging area of the component camera 792 relative to the axis of rotation of the mounting head 690 is obtained.

During the production run of the electronic-component mounting system 601 to mount the electronic components 606 on the printed-wiring board 602, the images of the board fiducial marks 778 are taken by the fiducial-mark camera 780, and a positioning error of the board 602 as held by the PWB holding device 616 is detected on the basis of the images of the board fiducial marks 778. At the same time, a positioning error of each component-mounting spot on the board 602 is detected. At this time, the fiducial-mark camera 780 is moved to image-taking positions, on the basis of the actual zero point of the XY robot 726 and according to predetermined movement data as adjusted so as to eliminate the positioning error of the fiducial-mark camera 780 relative to the axis of rotation of the mounting head 690. At these image-taking positions, the images of the board fiducial marks 778 are taken, to accurately detect the positioning error of each component-mounting position.

The horizontal positioning errors of the electronic component 606 are obtained relative to the axis of rotation of the mounting head 690 which has been obtained as described above. The center position errors to be caused by compensation to eliminate the angular position error $\Delta\theta$ of the electronic component 606 are obtained on the basis of the position of the axis of rotation of the mounting head 690, the angular positioning error $\Delta\theta$ of the electronic component 606 and the horizontal positioning error of the center of the electronic component 606. Thus, the electronic component 606 can be mounted at the corresponding component-mounting spot on the board 602, with a high degree of accuracy, without being influenced by the positioning error of the component-mounting spot and the horizontal positioning errors and the center position errors of the electronic component 606.

In the first and second embodiments described above, the first positioning pin 364, 824 also serves as a zero-point fiducial mark indicative of the zero point of the XY table 64 or XY robot 726, the zero-point mark may be provided independently of the first positioning pin 364, 824. An example of this modification is shown in FIG. 24, in which the same reference signs as used in the first and second embodiments are used to identify the functionally corresponding elements.

Figure 24:
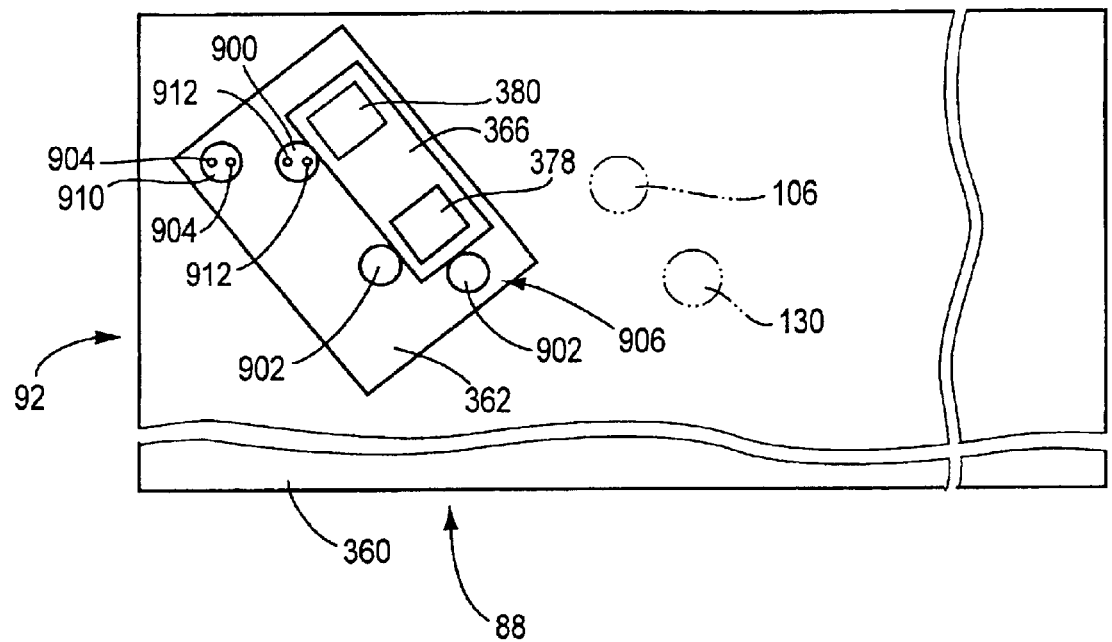
FIG. 24 is a plan view showing zero-point fiducial-marks and a guiding-device positioning device, together with a light guiding device, in an electronic-component mounting system according to a further embodiment of this invention.

In the modification of FIG. 24, one first positioning pin 900 and two second positioning pins 902 are fixed on the mounting block 362 mounted on the support plate 92 of the PWB supporting device 88. These first and second positioning pins 900, 902 are identical with the first and second positioning pins 364, 365 in the first embodiment, and cooperate to constitute a guiding-device positioning device 906 for positioning the light guiding device 366.

On the mounting block 362, there is also fixed a projection 910 having the same height as the first and second positioning pins 900, 902. On the upper end face of the projection 910, there are disposed two zero-point fiducial marks 904 which are located relatively adjacent to each other. Although the projection 910 is located comparatively close to the first positioning pin 900 having the holding-device fiducial marks 912, in the specific example of FIG. 24, the projection 910 need not be located close to the first positioning pin 900. Since the zero-point fiducial marks 904 and holding-device fiducial marks 912 disposed on the first positioning pin 900 are accurately positioned, it is possible to calculate a distance between a nominal position of the zero-point fiducial marks 904 and a nominal position of the holding-device fiducial marks 912. The nominal position of the zero-point fiducial marks 904 may be represented by a midpoint between the centers of those two fiducial marks 904. Similarly, the nominal position of the holding-device fiducial marks 912 may be represented by a midpoint of the centers of those two fiducial marks 912.

In the modification of FIG. 24, images of the zero-point fiducial marks 904 are taken by the fiducial-mark camera 106, and the position of the zero-point fiducial marks 904 is determined to be the midpoint between the centers of the two zero-point fiducial marks 904. A provisional zero point of the XY table 64 is represented by the X-axis position of the X-axis slide 74 and the Y-axis position of the Y-axis slide 82 when the position of the zero-point fiducial marks 904 is aligned with the center of imaging area of the fiducial-mark camera 106.

After the provisional zero point of the XY table 64 is determined, the PWB holding device 18 is moved to the image-taking position at which the images of the holding-device fiducial marks 912 provided on the first positioning pin 900 are taken by the fiducial-mark camera 106. The position of the fiducial marks 912 is obtained on the basis of the images of the fiducial marks 912, and a positioning error of the PWB holding device 18 relative to the center of imaging area of the fiducial-mark camera 106 is detected. The PWB holding device 18 is moved to the image-taking position by the XY table 64 on the basis of the provisional zero point and according to the predetermined movement data. Since there exists no relative positioning error between the zero-point fiducial marks 904 and the first positioning pin 900 which are accurately positioned, the detected positioning error of the PWB holding device 18 is an error of positioning of the PWB holding device 18 at the image-taking device by the XY table 64.

Further, the PWB holding device 18 is moved to position the light guiding device 366 under the fiducial-mark camera 106 and the mounting head 130. At this time, movement data for moving the PWB holding device 18 are adjusted so as to eliminate the positioning error of the PWB holding device 18. Accordingly, this positioning error is not included in the relative positioning error between the image of the reference suction nozzle 190 taken by the fiducial-mark camera 106 and the center of imaging area of the fiducial-mark camera 106. Accordingly, the relative positioning error between the fiducial-mark camera 106 and the reference nozzle axis can be obtained with high accuracy.

On the basis of the thus obtained relative positioning error, positioning errors of the zero point of the XY table 64 and the center of imaging area of the fiducial-mark camera 106 relative to the reference nozzle axis are calculated. When the images of the board fiducial marks 104 on the board 60 are taken or when the electronic components 38 are mounted on the board 60, the PWB holding device 18 is moved according to the predetermined movement data as adjusted so as to eliminate those relative positioning errors, so that the positioning error of each component-mounting spot on the board 60 is detected with high accuracy, and so that the electronic components 38 are mounted at the respective component-mounting spots with high accuracy.

All of the positioning pins of the guiding-device positioning device for positioning the light guiding device may be provided with holding-device fiducial marks, to detect a positioning error of the light guiding device by the guiding-device positioning device. In this case, the accuracy of detection of the relative positioning error between the fiducial-mark camera and the mounting head can be further improved.

The positioning errors of the axes of rotation of the ordinary suction nozzles relative to the reference nozzle axis may be obtained on the basis of the images of the sucking surface of the ordinary suction nozzles taken by the fiducial-mark camera. The relative positioning errors between the axes of the ordinary suction nozzles and the reference nozzle axis may be obtained on the basis of the relative position between the center of imaging area of the fiducial-mark camera and the axis of rotation of the reference nozzle axis, and the relative position between the center of imaging area of the fiducial-mark camera and the axis of rotation of each ordinary suction nozzle.

The light guiding device once mounted on the PWB holding device need not be removed after the detection of the various relative positioning errors using the light guiding device. For instance, the light guiding device may be kept mounted on the PWB holding device even while the electronic components are mounted on the printed-wiring board. In this case, the detection of the relative positioning errors may be initiated immediately after the initiation is required by the control device or after the predetermined condition is satisfied, even where the detection is effected in a production run of the electronic-component mounting system. Accordingly, the non-productive time due to removal and installation of the light guiding device is substantially eliminated. Namely, the component mounting operation can be initiated immediately after the completion of the detection of the relative positioning errors, so that the overall operation of the system can be fully automated.

The light guiding device may be located in a portion of the PWB holding device, which portion is outside a portion used to support the printed-wiring board.

Where the relative positioning errors are detected in a continuous production run of the system to mount the electronic components, the operation to mount the electronic components on one printed-wiring board may be interrupted to initiate the detection of the relative positioning errors, when the predetermined condition to initiate the detection is satisfied. In this case, the relative positioning errors are preferably detected while the printed-wiring board is kept supported by the PWB holding device, such that the light guiding device and the holding-device fiducial marks are located outside a portion of the PWB holding device which is used to support the board. In this instance, only the light guiding device may be either removed from or kept mounted on the PWB holding device after the detection of the relative positioning errors.

The light guiding device may be mounted on the PWB holding device such that the light guiding device is movable by a suitable moving device, between an operating position to detect the relative positioning errors, and a non-operated position at which the light guiding device is located while the detection is not effected.

The light guiding device may be removably fixed on the PWB holding device, by a fixing device which includes at least one electromagnet. For instance, the mounting block fixedly disposed on the support plate of the PWB supporting device is made of a magnetic material, and the casing of the light guiding device is provided with the at least one electromagnet. In this case, the light guiding device is mounted and positioned on the mounting device while the electromagnetic is placed in its de-energized state. After the light guiding device is positioned by the guiding-device positioning device, the electromagnetic is energized to fix the light guiding device on the mounting block, with a magnetic force generated by the electromagnet. When the light guiding device is removed from the mounting block, the electromagnet is de-energized. Alternatively, the casing of the light guiding device is made of a magnetic material, while the mounting block is provided with a permanent magnet or magnets or at least one electromagnet.

Although the electronic-component mounting system 12 of FIGS. 1–16 uses the two component cameras 350, 352, only one component camera may be used. The ratio of magnification of the component camera may variable in steps or continuously.

The electronic-component mounting system 601 of FIGS. 18–23 may include a plurality of mounting heads, or a single mounting head which is arranged to hold a plurality of component holders which are selectively used to hold the electronic component. In this case, the component holders include a reference component holder such as the reference suction nozzle 190 as in the first embodiment of FIGS. 1–16, so that the position of the axis of rotation of the reference component holder is used to detect the various relative positioning errors.

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An electric-component mounting system comprising:
   a component-supplying device operable to supply electric components;
   a substrate-holding device operable to hold a circuit substrate on which said electric components are to be mounted and which has at least one substrate fiducial mark, said substrate-holding device having at least one holding-device fiducial mark;
   a mounting head operable to receive the electric component from said component-supplying device and mount the electric component on said circuit substrate held by said substrate-holding device;
   a fiducial-mark imaging device operable to take an image of said at least one holding-device fiducial mark on said substrate-holding device, and an image of said at least one substrate fiducial mark on said circuit substrate as held by said substrate-holding device;
   a relative-movement device operable to relatively move said component-supplying device, said substrate-holding device, said mounting head and said fiducial-mark imaging device; and
   a control device including (a) a first relative-positioning-error obtaining portion operable to obtain a first relative positioning error between said fiducial-mark imaging device and said substrate-holding device, on the basis of a positioning error of said image of said at least one holding-device fiducial mark within an imaging area of said fiducial-mark imaging device, (b) a second relative-positioning-error obtaining portion operable to obtain a second relative positioning error between said fiducial-mark imaging device and said circuit substrate, on the basis of said image of said at least one substrate fiducial mark within the imaging area of said fiducial-mark imaging device, and (c) a movement control portion operable to control said relative-movement device for moving said mounting head and said substrate-holding device to a predetermined relative position as adjusted on the basis of at least first and second relative positioning errors.

2. An electric-component mounting system according to claim 1, wherein said control device includes a production-run relative-positioning-error detection control portion operable to control said relative-movement device, said fiducial-mark imaging device and said first relative-positioning-error obtaining portion, to obtain said first relative positioning error during an interruption of a continuous production run of the electric-component mounting system to mount the electric components on said circuit substrate.

3. An electric-component mounting system according to claim 1, wherein said substrate-holding device has a plurality of holding-device fiducial marks which are located adjacent to each other.

4. An electric-component mounting system according to claim 3, wherein said control device includes a correct-mark-position determining portion operable to obtain a relative position of said plurality of holding-device fiducial marks on the basis of images of said holding-device fiducial marks, and determine whether positions of said plurality of holding-device fiducial marks have been correctly detected by said fiducial-mark imaging device, depending upon whether the obtained relative position of said plurality of holding-device fiducial marks is held within a predetermined permissible range.

5. An electric-component mounting system according to claim 4, further comprising at least one of (i) alarm indicating means and (ii) stopping means operable when said correct-mark-position determining portion has determined that the positions of said plurality of holding-device fiducial marks have not been detected by said fiducial-mark imaging device, said alarm indicating means informing an operator of the system that the positions of said plurality of holding-device fiducial marks have not been correctly detected, and said stopping means stopping an operation of the electric-component mounting system.

6. An electric-component mounting system according to claim 3, wherein said first relative-positioning-error obtaining portion obtains said first relative positioning error on the basis of the positions of said plurality of holding-device fiducial marks.

7. An electric-component mounting system according to claim 1, wherein said relative-movement device includes:
   a head-turning device operable to turn said mounting head about an axis of turning, to a plurality of working positions including at least a component-receiving position at which the mounting head receives the electric component from said component-supplying device, and a component-mounting position at which the mounting head mounts the electric component onto said circuit substrate; and
   an XY table arranged to hold said substrate-holding device and movable in an XY plane defined by mutually perpendicular X and Y axes.

8. An electric-component mounting system according to claim 1, wherein said mounting head is arranged to hold a component holder for holding the electric component.

9. An electric-component mounting system according to claim 8, further comprising a light guiding device operable to guide an imaging light to be incident upon said fiducial-mark imaging device in an axial direction of said mounting head, when said light guiding device is located at a predetermined position relative to said mounting head and said fiducial-mark imaging device, said imaging light representing an image of one of said mounting head, said component holder and a reference member held by said mounting head.

10. An electric-component mounting system according to claim 8, wherein said relative-movement device includes (a) a head-turning device operable to turn said mounting head about an axis of turning, to a plurality of working positions including at least a component-receiving position at which the mounting head receives the electric component from said component-supplying device, and a component-mounting position at which the mounting head mounts the electric component onto said circuit substrate, and (b) an XY table arranged to hold said substrate-holding device and movable in an XY plane defined by mutually perpendicular X and Y axes, said electric-component mounting system further comprising a light guiding device operable to guide an imaging light to be incident upon said fiducial-mark imaging device in an axial direction of said mounting head, when said light guiding device is located at a predetermined position relative to said mounting head and said fiducial-mark imaging device, said imaging light representing an image of one of said mounting head, said component holder and a reference member held by said mounting head.

11. An electric-component mounting system according to claim 9, further comprising a guiding-device positioning device operable to position said light guiding device relative to said substrate-holding device, in a plane perpendicular to said axial direction of the mounting head.

12. An electric-component mounting system according to claim 9, wherein said control device further includes a third relative-positioning-error obtaining portion operable to obtain a third relative positioning error between said fiducial-mark imaging device and said mounting head or said component holder, on the basis of a positioning error of said one of said mounting head, said component holder and said reference member within an imaging area of said fiducial-mark imaging device.

13. An electric-component mounting system according to claim 12, further comprising a head-rotating device operable to rotate said mounting head about an axis of rotation thereof to a plurality of angular positions, and wherein said third relative-positioning-error obtaining portion operates said head-rotating device to rotate said mounting head to said plurality of angular positions, and operates said fiducial-mark imaging device to take images of said one of said mounting head, said component holder and said reference member when said mounting head is placed in said different angular positions, respectively, said third relative-positioning-error obtaining portion detecting a positioning error of the axis of rotation of said mounting head relative to said fiducial-mark imaging device, as the relative positioning error between said fiducial-mark imaging device and said mounting head.

14. An electric-component mounting system according to claim 12, wherein said control device includes a production-run third relative-positioning-error detection control portion operable to control said relative-movement device, said fiducial-mark imaging device and said third relative-positioning-error obtaining portion, to obtain said third relative positioning error during an interruption of a continuous production run of the electric-component mounting system to mount the electric components on said circuit substrate.

15. An electric-component mounting system comprising:
a component-supplying device operable to supply electric components;

a substrate-holding device operable to hold a circuit substrate on which said electric components are to be mounted and which has at least one substrate fiducial mark, said substrate-holding device having at least one holding-device fiducial mark;

a mounting head operable to receive the electric component from the component-supplying device and mount the electric component on said circuit substrate held by said substrate-holding device;

a fiducial-mark imaging device operable to take an image of said at least one holding-device fiducial mark on said substrate-holding device, and an image of said at least one substrate fiducial mark on said circuit substrate as held by said substrate-holding device;

a relative-movement device operable to relatively move said component-supplying device, said substrate-holding device, said mounting head and said fiducial-mark imaging device;

a light guiding device operable to guide an imaging light to be incident upon said fiducial-mark imaging device in an axial direction of said mounting head, when said light guiding device is located at a predetermined position relative to said mounting head and said fiducial-mark imaging device, said imaging light representing an image of one of said mounting head, said component holder and a reference member held by said mounting head; and a control device operable to control at least said fiducial-mark imaging device and said relative-movement device, and including (a) a relative-positioning-error obtaining portion operable to obtain a relative positioning error between said fiducial-mark imaging device and said mounting head or said component holder, on the basis of the image of said one of said mounting head, said component holder and said reference member which is taken on the basis of said imaging light, (b) a relative-positioning-error compensating portion operable to adjust a predetermined relative position between said mounting head and said substrate-holding device to be established by said relative-movement device upon mounting of the electric component on said circuit substrate, such that said predetermined relative position is adjusted so as to eliminate at least said relative positioning error obtained by said relative-positioning-error obtaining portion.

16. An electric-component mounting system according to claim 15, wherein said control device further includes a production-run relative-positioning-error detection control portion operable to control said relative-movement device, said fiducial-mark imaging device and said relative-positioning-error obtaining portion, to obtain said relative positioning error during an interruption of a continuous production run of the electric-component mounting system to mount the electric components on said circuit substrate.

* * * * *